(12) United States Patent
Fukuoka et al.

(10) Patent No.: US 8,363,365 B2
(45) Date of Patent: Jan. 29, 2013

(54) SEMICONDUCTOR DEVICE

(75) Inventors: Osamu Fukuoka, Aichi (JP); Hideaki Shishido, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 348 days.

(21) Appl. No.: 12/478,123

(22) Filed: Jun. 4, 2009

(65) Prior Publication Data

US 2009/0310265 A1    Dec. 17, 2009

(30) Foreign Application Priority Data

Jun. 17, 2008  (JP) ................................ 2008-158256

(51) Int. Cl.
*H02H 9/00*    (2006.01)

(52) U.S. Cl. ....................................................... 361/54

(58) Field of Classification Search ................... 361/54, 361/56; 257/290, 459, 66, 55; 348/207; 136/256

See application file for complete search history.

(56) References Cited

U.S. PATENT DOCUMENTS

| | | | |
|---|---|---|---|
| 5,157,573 A | 10/1992 | Lee et al. | |
| 5,218,222 A | 6/1993 | Roberts | |
| 5,689,133 A | 11/1997 | Li et al. | |
| 6,320,241 B1 | 11/2001 | Okamoto | |
| 7,064,023 B2 | 6/2006 | Koyama et al. | |
| 2007/0252213 A1 | 11/2007 | Hirose | |
| 2008/0151602 A1 | 6/2008 | Kato | |
| 2008/0237665 A1* | 10/2008 | Shishido | 257/290 |
| 2008/0265978 A1* | 10/2008 | Englekirk | 327/427 |
| 2009/0027372 A1* | 1/2009 | Shishido et al. | 345/207 |
| 2009/0231021 A1* | 9/2009 | Koyama et al. | 327/535 |
| 2010/0006848 A1* | 1/2010 | Fukuoka et al. | 257/66 |

FOREIGN PATENT DOCUMENTS

JP    2000-058762    2/2000

* cited by examiner

*Primary Examiner* — Stephen W Jackson
*Assistant Examiner* — Angela Brooks
(74) *Attorney, Agent, or Firm* — Nixon Peabody LLP; Jeffrey L. Costellia

(57) ABSTRACT

The resistance of an integrated circuit against ESD (electrostatic discharge) is improved without disturbing improvement of the performance and reduction of size of the integrated circuit. A protection circuit is interposed between an input and output terminals. When ESD is generated, the input and output terminals are short-circuited by the protection circuit, so that overvoltage application to the circuit is prevented. The circuit is electrically connected to the input and output terminals by a connection wiring. The circuit has a plurality of electrical connection portions between the circuit and the connection wiring, and the connection wiring is formed such that the wiring resistance between the input or output terminal and each of the connection portions is the same. Accordingly, if ESD is generated, voltage application on only one of the connection portions is prevented, whereby the possibility that the circuit will be broken by ESD is decreased.

21 Claims, 35 Drawing Sheets

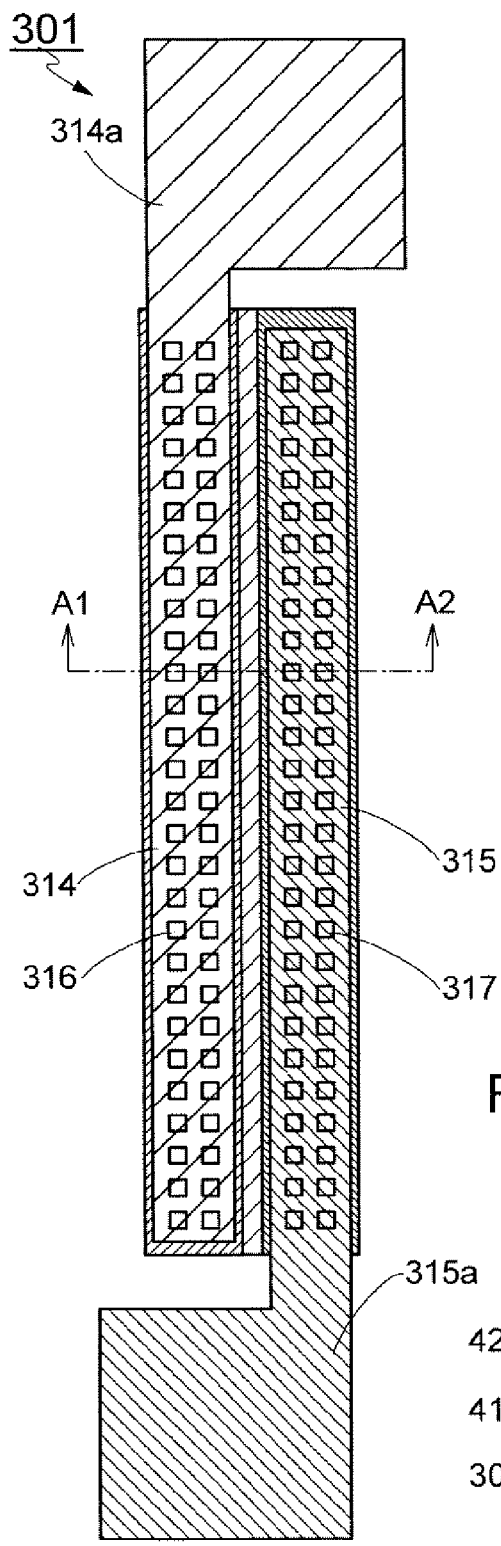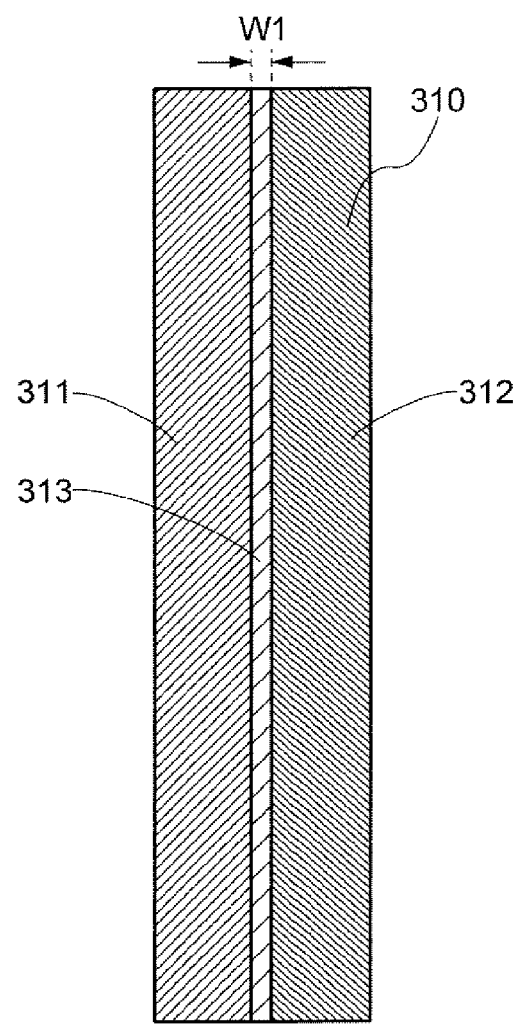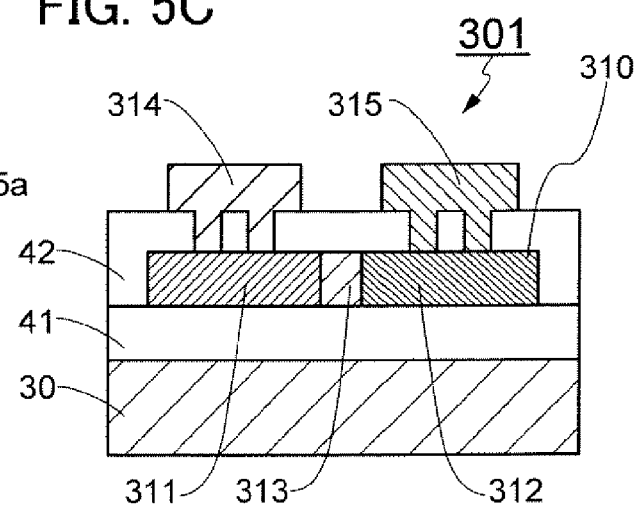

FIG. 6A
FIG. 6B
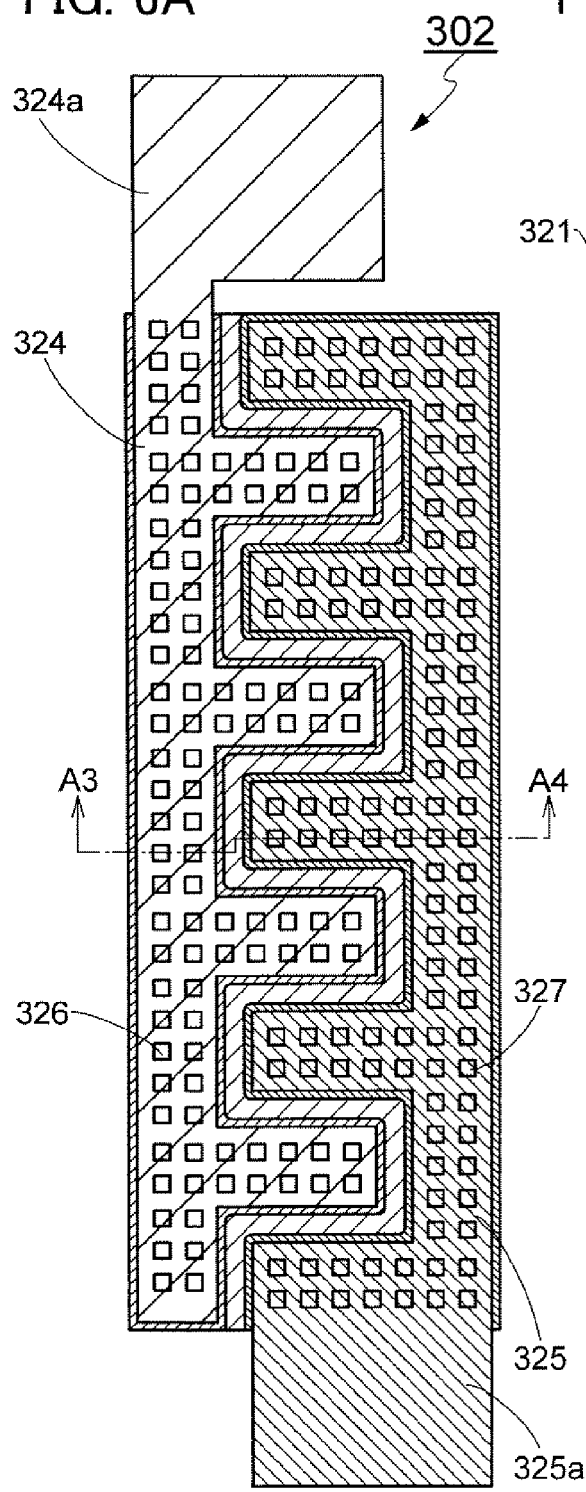
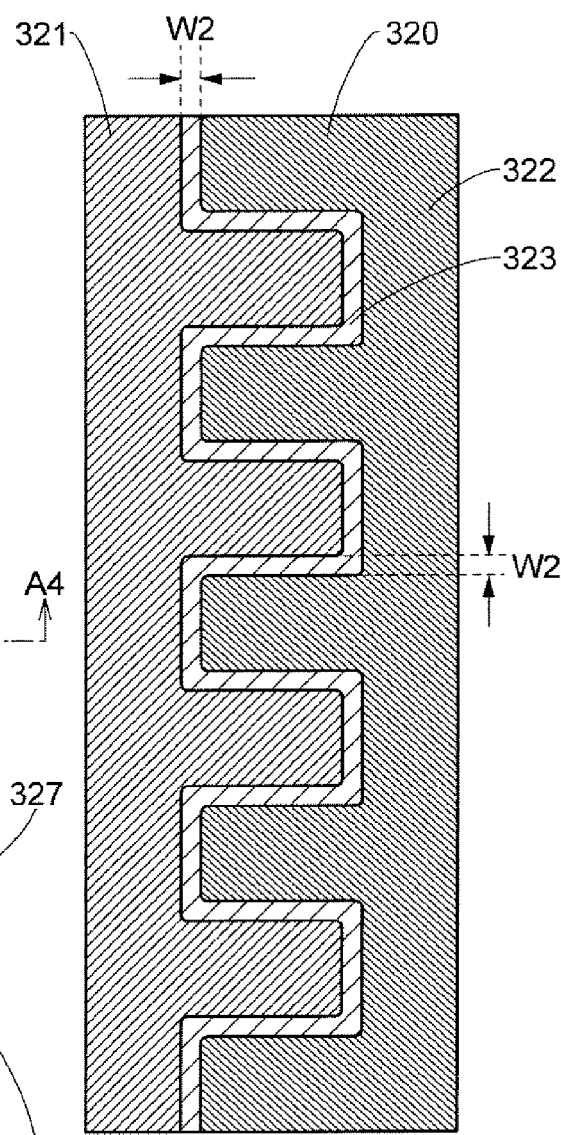

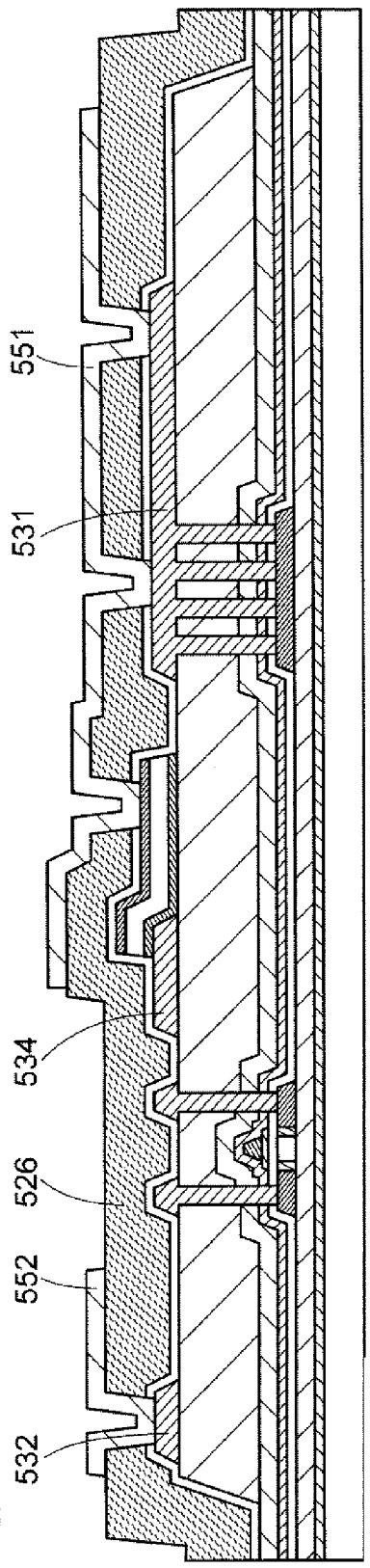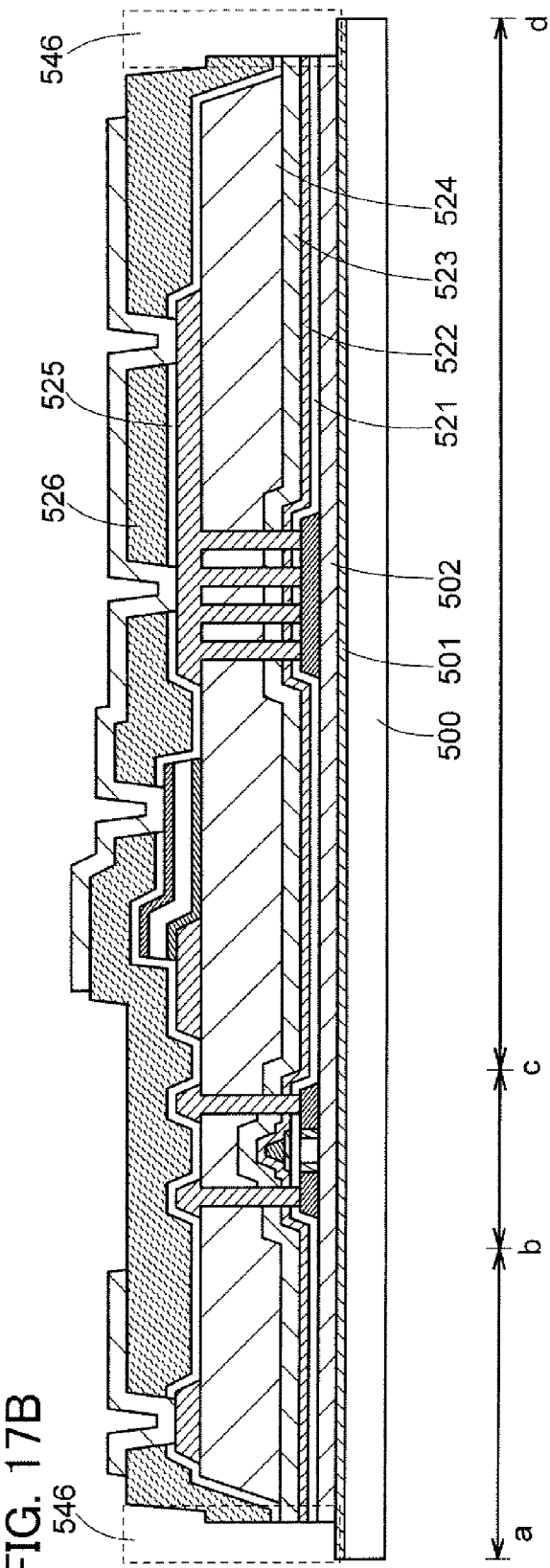
FIG. 17A
FIG. 17B

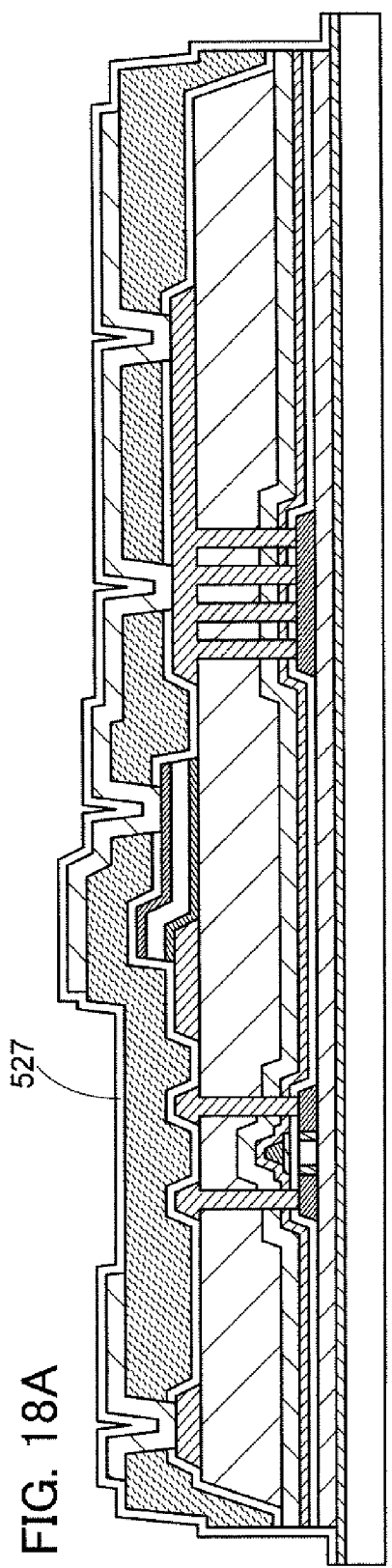
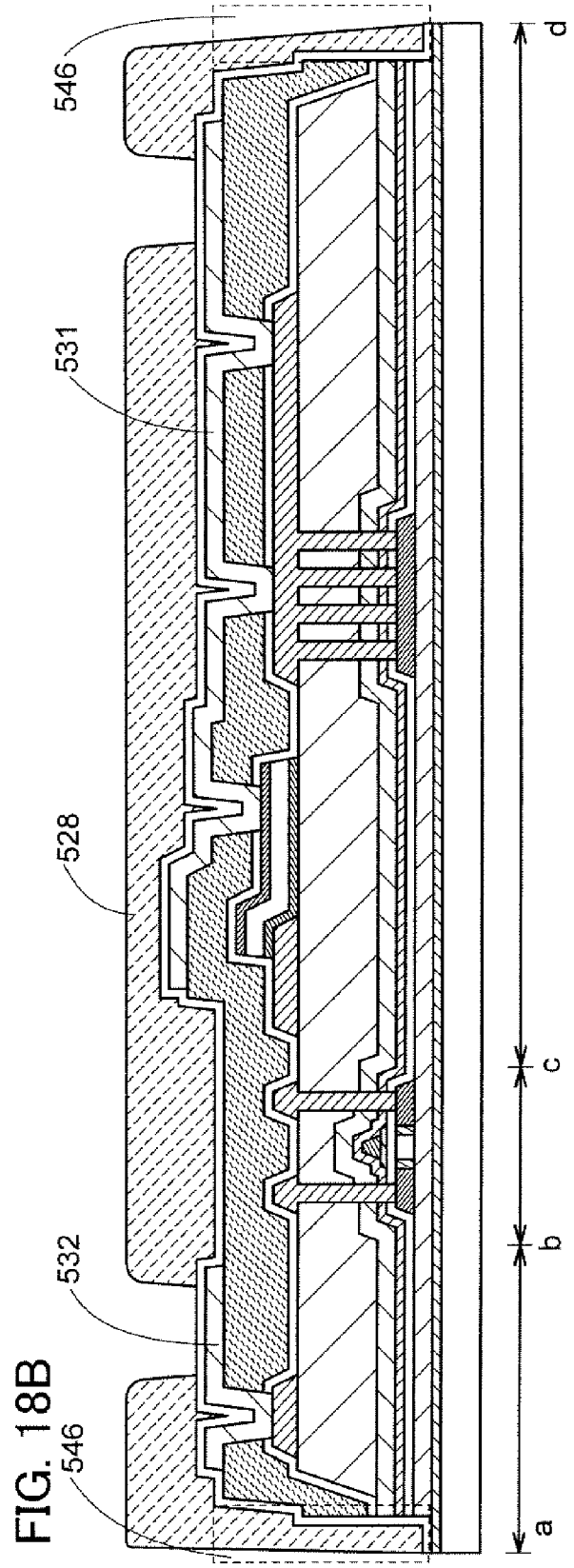
FIG. 18A
FIG. 18B

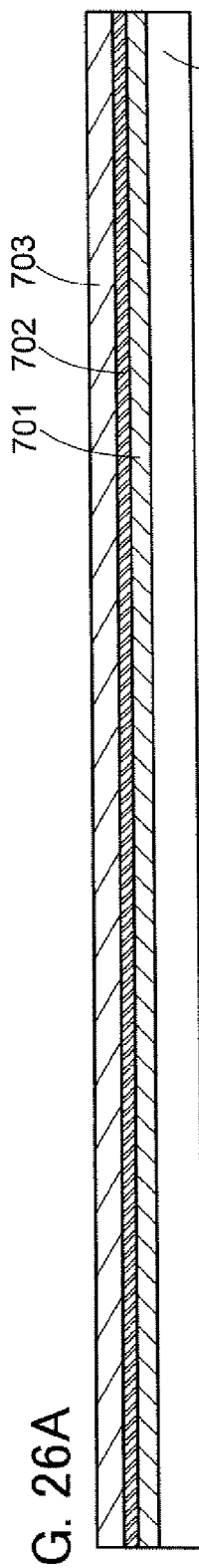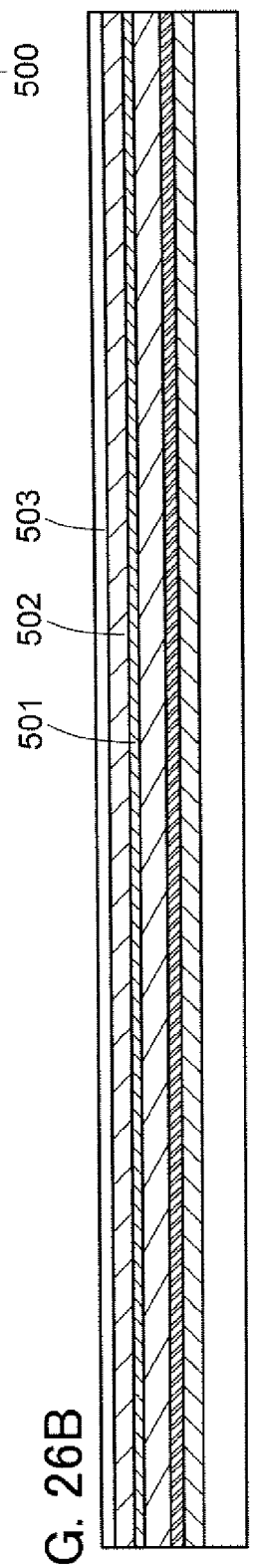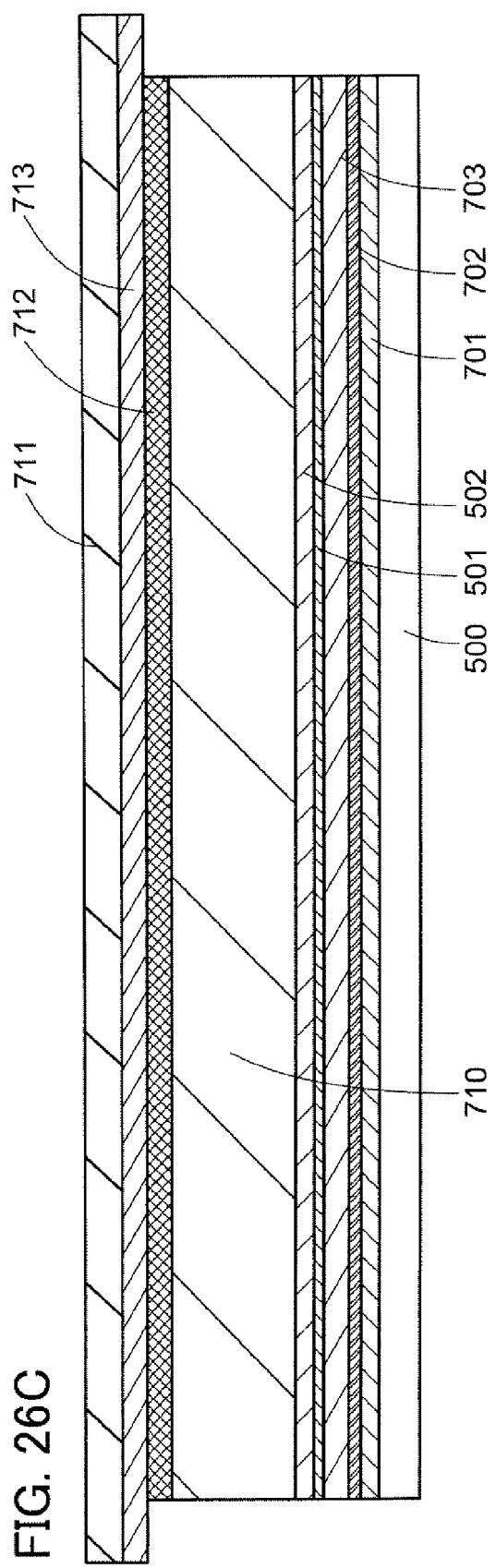

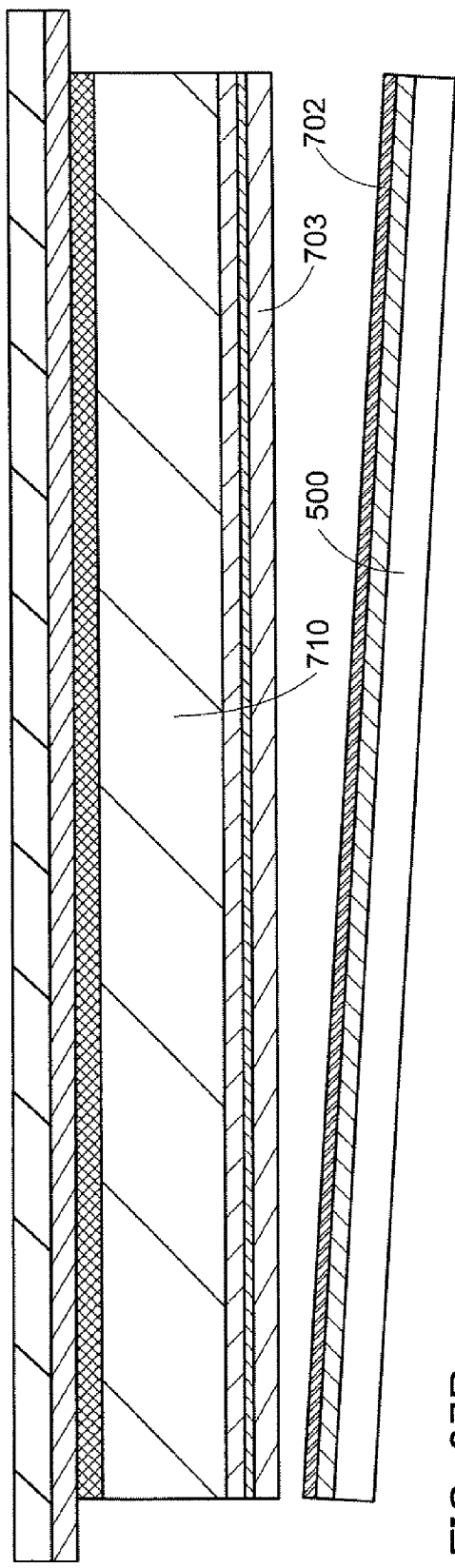
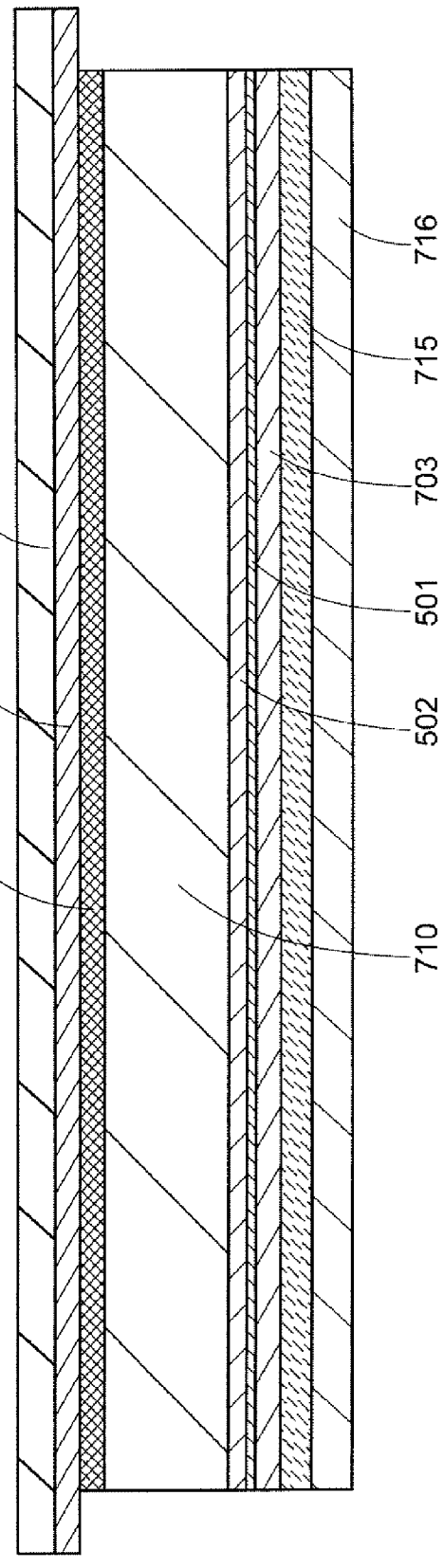
FIG. 27A
FIG. 27B

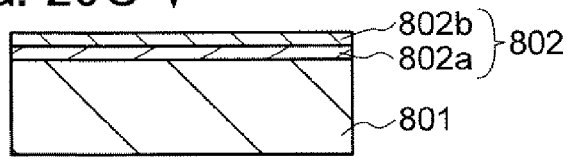
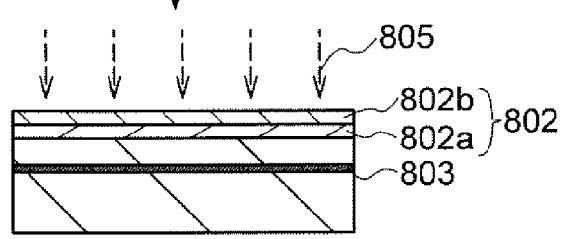
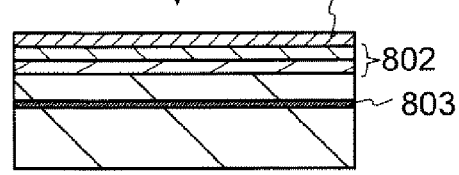
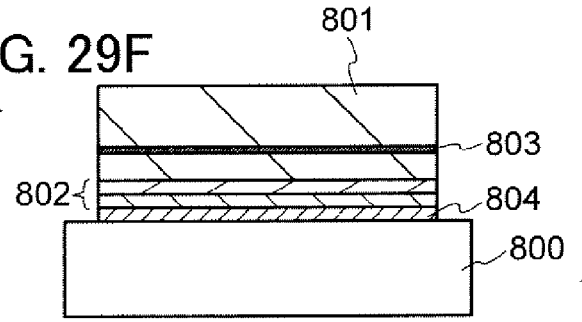
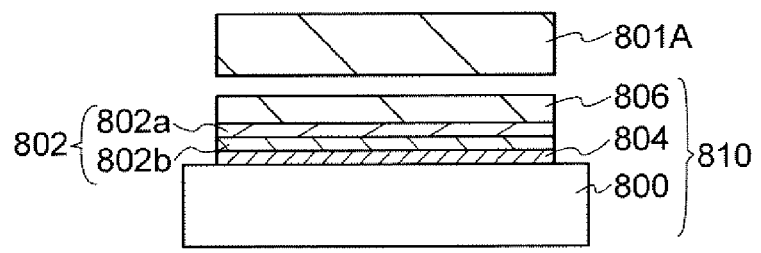

device 900A device 900x

SEMICONDUCTOR DEVICE

BACKGROUND OF THE INVENTION

1. Field of the Invention

The present invention relates to a semiconductor device equipped with means for preventing breakdown of a circuit against unexpected high-voltage application such as electrostatic discharge.

2. Description of the Related Art

One main cause of the fault of integrated circuits is breakdown of a semiconductor element, an electrode, or the like due to electrostatic discharge (hereinafter referred to as "ESD"). In view of this, a protection circuit is disposed between a terminal and an integrated circuit, for prevention of the breakdown of integrated circuits due to ESD. The protection circuit is a circuit for preventing an overvoltage applied to the terminal by ESD or the like from being supplied to the integrated circuit. As typical examples of an element used in the protection circuit, there are a resistor, a diode, and a capacitor.

For example, according to Patent Document 1, a surge current generated by ESD is smoothed by a resistor that is interposed in a wiring which electrically connects a connection terminal and a semiconductor circuit. Further, in Patent Document 1, a diode is used in addition to the resistor, in a protection circuit. When ESD occurs, a discharge path of a surge current is formed by the rectification action of the diode to prevent the surge current from flowing into the integrated circuit.

[Patent Document 1]

Japanese Published Patent Application No. 2000-58762 (FIG. 2)

SUMMARY OF THE INVENTION

In accordance with improvement of the performance of integrated circuits, transistors have been made smaller and smaller, so that the resistance to ESD has been decreased. Further, high-speed operation and low power consumption are needed for the integrated circuits. The voltage of ESD is about several kilovolts to several tens of kilovolts. To use a resistor having resistance high enough to completely avoid the effect of such a high voltage in a protection circuit is not practical because the operation of the integrated circuit is disturbed. Further, the static electricity has either polarity of positive or negative; therefore, it is preferable that the protection circuit is a circuit which can protect the integrated circuit from the electrostatic discharge of both of the polarities. Moreover, from the point of view of the reduction in size of the integrated circuits, the area occupied by the protection circuit is needed to be small.

As described above, there are various restrictions on the protection circuit, and it is very difficult to achieve high performance of both of the integrated circuit and the protection circuit. One mode of the present invention is a semiconductor device invented in view of the foregoing, and one object of the mode of the present invention is to improve the resistance to ESD of integrated circuits without disturbing improvement of the performance and reduction of the size of the integrated circuits.

According to one mode of the present invention, a semiconductor device includes a circuit including a plurality of semiconductor elements, one terminal, a plurality of connection portions at which first stages of the circuit are electrically connected to the terminal, and a connection wiring which electrically connects the terminal to the plurality of connection portions and is provided so that the resistance between the terminal and each of the plurality of connection portions is the same.

That is, according to the above-described mode, the wiring resistance is the same in a plurality of current paths between the terminal and the circuit. With this structure, a surge current flowing into the semiconductor device through the terminal due to ESD or the like can be prevented from concentrating in one current path. That is, the resistance of the circuit against ESD can be improved. Note that in this specification, the "resistances of a plurality of wirings (or current paths) are the same as or equal to each other" means not only the case where they are identical to each other but also the case where they are different from each other to some extent. The reason why the difference of the resistances is tolerated to some extent is because the wiring resistance may be deviated from a designed value in the manufacturing process of a semiconductor device even if the semiconductor device is designed such that a plurality of wiring resistances becomes equal to each other. Variations in thickness of the film to be formed, thickness of the film to be etched, size of a contact hole, and the like cause the deviation; it is difficult to avoid generation of these variations completely. Therefore, in this specification, the tolerance range of a plurality of resistances is ±20% of the medium value of those resistances in view of the deviation from the designed value of the resistance, which is generated in the manufacturing process. That is, in this specification, a plurality of resistances being in the range of ±20% of the medium value of them is regarded as being equal to each other.

The semiconductor device of the above-described mode may include a protection circuit which is electrically connected to the terminal to protect the circuit such that an overvoltage is not applied. As this protection circuit, a protection circuit including a diode can be used. As this diode, a diode which is provided over an insulating film and includes a semiconductor film in which an n-type impurity region and a p-type impurity region which are adjacent to each other in a parallel direction over the insulating film are formed can be used.

The above-described mode can be applied to a semiconductor device with a size of 10 mm×10 mm or less in a planar arrangement. The size of 10 mm×10 mm or less in a planar arrangement means that the semiconductor device can be contained in an area of $(10 \text{ mm})^2$.

In the semiconductor device according to one mode of the present invention, the resistance to ESD of integrated circuits can be improved without disturbing improvement of the performance and reduction of the size of the integrated circuits.

BRIEF DESCRIPTION OF THE DRAWINGS

FIG. 5A is a plan view of a PIN diode which is applied in a protection circuit; FIG. 5B is a plan view of a semiconductor film which is included in the diode; and FIG. 5C is a cross-sectional diagram of the diode along section-line A1-A2 in FIG. 5A. (Embodiment 2)

FIG. 6A is a plan view of a PIN diode which is applied in a protection circuit; and FIG. 6B is a plan view of a semiconductor film which is included in the diode. (Embodiment 2)

FIGS. 17A and 17B are cross-sectional diagrams which follow the step of FIG. 16C, illustrating the one mode of the method for manufacturing the photo detector. (Embodiment 4)

FIGS. 18A and 18B are cross-sectional diagrams which follow the step of FIG. 17B, illustrating the one mode of the method for manufacturing the photo detector. (Embodiment 4)

FIGS. 26A to 26C are cross-sectional diagrams illustrating one mode of the method for manufacturing a photo detector. (Embodiment 5)

FIGS. 27A and 27B are cross-sectional diagrams which follow the step of FIG. 26C, illustrating the one mode of the method for manufacturing the photo detector. (Embodiment 5)

FIGS. 29A to 29G are cross-sectional diagrams illustrating one mode of the method for manufacturing an SOI substrate. (Embodiment 6)

FIG. 3D is a perspective view illustrating an external appearance of a display device including a photo detector.

FIG. 32A relates to a photo detector according to one mode of the present invention; and FIG. 32B relates to a photo detector according to a comparison example. (Example 1)

DETAILED DESCRIPTION OF THE INVENTION

Figure 1:
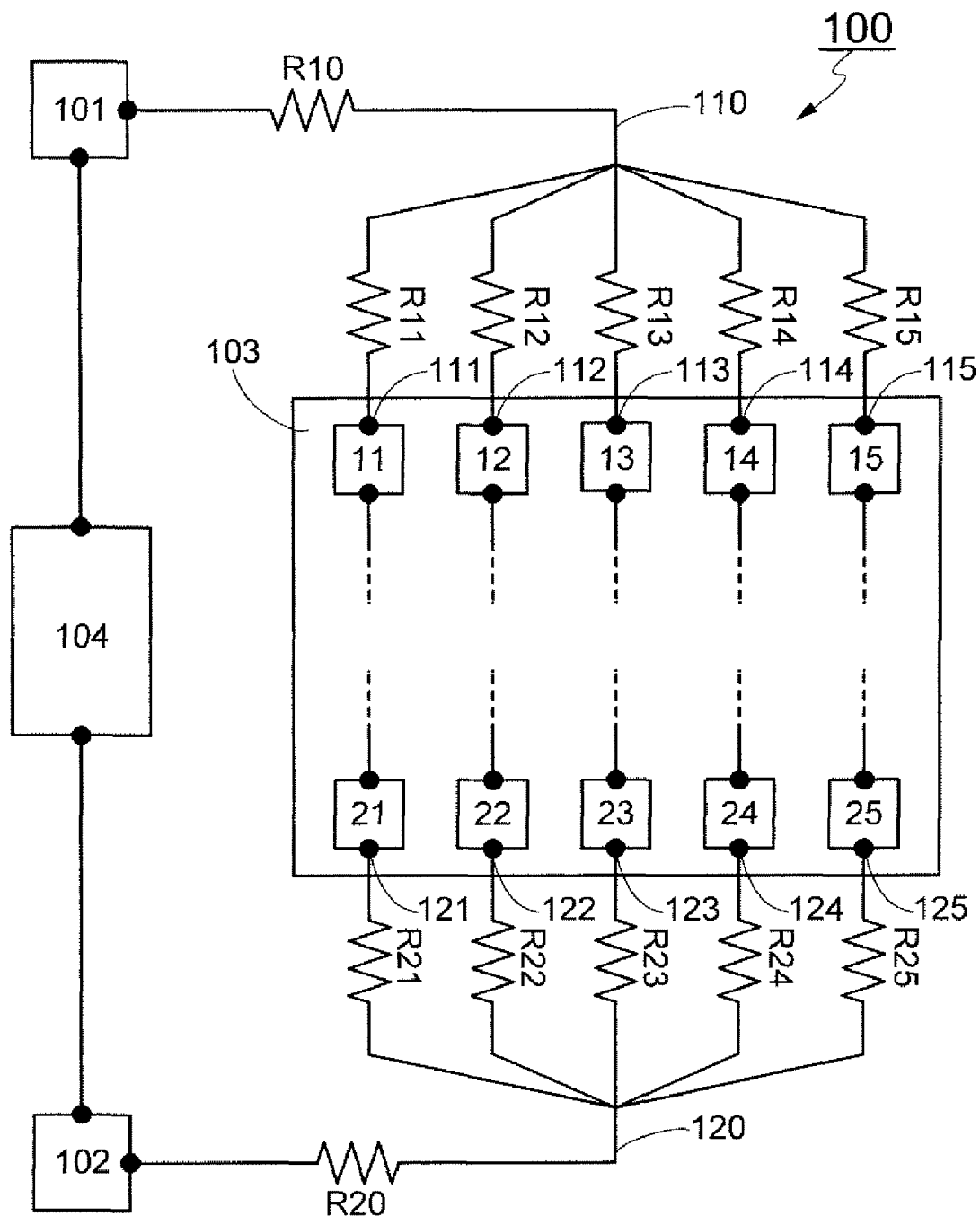
FIG. 1 is a block diagram illustrating a structure of a semiconductor device. (Embodiment 1)

Embodiments of the present invention will be explained with reference to the drawings. However, the present invention is not limited to the description below, and it is to be easily understood by those skilled in the art that various changes in modes and details thereof will be apparent without departing from the purpose and scope of the present invention. Therefore, the present invention should not be interpreted as being limited to the description of the embodiments to be given below. Further, the same elements are denoted by the same reference numerals through the drawings. Therefore, the description of the same elements will be not repeated in the description hereinbelow.

Embodiment 1

First, a semiconductor device according to this embodiment will be described using FIG. 1. FIG. 1 is a block diagram illustrating the structure of a semiconductor device 100 of this embodiment.

As shown in FIG. 1, the semiconductor device 100 includes a first terminal 101, a second terminal 102, a circuit 103 including a plurality of semiconductor elements, a protection circuit 104, a first connection wiring 110, and a second connection wiring 120. The first terminal 101 and the second terminal 102 are an output and input terminals of the semiconductor device 100, and each serve as a connection portion between the semiconductor device 100 and another semiconductor device. The first terminal 101 is electrically connected to the circuit 103 by the first connection wiring 110, and the second terminal 102 is electrically connected to the circuit 103 by the second connection wiring 120.

The circuit 103 includes a plurality of connection portions 111 to 115 which are electrically connected to the first connection wiring 110, and includes a plurality of connection portions 121 to 125 which are electrically connected to the second connection wiring 120. The connection portions 111 to 115 are respective portions of semiconductor elements 11 to 15 included in the circuit 103, which are connection portions between the semiconductor elements 11 to 15 and the first connection wiring 110; and the connection portions 121 to 125 are respective portions of semiconductor elements 21 to 25 included in the circuit 103, which are connection portions between the semiconductor elements 21 to 25 and the second connection wiring 120. That is, the semiconductor elements 11 to 15 including their respective connection portions 111 to 115 are semiconductor elements which are disposed at the first stage with respect to the first terminal 101 (the first connection wiring 110), and the semiconductor elements 21 to 25 including their respective connection portions 121 to 125 are semiconductor elements which are disposed at the first stage with respect to the second terminal 102 (the second connection wiring 120).

That is, described here is the case where five current paths are provided between the first terminal 101 and the circuit 103 and five current paths are provided between the second terminal 102 and the circuit 103 in the semiconductor device 100 of this embodiment. In the semiconductor device 100 of this embodiment, the wiring resistance of the wirings which form the five current paths from the first terminal 101 to the circuit 103 is set to be equal to each other; and similarly, the wiring resistance of the wirings which form the five current paths from the second terminal 102 to the circuit 103 is set to be equal to each other.

The protection circuit 104 is a circuit for preventing overvoltage application to the circuit 103; and the protection circuit 104 is provided in order to prevent the circuit 103 from being broken by an overvoltage. In this embodiment, the protection circuit 104 is interposed between the first terminal 101 and the second terminal 102. At the time of normal operation of the semiconductor device 100, few currents flow through the protection circuit 104; however, when an unexpected overvoltage is applied to the first terminal 101 and/or the second terminal 102 and an excessive potential difference is generated between the first terminal 101 and the second terminal 102, the first terminal 101 and the second terminal 102 are electrically connected (short-circuited) by the protection circuit 104. In this manner, overvoltage application to the circuit 103 is prevented, so that the circuit 103 can be prevented from being broken. For example, the protection circuit 104 can be formed using a rectifying device such as a PN diode or a PIN diode, a diode-connected transistor, etc.

The semiconductor elements 11 to 15 and the semiconductor elements 21 to 25 which are disposed at the first stages with respect to the first terminal 101 and the second terminal 102, respectively are most likely to be broken by ESD or the like in the circuit 103. In this embodiment, in order to improve the resistance to ESD of the semiconductor elements 11 to 15, the first connection wiring 10 is provided so that the wiring resistance between the first terminal 1011 and each of their respective connection portions 111 to 115 is the same. That is, the first connection wiring 110 is provided so as to satisfy R10+R11=R10+R12=R10+R13 R10+R14=R10+R15. Note that R10 to R15 denote resistances of the first connection wiring 110.

Accordingly, when an overvoltage is applied transiently to the first connection wiring 110 in the circuit 103 including the plurality of semiconductor elements 11 to 15 each including the electrical connection portions between the semiconductor element and the first connection wiring 110, voltage application to only one of the connection portions 111 to 115 in a concentrated manner can be prevented or surge current flowing into only one of them in a concentrated manner can be prevented because the resistance between the first terminal 101 and each of the connection portions 111 to 115 is the same or substantially the same as described above, so that the possibility that the semiconductor elements 11 to 15 will be broken can be decreased. For example, if the resistance between the first terminal 101 and the connection portion 111 is the smallest of all, current is likely to flow into the semiconductor element 11 rather than the other semiconductor elements 12 to 15, so that the possibility that the semiconductor element 11 will be broken increases. Thus, the resistance between the first terminal 101 and each of the connection portions 111 to 115 is the same so that an overvoltage, which may be applied, can be divided and applied to the semiconductor elements 11 to 15, whereby the possibility that the semiconductor elements 11 to 15 will be broken can be decreased.

Further, in the circuit 103 including the plurality of semiconductor elements 21 to 25 including the electrical connection portions between the semiconductor elements and the second connection wiring 120, the second connection wiring 120 is provided so that the wiring resistance between the second terminal 102 and each of their respective connection portions 121 to 125 is the same. That is, the second connection wiring 120 is provided so as to satisfy R20+R21=R20+R22 R20+R23=R20+R24=R20+R25. Note that R20 to R25 denote resistances of the second connection wiring 120.

Accordingly, when an overvoltage is applied transiently to the second connection wiring 120 due to ESD or the like, voltage application to only one of the semiconductor elements 21 to 25 in a concentrated manner can be prevented, so that the possibility that the semiconductor elements 21 to 25 will be broken can be decreased.

In this manner, the circuit 103 is electrically connected to the first terminal 101 and the second terminal 102 by the first connection wiring 110 and the second connection wiring 120 as shown in FIG. 1, so that an overvoltage which may be applied to the circuit 103 during a small amount of time (about several hundreds of picoseconds to several nanoseconds) from the generation of ESD to short-circuiting between the first terminal 101 and the second terminal 102 by the protection circuit 104 can be divided, whereby the possibility that the circuit 103 will be broken by ESD can be decreased.

Figure 2:
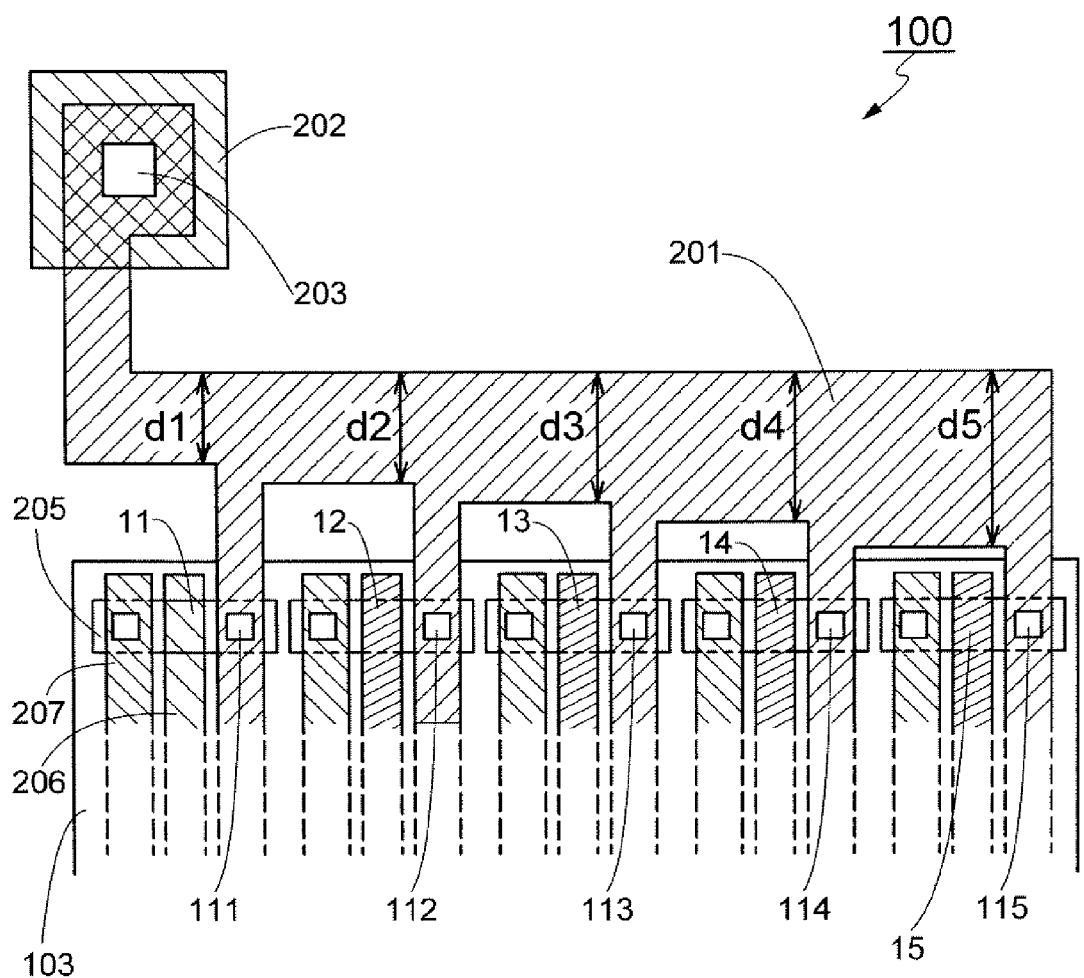
FIG. 2 is a plan view illustrating a structure of a first and second wirings of a semiconductor device. (Embodiment 1)

Next, one example of the structure of the first connection wiring 110 will be described using FIG. 2. FIG. 2 is a plan view showing the partial structure of the semiconductor device 100 and shows the layout in a planar arrangement of the first terminal 101, the first connection wiring 110, and the connection portions 11 to 115.

A conductive film 201 is a conductive film which forms the first connection wiring 110 and an internal wiring of the circuit 103. A conductive film 202 is a conductive film which forms the first terminal 101. An insulating film is formed covering the conductive film 201, on which the conductive film 202 is formed. An opening 203 is formed in the insulating film, in which the conductive film 201 is electrically connected to the conductive film 202.

In the example of FIG. 2, the semiconductor elements 11 to 15 each include a transistor, and the conductive film 201 forms a drain electrode of the transistor. The semiconductor elements 11 to 15 each include a semiconductor region 205 in which a channel formation region, a source region, and a drain region are formed; a conductive film 206 which forms a gate electrode; and a conductive film 207 which forms a source electrode. The conductive films 206 and 207 each forms the internal wiring of the circuit 103. Here, the connection portions 111 to 115 between the semiconductor elements 11 to 15 and the first connection wiring 110 correspond to connection portions between the semiconductor region 205 and the conductive film 201. Note that the semiconductor region 205 is formed of a well region formed in a semiconductor substrate such as a silicon wafer, or a semiconductor layer (film) formed over an insulating film or an insulating substrate.

In the example of FIG. 2, the wiring width (cross-sectional area) of the conductive film 201 is changed depending on the position so that the resistance between the first terminal 101 and each of the connection portions 111 to 115 can be set to the same. That is, the resistance between the first terminal 101 and each of the connection portions 111 to 115 is controlled to be the same by changing the wiring width of the conductive film 201 so as to be d1<d2<d3<d4<d5.

Figure 3:
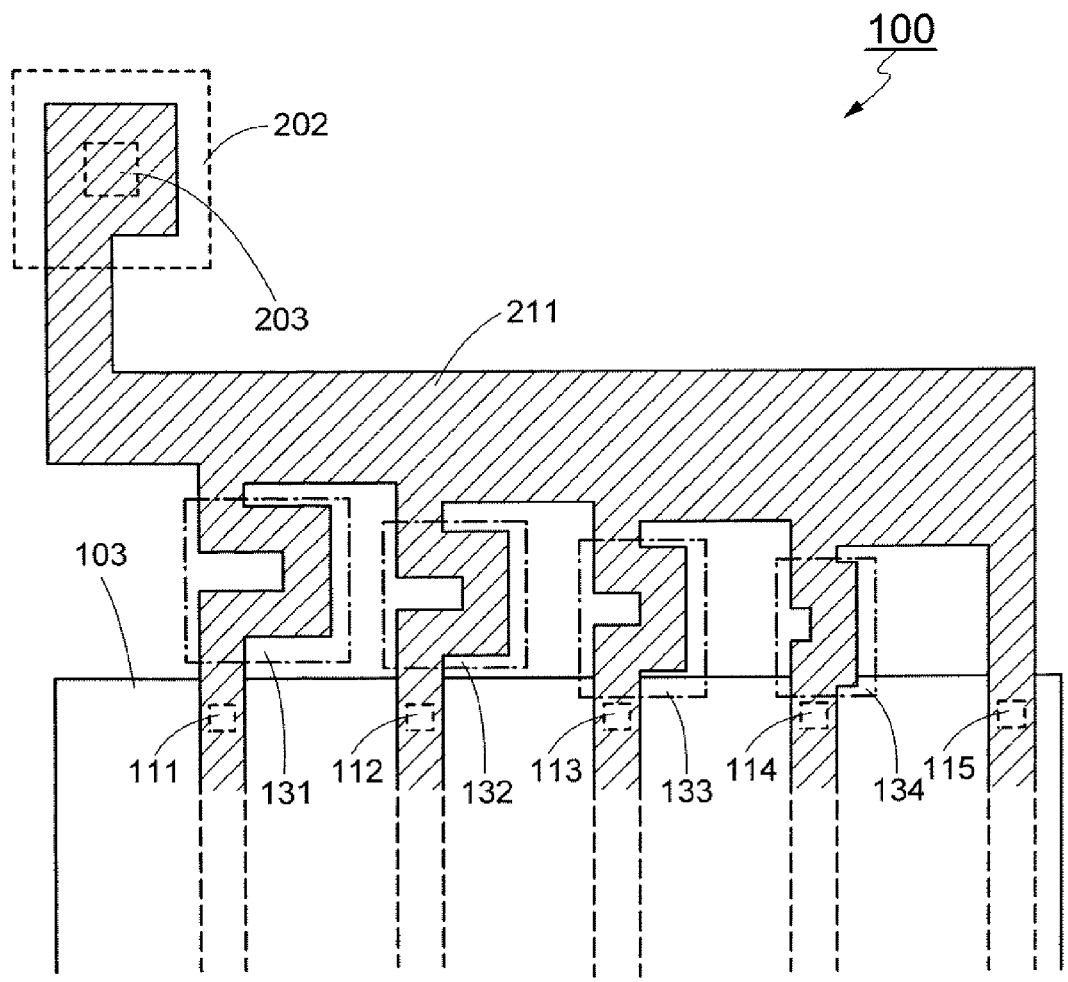
FIG. 3 is a plan view illustrating the layout of the first wiring of FIG. 2. (Embodiment 1)

The length of the conductive film 201 between each of the connection portions 111 to 115 and the connection portion (the portion at which the opening 203 is formed) between the conductive film 201 and the conductive film 202 may be controlled such that the resistance between the first terminal 101 and each of the connection portions 111 to 115 can be set to the same. FIG. 3 is a plan view illustrating a structure of such a conductive film. A conductive film 211 in FIG. 3 could be another example of the conductive film 201 in FIG. 2. In FIG. 3, the conductive film 211 is provided so as to have the wiring width which is changed depending on the position like FIG. 2, and further provided so as to include bent portions 131 to 134 (portions surrounded by a dashed-dotted line) such that the length between the connection portion 111 and the connection portion (the portion at which the opening 203 is formed) is the longest and the length between the connection portion 115 and the connection portion (the portion at which the opening 203 is formed) is the shortest.

The second connection wiring 120 can also be provided using the conductive film 201 shown in FIG. 2 or 3 in a similar manner to the first connection wiring 110.

Figure 4:
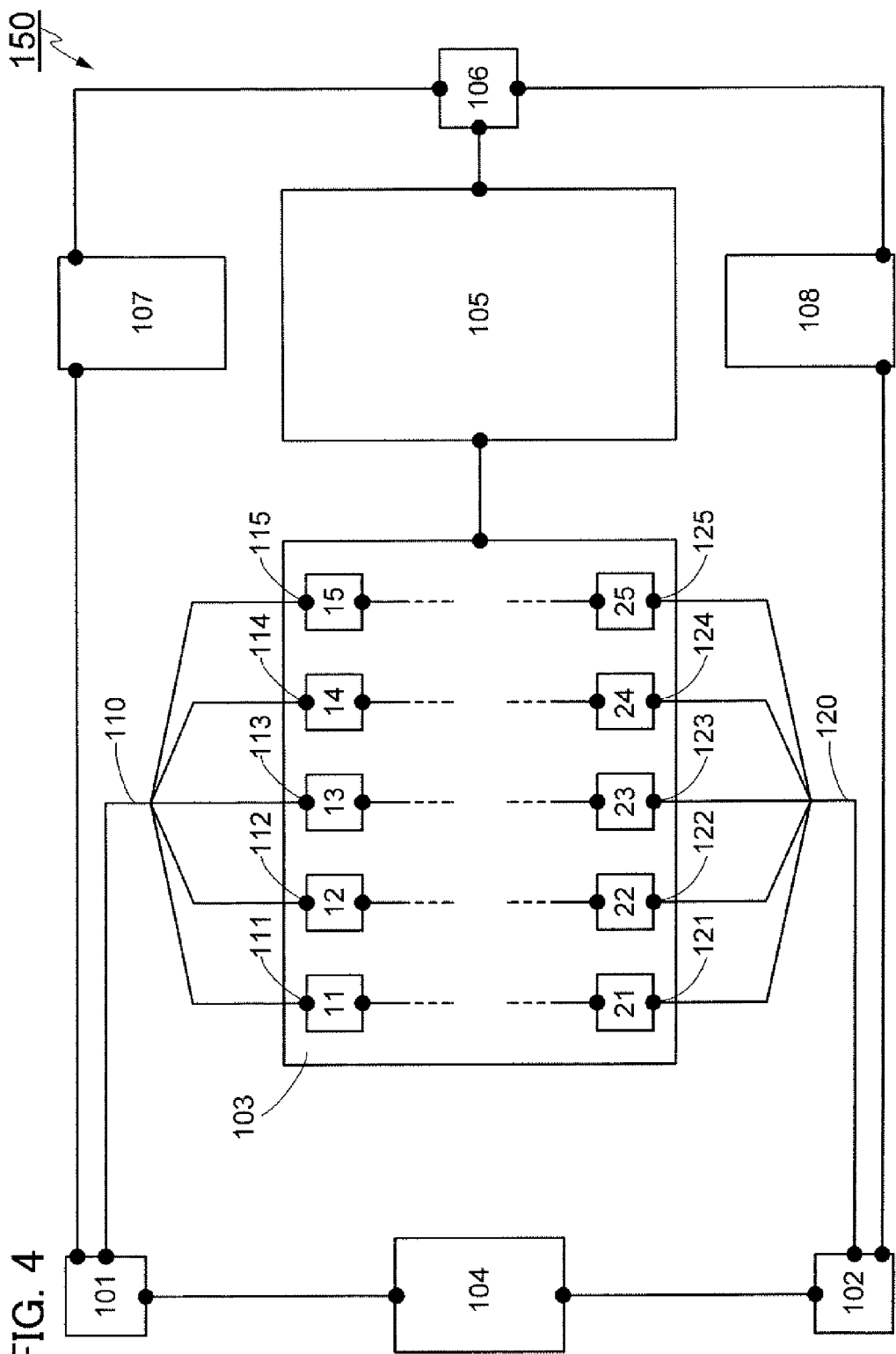
FIG. 4 is a block diagram illustrating a structure of a semiconductor device. (Embodiment 1)

Although one circuit 103 is included in the semiconductor device 100 in the example of the FIG. 1, the semiconductor device according to this embodiment may include a plurality of circuits. FIG. 4 is a block diagram of a semiconductor device 150 including two circuits. As shown in FIG. 4, the semiconductor device 150 includes a circuit 105 which is electrically connected to the circuit 103 and a third terminal 106 which is electrically connected to the circuit 105. In addition, a protection circuit 107 and a protection circuit 108 which are electrically connected between the first terminal 101 and the third terminal 106 and between the second terminal 102 and the third terminal 106, respectively are included. The third terminal 106 is an output/input terminal of the semiconductor device 150 like the first terminal 101 and the second terminal 102, which functions as a connection portion between the semiconductor device 150 and another semiconductor device.

The protection circuits 107 and 108 can be formed in a similar manner to the protection circuit 104. At the time of normal operation of the semiconductor device 150, few currents flow through the protection circuit 107; however, when an unexpected overvoltage is applied to the first terminal 101 and/or the third terminal 106 and an excessive potential difference is generated between the first terminal 101 and the third terminal 106, the first terminal 101 and the third terminal 106 are short-circuited by the protection circuit 107. In this manner, overvoltage application to the circuits 103 and 105 is prevented, so that the circuits 103 and 105 can be prevented from being broken. Like the protection circuit 107, the protection circuit 108 is a circuit for short-circuiting between the second terminal 102 and the third terminal 106 so that overvoltage application to the circuits 103 and 105 is prevented. The protection circuits 107 and 108 are not necessarily provided, but are preferably provided.

In the semiconductor device according to this embodiment, connection wirings each for electrically connecting a terminal and an internal circuit is provided such that the resistance between the terminal and each of a plurality of connection portions of the circuit can be the same. With this structure, local application of high voltage to the internal circuit can be prevented. Accordingly, the resistance to static electricity of the internal circuit can be improved. That is, this embodiment in combination with the protection circuit can suppress the possibility that the circuit will be broken by an unexpected overvoltage applied to the terminal due to ESD or the like. Even when the semiconductor device is designed such that the resistance between the terminal and each of the plurality of connection portions of the circuit can be the same, it is difficult to avoid deviating the thickness or width of a film which forms a wiring, the size of a contact hole, and the like from their respective designed values due to manufacturing equipment used. Therefore, in the semiconductor device according to this embodiment, in view of error generated in the manufacturing process, resistances of a plurality of current paths being within the range of ±20% of the medium value of them are regarded as being equal to each other.

Further, the connection wiring takes a part of the function of a protection circuit in the semiconductor device according to this embodiment, by which reduction of size of the protection circuit becomes easy; thus, this embodiment is very preferable for small semiconductor devices with sizes equal to or less than 10 mm×10 mm. The sizes equal to or less than 10 mm×10 mm mean that the semiconductor devices can be contained in an area of $(10 \text{ mm})^2$ in a planar arrangement.

This embodiment can be combined with any other embodiment as appropriate.

Embodiment 2

In this embodiment, a specific example of the protection circuit 104 will be described. A protection circuit is formed using a PIN diode in this embodiment. Further, the PIN diode is formed using a semiconductor film formed over an insulating film in this embodiment. Further, here, the PIN diode is formed not by stacking an n-type semiconductor region and a p-type semiconductor region, but by forming an n-type impurity region and a p-type impurity region in the semiconductor film so as to be adjacent to each other in a parallel direction over the insulating film.

Using FIGS. 5A to 5C, a first mode of the PIN diode will be described. FIG. 5A is a plan view of a PIN diode 301; FIG. 5B is a plan view of a semiconductor film included in the PIN diode 301; and FIG. 5C is a cross-sectional diagram of the diode along section-line A1-A2 in FIG. 5A.

As shown in FIG. 5C, a semiconductor device to which the protection circuit 104 of this embodiment is applied includes a substrate 30. The circuit 103 and the protection circuit 104 are formed over the substrate 30. In this embodiment, the PIN diode 301 (hereinafter called the "diode 301") is formed as the protection circuit 104.

As the substrate 30, any of the following substrates can be used: a semiconductor substrate; a glass substrate; a quartz substrate; a sapphire substrate; a ceramics substrate; a stainless steel substrate; a metal substrate; a resin substrate; a resin film; a sheet where a fabric of carbon fiber or glass fiber is impregnated with a resin (the sheet is a so-called prepreg); and the like. As the semiconductor substrate, a silicon wafer which is sliced out of an ingot, an SOI substrate in which a single crystal semiconductor film (layer) is formed over a substrate with an insulating film (layer) interposed therebetween, or the like is used. A non-alkali glass substrate is preferably used as the glass substrate. As examples of the non-alkali glass substrate, there are an aluminosilicate glass substrate, an aluminoborosilicate glass substrate, a barium borosilicate glass substrate, and the like.

The upper surface of the substrate 30 is covered with an insulating film 41. A semiconductor film 310 which is included in the protection circuit 104 (the diode 301) is formed over the insulating film 41. A semiconductor film which is included in each semiconductor element of the circuit 103 is also formed over the insulating film 41, though it is not shown in FIG. 5C. Another film such as a semiconductor film or a conductive film may be interposed between the substrate 30 and the insulating film 41.

The semiconductor film 310 may have either a single-layer structure or a stack-layer structure. The semiconductor film 310 can be formed using the following film: a semiconductor film of a Group 14 element in the periodic table such as a silicon film, a germanium film, a silicon-germanium film, or silicon carbide film; a compound semiconductor film such as a GaAs film, an InP film, or a GaN film; an oxide semiconductor film of zinc oxide, tin oxide, or the like; or the like. The crystallinity of the semiconductor film 310 is either a single crystal or a non-single-crystal (such as polycrystalline, microcrystalline, or amorphous); preferably, a low-resistant crystalline semiconductor film such as a polycrystalline or single crystal semiconductor film is used instead of an amorphous semiconductor film in order to reduce the resistance of a p-type impurity region 311 and an n-type impurity region 312.

As shown in FIGS. 5B and 5C, in the semiconductor film 310, the p-type impurity region 311, the n-type impurity region 312, and a high-resistance region 313 are formed so as to be adjacent to each other in a lateral direction with respect to the upper surface of the substrate 30.

The p-type impurity region 311 can be formed by adding an impurity element which serves as an acceptor such as boron into the semiconductor film 310. The n-type impurity region 312 is formed so as to be adjacent to the p-type impurity region 311 with a distance W1 interposed therebetween. The n-type impurity region 312 can be formed by adding an impurity element which serves as a donor such as phosphorus or arsenic into the semiconductor film 310. The high-resistance region 313 is formed between the p-type impurity region 311 and the n-type impurity region 312.

The high-resistance region 313 is a region where the resistance is higher than those of the p-type impurity region 311 and the n-type impurity region 312, and can be formed, for example, an intrinsic semiconductor (an i-type semiconductor). Here, the intrinsic semiconductor is ideally a semiconductor whose Fermi level is positioned near the center of the forbidden band, and further includes in its category a semiconductor whose Fermi level is controlled to be positioned at the center of the forbidden band by adding an impurity which serves as a donor or an acceptor. The high-resistance region 313 can also be formed from an n-type or p-type semiconductor, and can be formed from, for example, a semiconductor in which an impurity element which serves as a donor or an acceptor or an non-doped semiconductor in which such an impurity element is added. It is preferable that the sheet resistance of the high-resistance region 313 is 100 kΩ/square or more and the sheet resistance of each of the p-type impurity region 311 and the n-type impurity region 312 is several kiloohm/square or less.

As shown in FIG. 5C, an insulating film 42 is formed covering the semiconductor film 310. Over the insulating film 42, a conductive film 314 which is electrically connected to the p-type impurity region 311 and a conductive film 315 which is electrically connected to the n-type impurity region 312 are formed. One of the conductive films 314 and 315 is connected to the first terminal 101 and the other is connected to the second terminal 102. Here, respective end portions 314a and 315a of the conductive films 314 and 315 are used as connection portions between the diode 301 and another conductive film (see FIG. 5A).

In order to electrically connect the conductive film 314 to the p-type impurity region 311, a plurality of openings 316 reaching the p-type impurity region 311 is formed in the insulating film 42; and in order to electrically connect the conductive film 315 to the n-type impurity region 312, a plurality of openings 317 reaching the n-type impurity region 312 is formed in the insulating film 42 (see FIG. 5A).

In this embodiment, the plurality of openings 316 is provided not only near the end portion 314a of the conductive film 314 but also over the p-type impurity region 311 so as to be dispersed entirely as shown in FIG. 5A in order to reduce the contact resistance between the p-type impurity region 311 and the conductive film 314. Similarly, the plurality of openings 317 is provided so as to be dispersed entirely over the n-type impurity region 312 in order to reduce the contact resistance between the n-type impurity region 312 and the conductive film 315.

Formation of the plurality of openings 316 and 317 as described above is very effective in the case where the semiconductor film 310 is a non-single-crystal film such as a polycrystalline semiconductor film. In the case of a non-single-crystal semiconductor film, the electrical resistances of the p-type impurity region 311 and the n-type impurity region 312 are higher than those in the case of a single crystal semiconductor film. Therefore, even if a large potential difference is generated between the conductive film 314 and the conductive film 315 by a surge current, the portion where neither the p-type impurity region 311 nor the n-type impurity region 312 are in contact with the conductive film 314 or the conductive film 315 may be unable to function as a diode. With this state, the diode 301 does not function as a rectifying element. That is, the diode 301 becomes just a high-resistant resistor, which does not function enough as a current path through which a surge current flows; therefore, a surge current may flow into the circuit 103 to breakdown the circuit 103. Accordingly, as shown in FIG. 5A, provision of the plurality of openings 316 and 317 so that the contact resistance between the p-type impurity region 311 and the conductive film 314 and between the n-type impurity region 312 and the conductive film 315 is decreased is effective particularly in the case where the semiconductor film 310 is a non-single-crystal film such as a polycrystalline semiconductor film.

Note that also in the other PIN diodes described in this embodiment, a plurality of openings formed in the insulating film 42 in order to electrically connect each of a p-type impurity region and an n-type impurity region to a conductive film is formed in a similar manner to the openings 316 and 317 of the diode 301.

Each of the insulating films 41 and 42 has either a single-layer structure or a stack-layer structure. The insulating films 41 and 42 each can be formed using an insulating film containing silicon and/or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film. The following can also be used as well: an insulating film formed from oxide of metal such as aluminum oxide, tantalum oxide, or hafnium oxide; an insulating film formed from nitride of metal such as aluminum nitride; an insulating film formed from oxynitride of metal such as aluminum oxynitride; or an insulating film formed from nitride oxide of metal such as aluminum nitride oxide. Further, an insulating film formed from an organic compound can be used as well. As such an organic compound film, acrylic, polyimide, polyamide, polyimide-amide, benzo-cyclo-butene, or the like can be used.

There are the following typical examples of the method for forming these insulating films: a CVD method (chemical vapor deposition method) such as a PECVD (plasma-excited CVD) method or a thermal CVD method; a PVD method (physical vapor deposition method) such as a sputtering method or a vapor deposition method; an ALD method (atomic layer deposition method); a method for forming a film with a liquid or paste material, such as a spin-coating method, a droplet discharging method, or a dip-coating method; a solid-phase oxidation treatment or a solid-phase nitridation treatment with plasma or hear; and the like.

Note that in this specification, oxidized nitride is a substance in which the oxygen content is larger than the nitrogen content and nitride oxide is a substance in which the nitrogen content is larger than the oxygen content. For example, as silicon oxynitride, substances containing O, N, Si, and H with concentrations of 50 to 70 atom. %, 0.5 to 15 atom. %, 25 to 35 atom. %, 0.1 to 10 atom. %, respectively can be given. As silicon nitride oxide, substances containing O, N, Si, and H with concentrations of 5 to 30 atom. %, 20 to 55 atom. %, 25 to 35 atom. %, 10 to 25 atom. %, respectively can be given. The concentrations are measured using Rutherford backscattering spectrometry (RBS) and hydrogen forward scattering spectrometry (HFS). The total of the concentrations of all the elements which form the substance does not exceed 100 atom. %, and respective concentrations of O, N, Si, and H are within the above-described ranges when the total of the concentrations of all the elements is set at 100 atom. %.

Each of the conductive films 314 and 315 has either a single-layer structure or a stack-layer structure. Each of the conductive films 314 and 315 can be formed using a metal film containing a simple metal such as tantalum, tungsten, titanium, molybdenum, aluminum, chromium, niobium, gold, silver, copper, or platinum, as its main component, an alloy film, a metal compound film, or the like. For example, as the metal film, a copper film and an aluminum film in which Si or the like is added are given. As the alloy film, an aluminum-copper alloy film and an aluminum-neodymium alloy film are given. As the metal compound film, a metal nitride film such as titanium nitride film or a tungsten nitride film, and a silicide film such as a nickel silicide film or cobalt silicide film are given. These conductive films can be formed by a PVD method such as a sputtering method or a vapor deposition method; a method for forming a film with a liquid or paste material, such as a printing method, a droplet discharging method, or a dip-coating method; a soldering method; a plating method; or the like.

Other modes of the PIN diode which is applied to the protection circuit 104 will be described below using drawings. Described below is mainly a structure which is different from the diode 301, and the other structure is the same or substantially the same as the structure of the diode 301.

First, using FIGS. 6A and 6B and FIG. 7, a second mode of the PIN diode will be described. FIG. 6A is a plan view of a PIN diode 302; FIG. 6B is a plan view of a semiconductor film included in the PIN diode 302; and FIG. 7 is a cross-sectional diagram of the diode cut along section-line A3-A4 in FIG. 6A.

The PIN diode 302 (hereinafter called the "diode 302") is a similar PIN diode to the diode 301 and includes a semiconductor film 320. In the semiconductor film 320, a p-type impurity region 321, an n-type impurity region 322, and a high-resistance region 323 are formed so as to be adjacent to each other in a lateral direction with respect to the upper surface of the substrate 30. The diode 301 and the diode 302 are different from each other in that the junction between the p-type impurity region 311 and the high-resistance region 313 and the junction between the n-type impurity region 312 and the high-resistance region 313 are straight in a planar arrangement of the diode 301 but the junction between the p-type impurity region 321 and the high-resistance region 323 and the junction between the n-type impurity region 322 and the high-resistance region 323 are bent in a square-wave shape in a planar arrangement of the diode 302. With this structure, the junction area between the p-type impurity region 321 and the high-resistance region 323 and the junction area between the n-type impurity region 322 and the high-resistance region 323 can be increased.

Figure 7:
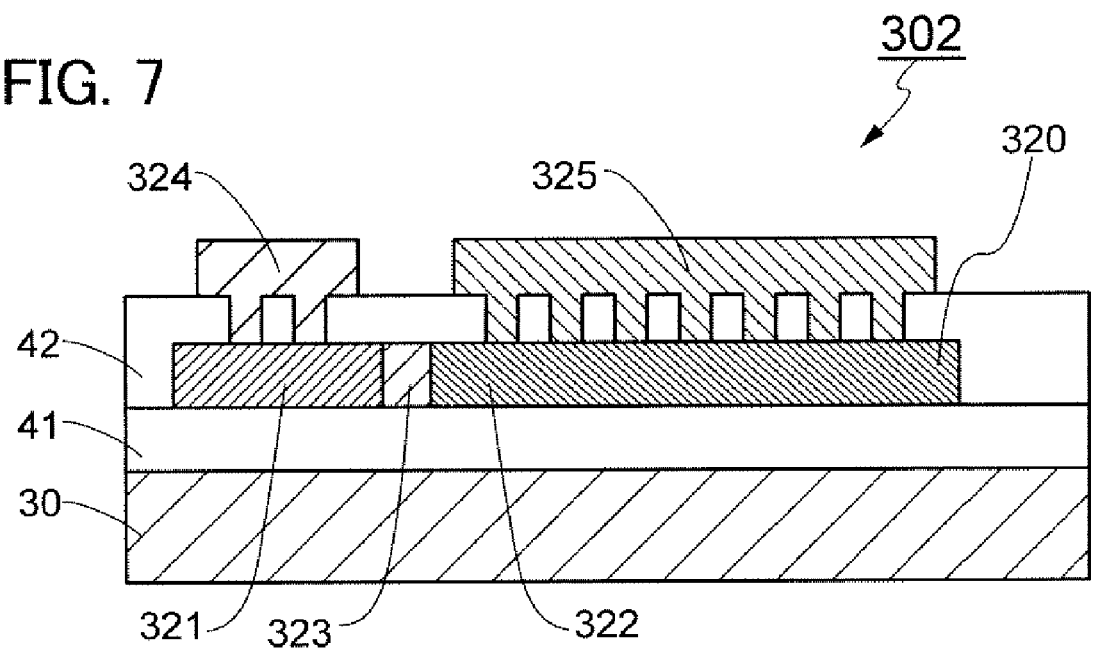
FIG. 7 is a cross-sectional diagram along section-line A3-A4 in FIG. 6A. (Embodiment 2)

As shown in FIG. 7, the diode 302 includes a semiconductor film 320 over an insulating film 41. An insulating film 42 is formed over the semiconductor film 320.

As shown in FIG. 6B, the high-resistance region 323 is formed between the p-type impurity region 321 and the n-type impurity region 322, the planar shape of which is a meandering shape. On the other hand, the planar shape of each of the p-type impurity region 321 and the n-type impurity region 322 is a comb-like shape in which a plurality of L-shape regions is connected. Convex portions of the n-type impurity region 322 are arranged so as to fit concave portions of the p-type impurity region 321, and the p-type impurity region 321 and the n-type impurity region 322 are adjacent to each other with a predetermined distance W2 interposed therebetween.

As shown in FIG. 6A, like the diode 301, a plurality of openings 326 and a plurality of openings 327 are formed in the insulating film 42 with respect to the p-type impurity region 321 and the n-type impurity region 322, respectively. Conductive films 324 and 325 are formed over the insulating film 42. The conductive film 324 is electrically connected to the p-type impurity region 321 in the openings 326 and the conductive film 325 is electrically connected to the n-type impurity region 322 in the openings 327. One of respective end portions 324a and 325a of the conductive films 324 and 325 is electrically connected to the first terminal 101 and the other is electrically connected to the second terminal 102.

Figure 8A:
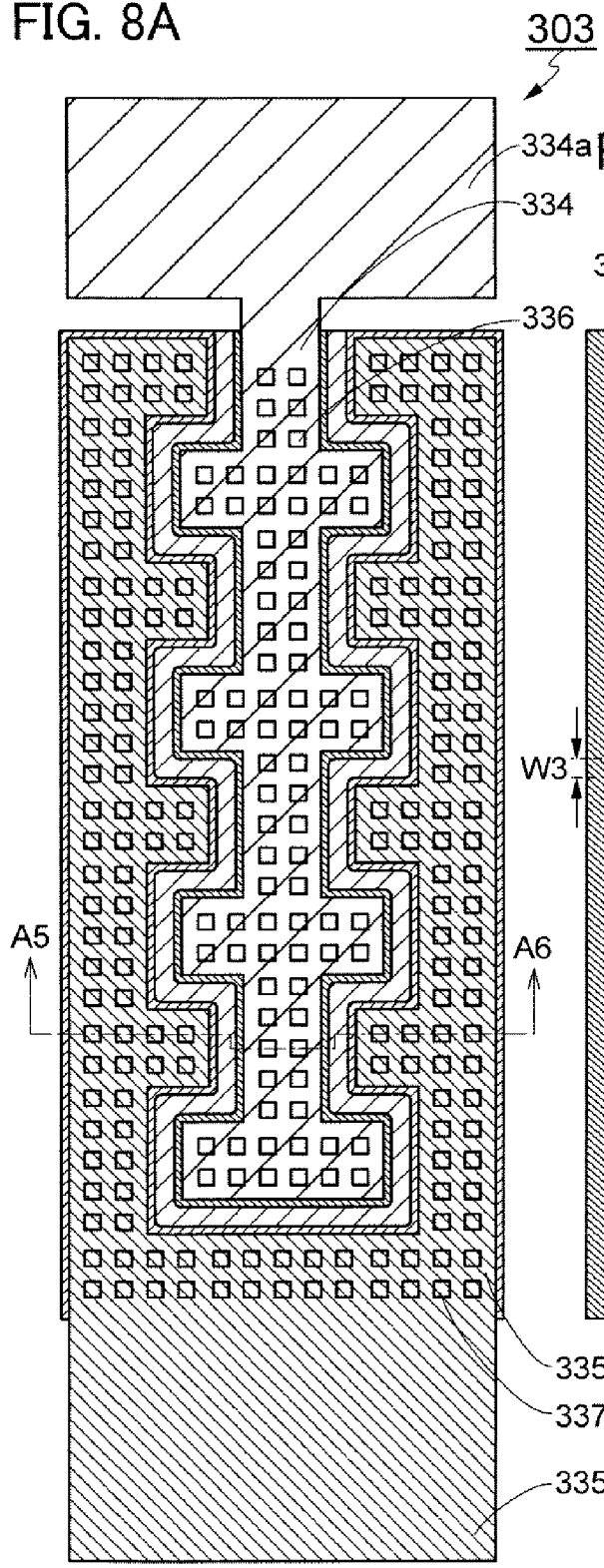
FIG. 8A is a plan view of a PIN diode which is applied in a protection circuit.
Figure 8B:
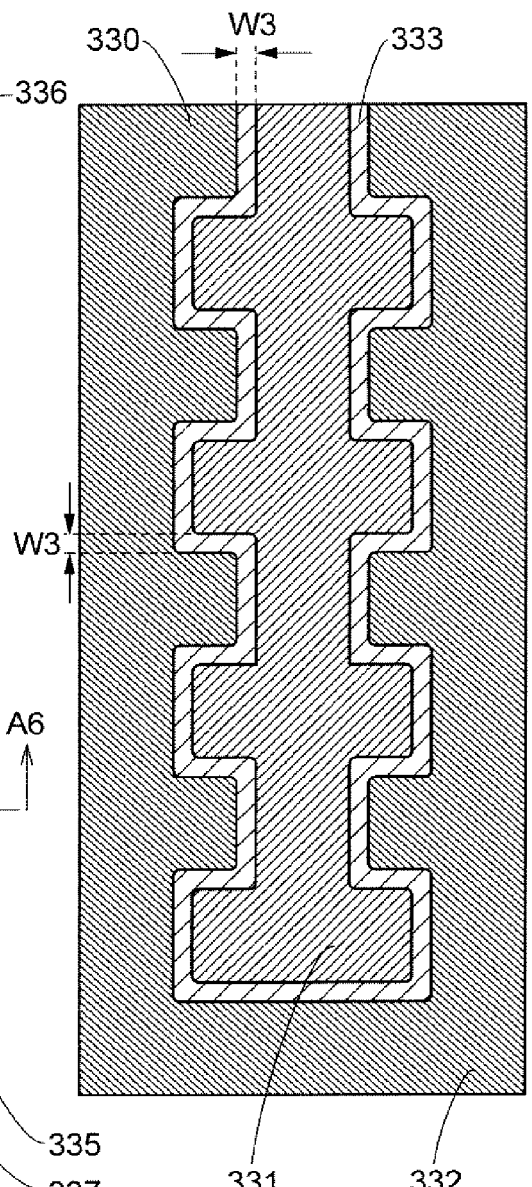
FIG. 8B is a plan view of a semiconductor film which is included in the diode. (Embodiment 2)

Next, using FIGS. 8A and 8B and FIG. 9, a third mode of the PIN diode will be described. FIG. 8A is a plan view of a PIN diode 303; FIG. 8B is a plan view of a semiconductor film included in the PIN diode 303; and FIG. 9 is a cross-sectional diagram of the diode cut along section-line A5-A6 in FIG. 8A.

Figure 9:
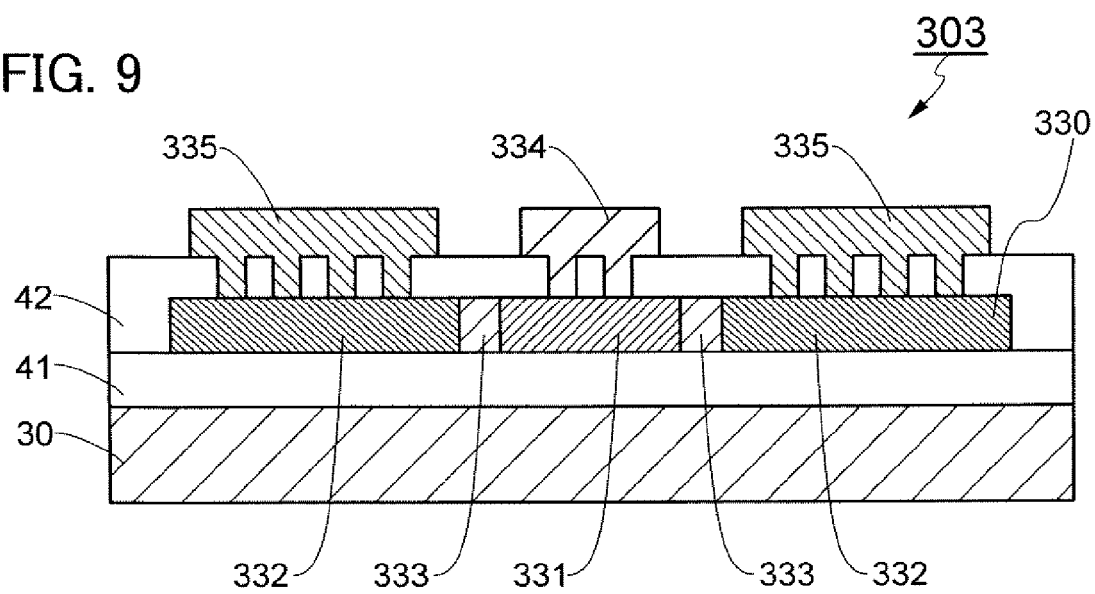
FIG. 9 is a cross-sectional diagram along section-line A5-A6 in FIG. 8A. (Embodiment 2)

As shown in FIG. 9, The PIN diode 303 (hereinafter called the "diode 303") includes a semiconductor film 330 over an insulating film 41. In the semiconductor film 330, a p-type impurity region 331, an n-type impurity region 332, and a high-resistance region 333 are formed. The high-resistance region 333 is formed between the p-type impurity region 331 and the n-type impurity region 332, planar shape of which is a meandering shape.

As shown in FIG. 8A, the p-type impurity region 331 includes the end portion of the semiconductor film 330 and is provided at the center of the semiconductor film 330. The p-type impurity region 331 has a planar shape with a plurality of T-shaped regions connected to each other so as to be a comb-like shape with teeth on both sides. The n-type impurity region 332 includes the end portion of the semiconductor film 330 and is formed so as to surround the p-type impurity region 331. The shape of the n-type impurity region 332 on the side adjacent to the p-type impurity region 331 is a comb-like shape (concavo-convex shape) in which a plurality of L-shapes is connected. The n-type impurity region 332 has convex portions which fit concave portions of the p-type impurity region 331. The p-type impurity region 331 and the n-type impurity region 332 are adjacent to each other with a predetermined distance W3 interposed therebetween.

In the diode 303, the junction between the p-type impurity region 331 and the high-resistance region 333 and the junction between the n-type impurity region 332 and the high-resistance region 333 are bent in a rectangular-wave shape in a planar arrangement, and the n-type impurity region 332 is formed so as to surround the p-type impurity region 331. With this structure, the junction area between the p-type impurity region 331 and the high-resistance region 333 and the junction area between the n-type impurity region 332 and the high-resistance region 333 can be increased. Note that the positions of the p-type impurity region 331 and the n-type impurity region 332 can be changed to each other.

As shown in FIG. 9, conductive films 334 and 335 are formed over the insulating film 42. Further, as shown in FIG. 8A, a plurality of openings 336 and a plurality of openings 337 are formed in the insulating film 42 with respect to the p-type impurity region 331 and the n-type impurity region 332, respectively. The conductive film 334 is electrically connected to the p-type impurity region 331 in the openings 336 and the conductive film 335 is electrically connected to the n-type impurity region 332 in the openings 337. One of respective terminals 334a and 335a of the conductive films 334 and 335 is electrically connected to the first terminal 101 and the other is electrically connected to the second terminal 102.

This embodiment can be combined with any other embodiment as appropriate. For example, the kind, the forming method, and the like of the film such as the conductive film 314 or 315, the insulating film 41 or 42, or the like can be applied to a conductive film or an insulating film of any other embodiment.

Embodiment 3

In this embodiment, a specific example of the protection circuit 104 will be described. In this embodiment, a protection circuit is formed using a discharge circuit including a pair of conductive films (or semiconductor films) which are face each other with an insulating film interposed therebetween.

Figure 10A:
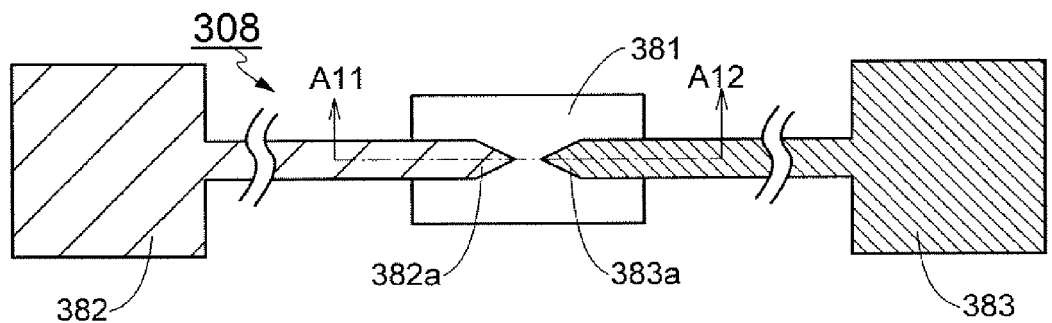
FIG. 10A is a plan view illustrating a structure of a discharge circuit which is applied in a protection circuit.
Figure 10B:
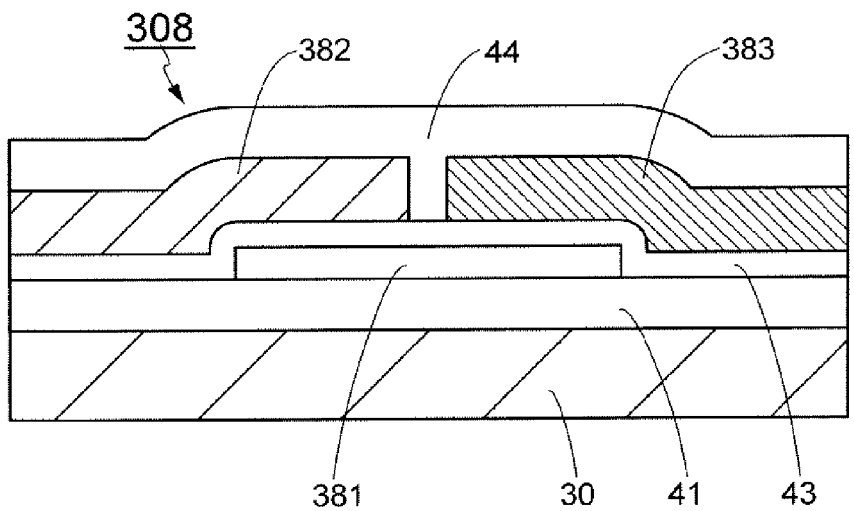
FIG. 10B is a cross-sectional diagram along section-line A11-A12 in FIG. 10A.

A discharge circuit 308 of this embodiment will be described using FIGS. 10A and 10B. FIG. 10A is a plan view of the discharge circuit 308; and FIG. 10B is a cross-sectional diagram of the discharge circuit 308 along section-line A11 to A12 in FIG. 10A.

The discharge circuit 308 and a circuit 103 are formed over the same substrate 30. As shown in FIG. 10B, a semiconductor film 381 is formed over an insulating film 41, and an insulating film 43 is formed over the semiconductor film 381. The semiconductor film 381 is not electrically connected to the other semiconductor film or conductive film of a semiconductor device 100 and is in the floating state. For example, the semiconductor film 381 can be formed by the same step as a semiconductor film of a transistor in the circuit 103. In addition, the insulating film 43 can be formed from a gate insulating film of the transistor.

A pair of conductive films 382 and 383 is formed so as to partially overlap with the semiconductor film 381. An insulating film 44 is formed covering the conductive films 382 and 383. One of the conductive films 382 and 383 is electrically connected to a first terminal 101 and the other is electrically connected to a second terminal 102. Respective end portions 382a and 383a of the conductive films 382 and 383 are sharpened such that an electronic filed is concentrated. The end portions 382a and 383a are close to each other with the insulating film 44 interposed therebetween and overlap with the semiconductor film 381 with the insulating film 43 interposed therebetween.

For example, when an overvoltage is applied to the conductive film 382 due to ESD or the like, the potential difference between the end portions 382a and 383a becomes large, which causes breakdown or tunneling effect of the insulating film 43 and/or the insulating film 44, so that electrical charges can move between the end portion 382a of the conductive film 382 and the end portion 383a of the conductive film 383. That is, electrical discharge occurs between the end portion 382a of the conductive film 382 and the end portion 383a of the conductive film 383. This electrical discharge electrically connects the first terminal 101 and the second terminal 102, so that the application of an overvoltage to the circuit 103 can be prevented.

The semiconductor film 381 is not necessarily provided for generating electrical discharge between the end portion 382a of the conductive film 382 and the end portion 383a of the conductive film 383, but is preferably provided. This is because the semiconductor film 381 decreases the voltage for causing the tunneling effect of the insulating film 43 as compared to the case where the semiconductor film 381 is not provided, thereby easily inducing the electrical discharge between the end portion 382a of the conductive film 382 and the end portion 383a of the conductive film 383.

Figure 10C:
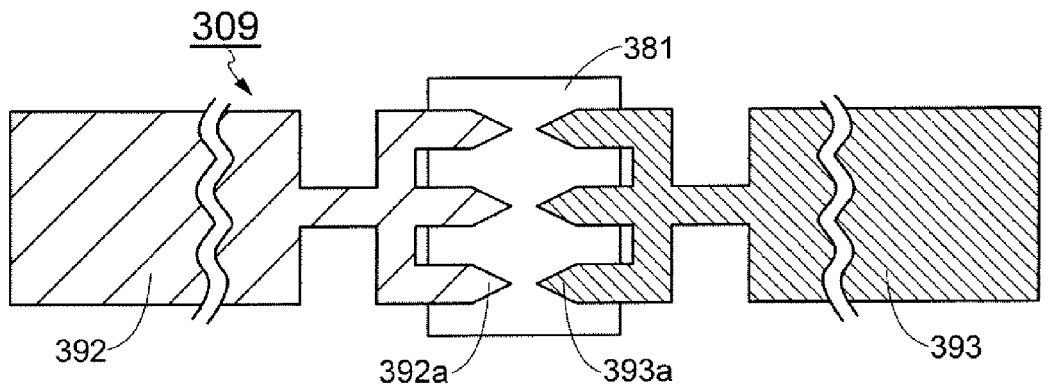
FIG. 10C is a plan view illustrating another structure of the discharge circuit. (Embodiment 3)

The conductive films 382 and 383 each can be provided with a plurality of sharpened end portions. FIG. 10C illustrates the structure example of a discharge circuit 309 having a plurality of sharpened end portions as described above. As shown in FIG. 10C, a conductive film 392 is provided with three end portions 392a which are sharpened and a conductive film 393 is provided with three end portions 393a which are sharpened. Like the discharge circuit 308, the three end portions 392a and the three end portions 393a face each other with the insulating film 44 interposed therebetween and are formed so as to overlap with the semiconductor film 381 with the insulating film 43 interposed therebetween.

Embodiment 4

Figure 11:
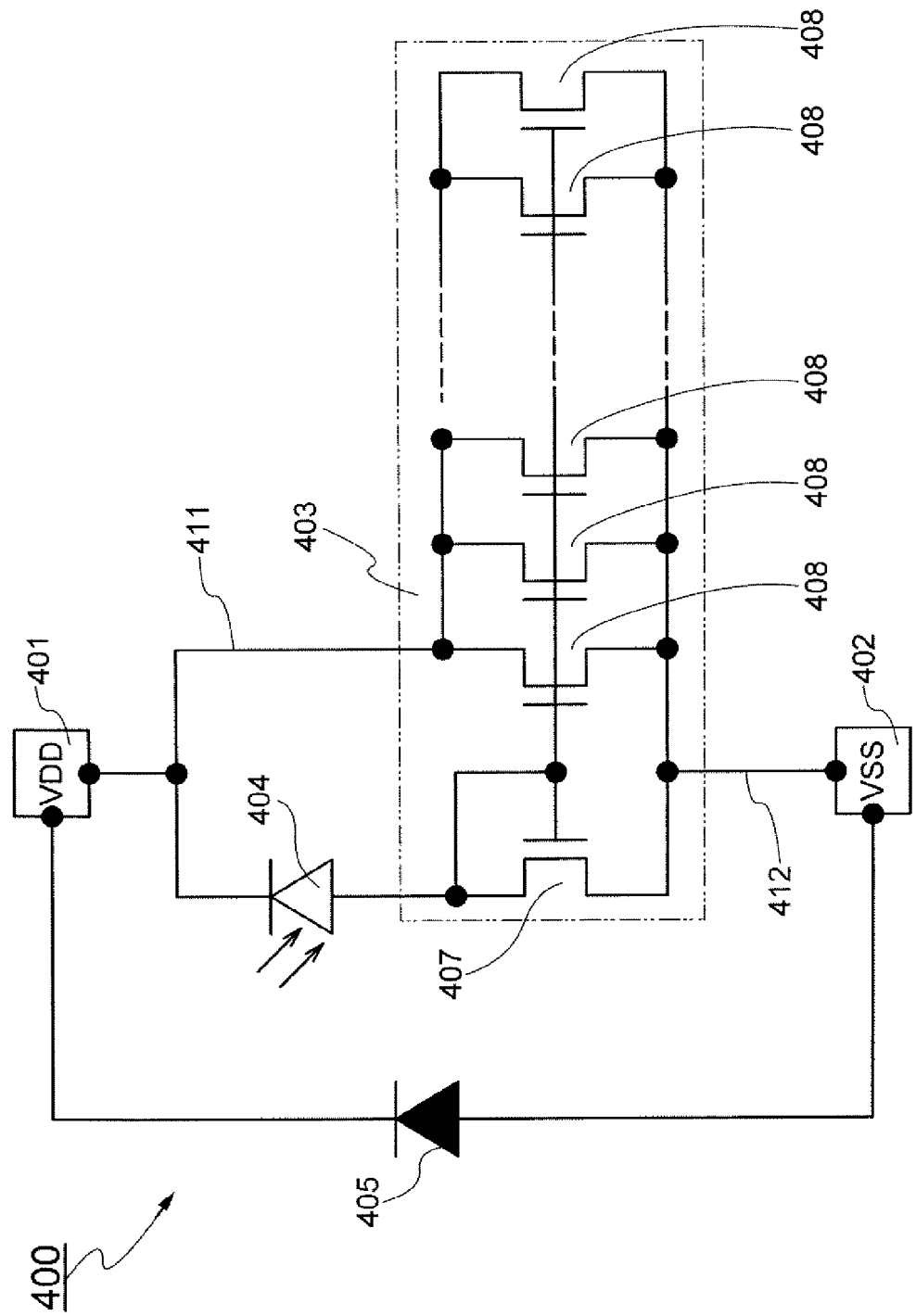
FIG. 11 is a circuit diagram illustrating a structure of a photo detector. (Embodiment 4)
Figure 12:
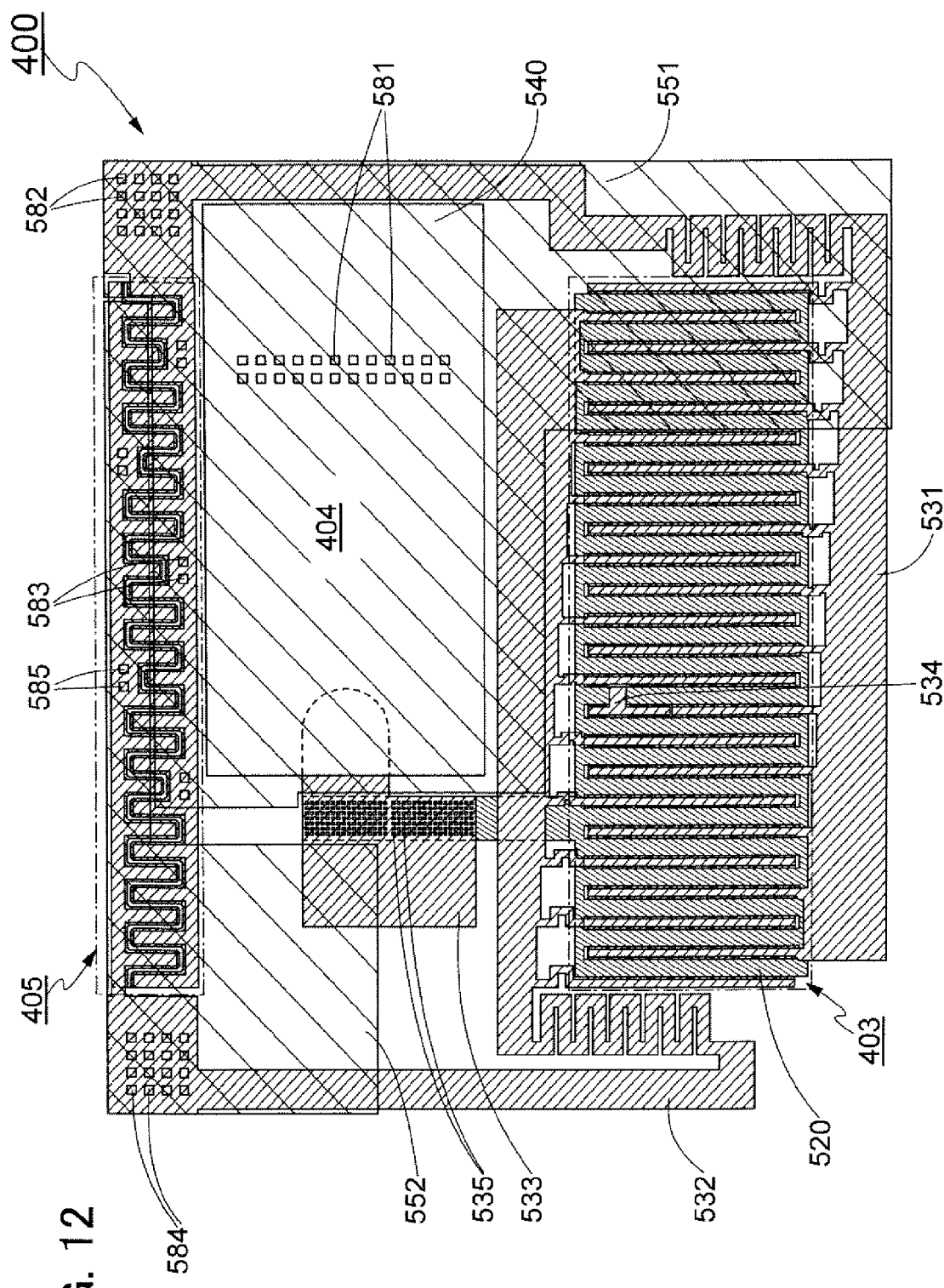
FIG. 12 is a plan view illustrating a layout of the photo detector of FIG. 11. (Embodiment 4)
Figure 13:
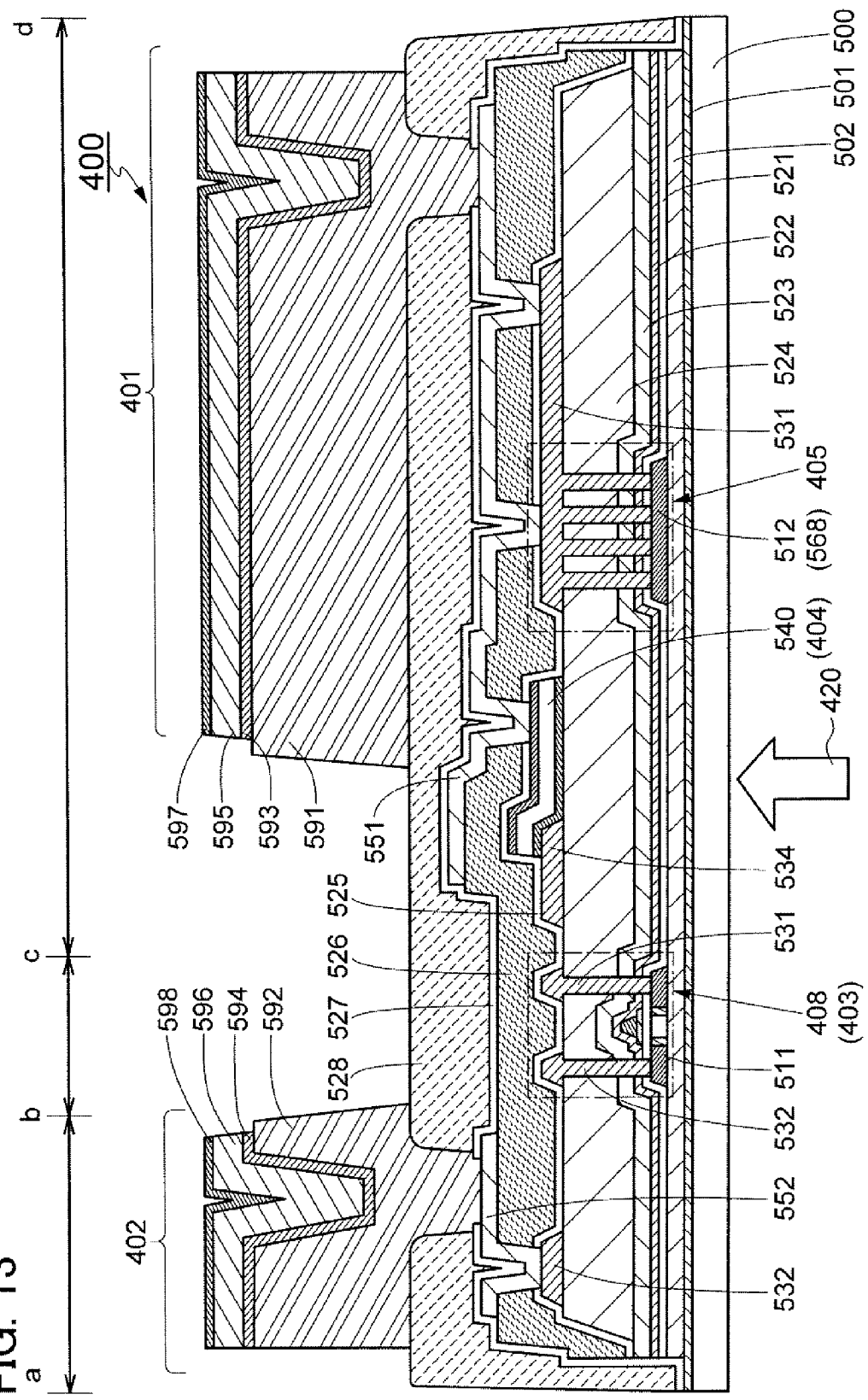
FIG. 13 is a cross-sectional diagram illustrating the stack-layer structure of the photo detector of FIG. 1. (Embodiment 4)

In this embodiment, a photo detector will be described as a specific example of a semiconductor device. First, the structure of the photo detector will be described using FIGS. 11 to 13. FIG. 11 is a circuit diagram of a photo detector 400 of this embodiment. FIG. 12 is a plan view illustrating the layout of the photo detector. FIG. 13 is a cross-sectional view illustrating the stack-layer structure of the photo detector.

As shown in FIG. 11, the photo detector 400 of this embodiment includes a power source terminal 401 to which a high power source potential VDD is supplied, a power source terminal 402 to which a low power source potential VSS is supplied, an amplifier circuit 403, a photodiode 404, and a diode 405. The amplifier circuit 403 is electrically connected to the power source terminal 401 by a connection wiring 411 and is electrically connected to the power source terminal 402 by a connection wiring 412. In the photo detector 400, ground potential GND can be used as the low power source potential VSS which is supplied to the power source terminal 402.

The photodiode 404 is a photoelectric conversion element that converts received light into electrical signals. A photo transistor may be provided instead of the photodiode 404, as the photoelectric conversion element. The amplifier circuit 403 is a circuit for amplifying an output current of the photodiode 404, and includes a current-mirror circuit in this embodiment. This current-mirror circuit includes one transistor 407 and a plurality of transistors 408 which are connected in parallel. Depending on the number of transistors 408, the gain of the current flowing through the transistor 407 is controlled. Therefore, in order to amplify the output of the photodiode 404 to be increased by 100 times, for example, 100 transistors 408 are connected in parallel to one transistor 407.

In this embodiment, the transistor 407 and the transistors 408 in the amplifier circuit 403 are n-channel transistors. Each drain of the transistor 407 and the plurality of transistors 408 is electrically connected to the power source terminal 402. Source of the transistor 407 is electrically connected to an anode of the photodiode 404, and each source of the plurality of transistors 408 is electrically connected to the power source terminal 401. Note that the transistor 407 and the transistors 408 may be p-channel transistors as well.

Instead of the amplifier circuit 403, an attenuation circuit for attenuating the output current of the photodiode 404 may be provided. The attenuation circuit can include a current-mirror circuit. In such a current-mirror circuit, the number of transistors 407 is larger than the number of transistors 408. For example, in order to attenuate the output of the photodiode 404 to be decreased to $1/100$, one transistor 408 may be provided for 100 transistors 407 which are connected in parallel.

The photo detector 400 includes the diode 405 as the protection circuit. The diode 405 is interposed between the power source terminal 401 and the power source terminal 402, a cathode of the diode 405 is electrically connected to the power source terminal 401, and an anode of the diode 405 is electrically connected to the power source terminal 402. When an overvoltage is applied to the power source terminal 401 and/or the power source terminal 402 by ESD or the like, the diode 405 make the power source terminal 401 and the power source terminal 402 to be short-circuited therebetween, so that application of an overvoltage to the amplifier circuit 403 and the photodiode 404 is prevented.

Next, using FIG. 12, the planar arrangement of the photo detector 400 of this embodiment will be described. In this embodiment, the first wiring 110 and the second wiring 120 of Embodiment 1 are employed as the connection wirings 411 and 412, and the diode 301 (see FIGS. 5A to 5C) of Embodiment 2 is employed as the diode 405. Shown in FIG. 12 are a semiconductor film included in the transistors 407 and 408 in the amplifier circuit 403, a semiconductor film included in the photodiode 404, a semiconductor film included in the diode 405, and conductive films which are the first to third layers. The photo detector 400 further includes a conductive film which is the fourth layer included in the power source terminals 401 and 402.

A conductive film 520 is the conductive film which is the first layer. The conductive film 520 forms gate wirings (gate electrodes) of the transistors 407 and 408 of the amplifier circuit 403. Below the conductive film 520, one semiconductor film included in the transistors 407 and 408 are formed with an insulating film interposed therebetween.

Over the conductive film 520, the conductive film which is the second layer is formed with an insulating film interposed therebetween. In this embodiment, as the conductive film which is the second layer, four conductive films 531 to 534 are formed. The conductive film 531 forms a drain wiring of the transistor 408 and the cathode of the diode 405. The conductive film 532 forms a source wiring of each of the transistors 407 and 408. The conductive film 533 forms a drain electrode of the transistor 407, and electrically connects the gate electrode of the transistor 407 to the drain electrode thereof. The conductive film 534 forms an electrode for electrically connecting the photodiode 404 and the amplifier circuit 403. Further, the conductive film 534 is electrically connected to the conductive film 520 which is the first layer in a plurality of openings 535 formed in the insulating film, thereby electrically connecting each gate electrode (gate wiring) of the transistors 407 and 408 to the anode of the photodiode 404.

Further, below one end portion of the conductive film 531 or the conductive film 532, the semiconductor film (not shown in FIG. 12) included in the diode 405 was formed with an insulating film interposed between the end portion and the semiconductor film.

A photoelectric conversion layer 540 is formed over the conductive film 534 which is the second layer. The photoelectric conversion layer 540 is included in the photodiode 404. The photoelectric conversion layer 540 is formed in contact with the conductive film 534.

An insulating film which covers the conductive films 531 to 534 which are the second layers and the photoelectric conversion layer 540 is formed, and over this insulating film, conductive films 551 and 552 are formed as the conductive films which are the third layers. In this insulating film, pluralities of openings 581 to 585 are formed. The conductive film 551 is electrically connected to the photoelectric conversion layer 540 in the plurality of openings 581, and to the conductive film 531 in the pluralities of openings 582 and 583. The conductive film 552 is electrically connected to the conductive film 532 in the pluralities of openings 584 and 585.

The photo detector 400 further includes the conductive film which is the fourth layer. As shown in FIG. 13, the conductive film which is the fourth layer is included in the power source terminals 401 and 402. In this embodiment, the power source terminals 401 and 402 each include a conductive film having a four-layer structure, the power source terminal 401 is electrically connected to the conductive film 551, and the power source terminal 402 is electrically connected to the conductive film 552.

Note that FIG. 13 is a cross-sectional diagram illustrating the stack-layer structure of films included in the photo detector 400 and electrical connection of conductive films formed in different layers; it is not a cross-sectional diagram along a certain section-line in the plan view of FIG. 12. In FIG. 13, a part denoted by a-b mainly illustrates the electrical connection structure between the power source terminal 402 and the conductive films which are the second and third layers; a part denoted by b-c typically illustrates the transistor 408 as the cross section of the amplifier circuit 403; and a part denoted by c-d mainly illustrates the electrical connection structure between the power source terminal 401 and the conductive films which are the second and third layers and the cross-sectional structures of the photodiode 404 and the diode 405.

In this embodiment, a glass substrate 500 is used as a substrate provided for an integrated circuit (the amplifier circuit 403 and the photodiode 404). When light 420 passed through the glass substrate 500 enters the photodiode 404, the photodiode 404 converts the light into an electrical signal. This electrical signal is amplified in the amplifier circuit 403 and output from the photo detector 400 as a current flowing between the power source terminals 401 and 402. In this embodiment, a coloring layer (a color filter layer) for selective transmission of light with a predetermined wavelength range can be provided on the side of the glass substrate 500 from which the light 420 enters. As the coloring layer, for example, a resin layer in which a pigment is dispersed can be used.

Next, the manufacturing method and the cross-sectional structure of the photo detector 400 will be described. First, using cross-sectional diagrams of FIGS. 14A to 14E and FIGS. 15A to 15D and plan views of FIGS. 20A and 20B and FIG. 21, the manufacturing method of the transistors 407 and 408 and the diode 405 will be described.

First, the glass substrate 500 is prepared. A non-alkali glass substrate is preferable as the glass substrate 500. As examples of the non-alkali glass substrate, there are an aluminosilicate glass substrate, an aluminoborosilicate glass substrate, a barium borosilicate glass substrate, and the like. Instead of the glass substrate 500, a quartz substrate can be used as well.

Figure 14A:
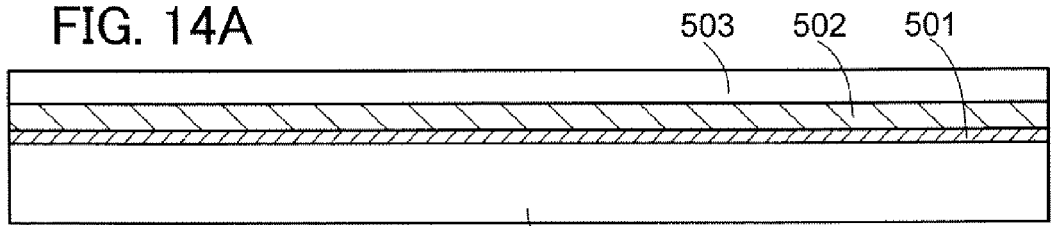
FIGS. 14A to 14E are cross-sectional diagrams illustrating one mode of the method for manufacturing a transistor and a diode included in the photo detector of FIGS. 12 and 13. (Embodiment 4)

Next, a base insulating film with a thickness of 50 to 300 nm is formed over the glass substrate 500. In this embodiment, an insulating film having a two-layer structure of a silicon nitride oxide film 501 and a silicon oxynitride film 502 is formed as the base insulating film as shown in FIG. 14A. Next, an amorphous silicon film 503 with a thickness of 20 to 100 nm is formed over the base insulating film to form semiconductor films of the transistors 407 and 408 and the diode 405.

The base insulating film is provided in order to prevent an alkali metal (typically Na) or an alkali earth metal contained in the glass substrate 500 from diffusing and adversely affecting the electrical characteristics of semiconductor elements such as transistors. The base insulating film has either a single-layer structure or a stack-layer structure, and preferably includes at least one layer that functions as a barrier film for preventing diffusion of an alkali metal or an alkali earth metal. In this embodiment, the silicon nitride oxide film 501 is provided as the barrier film. A nitride oxide film such as a silicon nitride oxide film or a nitride film such as a silicon nitride film or an aluminum nitride film is preferable as the barrier film. In order to reduce the interface state density between the base insulating film and the semiconductor film included in each of the transistors 407 and 408, the silicon oxynitride film 502 is formed between this semiconductor film and the silicon nitride oxide film 501.

In this embodiment, the 140-nm-thick silicon nitride oxide film 501, the 100-nm-thick silicon oxynitride film 502, and the 50-nm-thick amorphous silicon film 503 are formed successively with one PECVD apparatus. Source gases of the silicon nitride oxide film 501 are $SiH_4$, $N_2O$, $NH_3$, and $H_2$. Source gases of the silicon oxynitride film 502 are $SiH_4$ and $N_2O$. Source gases of the amorphous silicon film 503 are $SiH_4$ and $H_2$. By changing the source gases, three kinds of films can be successively formed in one chamber.

In this embodiment, the transistors 407 and 408 and the diode 405 are formed using a crystalline semiconductor film. Therefore, the amorphous semiconductor film is crystallized to form a crystalline semiconductor film. As the method for crystallizing the semiconductor film, a solid-phase growth method using a lamp-annealing apparatus or a furnace, a laser-crystallization method in which a semiconductor film is melted and crystallized by laser-light irradiation, or the like can be used.

Figure 14B:
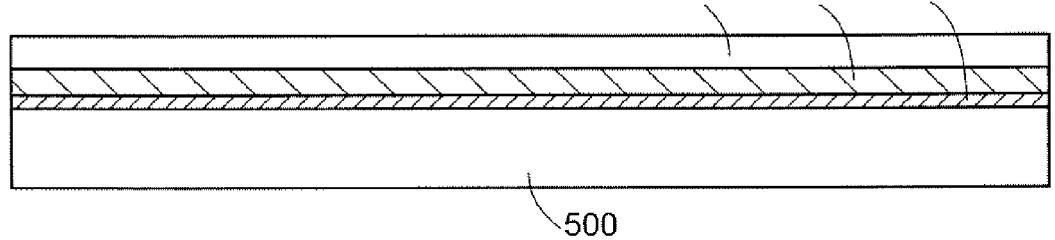

In this embodiment, the amorphous silicon film 503 is formed over the base insulating film, and solid-growth of the amorphous silicon film 503 is performed for crystallization, thereby forming a crystalline silicon film 504 (see FIGS. 14A and 14B). In this embodiment, in order for fast solid-growth of the amorphous silicon film 503 at a heating temperature of 600° C. or less, a metal element is added into the amorphous silicon film 503. The crystallization method of the amorphous silicon film 503 will be described in detail below.

First, the surface of the amorphous silicon film 503 is subjected to ozone water to form a very-thin (several-nanometer-thick) oxide film, so that the wettability of the surface of the amorphous silicon film 503 is improved. Next, a nickel acetate solution containing nickel at a weight of TO ppm is applied over the surface of the amorphous silicon film 503 by a spinner.

Next, the amorphous silicon film 503 is heated in a furnace, thereby forming the crystalline silicon film 504. In order to crystallize the amorphous silicon film 503, for example, heat treatment at 500° C. for 1 hour is formed and successively, heat treatment at 550° C. for 4 hours is formed. With the catalytic role of nickel, the crystalline silicon film 504 can be formed at a low temperature for a short-period of time. Further, with the catalytic role of nickel, the crystalline silicon film 504 can be formed so as to have less uncoupled bonds in crystal grain boundaries. As the metal element for promoting crystallization of silicon, as well as Ni, the following can be used: Fe, Co, Ru, Rh, Pd, Os, Ir, Pt, or the like.

As examples of the method for introducing such a metal element into the amorphous silicon film 503, there are a method in which a film containing the metal element as a main component is formed on the surface of the amorphous silicon film 503, a method in which the metal element is added into the amorphous silicon film 503 by a plasma doping method or the like, and the like, in addition to the method in which a solution of the metal element is applied.

Next, the crystalline silicon film 504 is irradiated with laser light in order to repair crystal defects of the crystalline silicon film 504 and improve the crystallinity of the crystalline silicon film 504. A beam with a wavelength of 400 nm or less is preferably used as the laser light. As such laser light for example, XeCl excimer laser light (XeCl: wavelength of 308 nm), second or third harmonic of a YAG laser, and the like can be given. Before the laser light irradiation, it is preferably to remove an oxide film formed on the surface of the crystalline silicon film 504 by dilute hydrofluoric acid or the like.

In this embodiment, treatment for gettering of nickel introduced for crystallization from the crystalline silicon film 504 is performed. The reason why the gettering treatment is performed is because high concentration of nickel, which is useful for the crystallization of the amorphous silicon film 503, existing in the crystalline silicon film 504 may decrease the electrical characteristics of the transistors 407 and 408, e.g., the high concentration of nickel in the crystalline silicon film 504 may increase the leak current of the transistors 407 and 408. An example of the gettering treatment will be described below.

First, the surface of the crystalline silicon film 504 is subjected to ozone water for about 120 seconds so that an oxide film with a thickness of about 1 to 10 nm is formed on the surface of the crystalline silicon film 504. Instead of the surface treatment with ozone water, UV light irradiation may be performed as well. Next, an amorphous silicon film containing Ar is formed with a thickness of about 10 to 400 nm over the surface of the crystalline silicon film 504 with the oxide film interposed therebetween. It is preferable that the Ar concentration in this amorphous silicon film is greater than or equal to $1\times10^{18}$ atoms/cm$^3$ and less than or equal to $1\times10^{22}$ atoms/cm$^3$. Instead of Ar, another Group 18 element of the periodic table may be added into the amorphous silicon film as well.

The addition of the Group 18 element of the periodic table into the amorphous silicon film is performed with the purpose of distorting the amorphous silicon film to form gettering sites in the amorphous silicon film. There are two causes of the distortion by the addition of the Group 18 element. One is the formation of dangling bonds in crystals by the addition of the Group 18 element, and the other is the addition of the Group 18 element between crystal lattices.

For example, in the case of forming the amorphous silicon film containing Ar (hereinafter referred to as an "Ar:a-Si film") by a PECVD method, SiH$_4$, H$_2$, and Ar may be used as source gases. It is preferable that the flow ratio of SiH$_4$ to Ar, SiH$_4$/Ar, is preferably greater than or equal to 1/999 and less than or equal to 1/9. Further, the process temperature is preferably 300 to 500° C. RF power density for excitation of the source gases is preferably greater than or equal to 0.0017 W/cm$^2$ and less than or equal to 0.48 W/cm$^2$. Process pressure is preferably greater than or equal to 1.333 Pa and less than or equal to 66.65 Pa.

For example, in the case of forming the Ar:a-Si film by a sputtering method, single crystal silicon may be used as a target and Ar may be used as a gas for sputtering. By glow discharge of the Ar gas and sputtering of the single-crystal-silicon target with Ar ions, the amorphous silicon film containing Ar can be formed. The Ar concentration in the amorphous silicon film can be controlled by power, pressure, temperature, or the like for the grow discharge. Process pressure is preferably greater than or equal to 0.1 Pa and less than or equal to 5 Pa. As the pressure is decreased, the Ar concentration in the amorphous silicon film can be increased; the pressure is preferably less than or equal to 1.5 Pa. It is not necessary to heat the glass substrate 500 during the film deposition of the Ar:a-Si film; the process temperature is preferably lower than or equal to 300° C.

After the formation of the Ar:a-Si film, gettering is performed by heat treatment at 650° C. for 3 minutes in a furnace. By this heat treatment, Ni contained in the crystalline silicon film 504 is separated out in the Ar:a-Si film and captured. Accordingly, the Ni concentration in the crystalline silicon film 504 can be decreased. After the heat treatment is completed, the Ar:a-Si film is removed by etching treatment. In this etching treatment, the oxide film functions as an etching stopper. After the removal of the Ar:a-Si film, the oxide film on the surface of the crystalline silicon film 504 is removed by dilute fluorine acid or the like. Through the above, the crystalline silicon film 504 in which the Ni concentration decreased is formed.

Next, an acceptor element is added into the crystalline silicon film 504. This is because the threshold voltages of the transistors 407 and 408 are controlled. For example, boron is used as the acceptor element and added into the crystalline silicon film 504 such that boron is contained at a concentration of $1\times10^{16}$ to $5\times10^{17}$ atoms/cm$^3$.

Figure 14C:
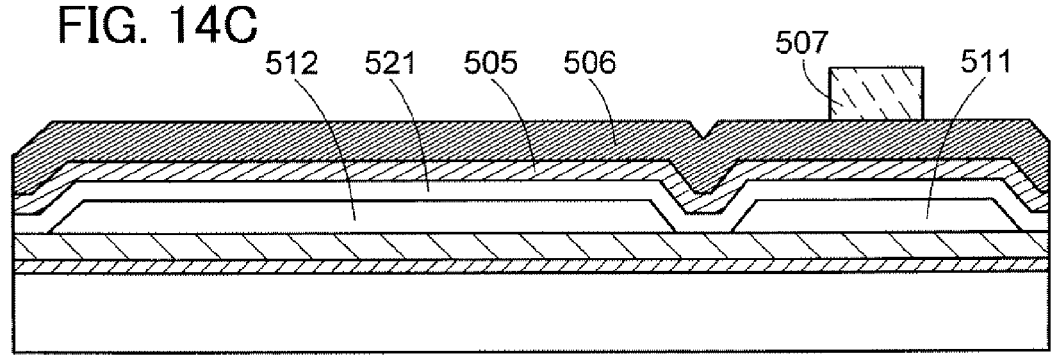
Figure 20A:
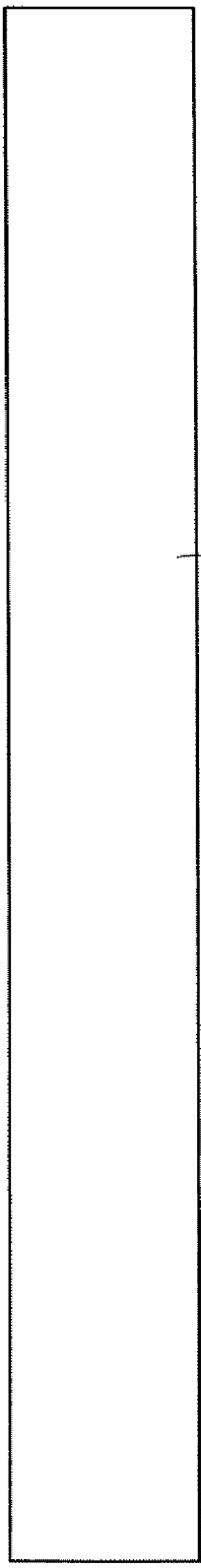
FIG. 20A is a plan view illustrating the planar shape of a semiconductor film included in a diode.

Next, a resist mask is formed over the crystalline silicon film 504, with which the crystalline silicon film 504 is etched to form a semiconductor film 511 which is included in the transistors 407 and 408 and a semiconductor film 512 which is included in the diode 405 as shown in FIG. 14C. FIG. 20A is a plan view of the semiconductor film 512 and FIG. 20B is a plan view of the semiconductor film 511.

Figure 20B:
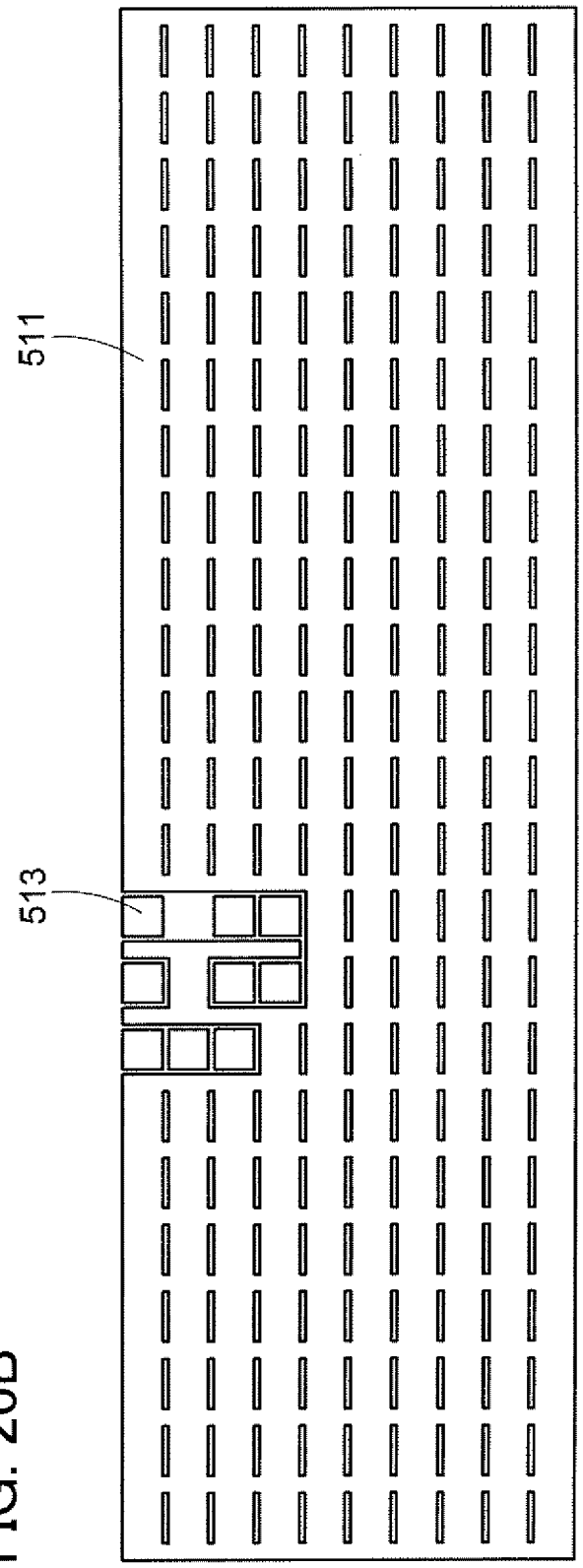
FIG. 20B is a plan view illustrating the planar shape of a semiconductor film included in an amplifier circuit. (Embodiment 4)

As shown in FIG. 20B, in the amplifier circuit 403, a plurality of semiconductor films 513 is formed in addition to the semiconductor film 511. These semiconductor films 513 are dummy semiconductor films and are not included in the transistors 407 and 408. The semiconductor films 513 enable, for example, a conductive film above the semiconductor film 511 to be formed with a uniform thickness and the conductive film to be etched uniformly.

In this embodiment, the semiconductor films 511 to 513 are formed of silicon films; and alternatively, semiconductor films made from another Group 14 element of the periodic table such as germanium, silicon germanium, or silicon carbide may be used. Further alternatively, compound semiconductor films made from GaAs, InP, SiC, Znse, GaN, SiGe, or the like or oxide semiconductor films made from zinc oxide, tin oxide, or the like may be used.

Next, as shown in FIG. 14C, a gate insulating film is formed over the semiconductor films 511 to 513. In this embodiment, a 30-nm-thick silicon oxynitride film 521 is formed as the gate insulating film. This silicon oxynitride film 521 is formed by a PECVD method using SiH$_4$ and N$_2$O as source gases.

Then, as a conductive film which forms a conductive film 520, a conductive film having a two-layer structure of a 30-nm-thick tantalum nitride film 505 and a 170-nm-thick tungsten film 506 is formed over the gate insulating film. The tantalum nitride film 505 and the tungsten film 506 are formed by a sputtering method. Instead of the stack-layer structure of the tantalum nitride film 505 and the tungsten film 506, for example, a stack-layer film of a tungsten nitride film and a tungsten film or a stack-layer film of a molybdenum nitride film and a molybdenum film may be formed as well. In this embodiment, a source region, a drain region, and a low-concentration impurity region are formed in the semiconductor film 511 in a self-aligned manner using the conductive film 520, and therefore, the size of the upper-layer conductive film is made smaller than the size of the lower-layer conductive film when seen from the top surface. Therefore, it is preferable that the selectivity ratio of the lower-layer conductive film with respect to the upper-layer conductive film is small. In this point, the stack-layer film of the tantalum nitride film 505 and the tungsten film 506 is preferable.

Figure 14D:
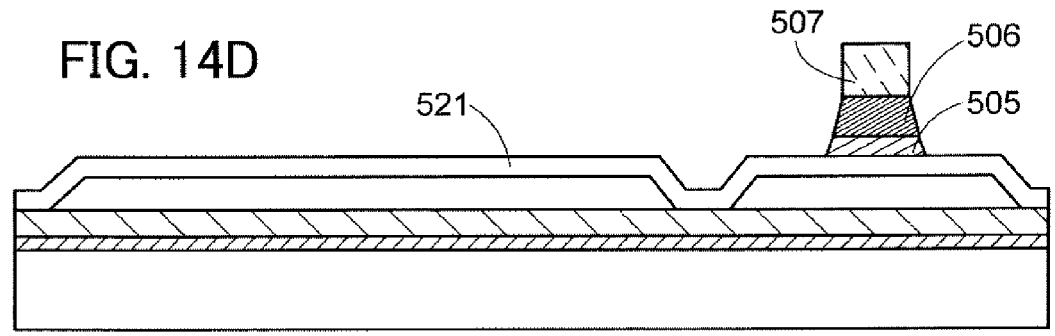

Next, a resist mask 507 is formed over the tungsten film 506. Etching treatment is performed two times using this resist mask 507. First, as shown in FIG. 14D, the tantalum nitride film 505 and the tungsten film 506 are etched using the resist mask 507. This first etching processes the shape of the cross section of the stack-layer film including the tantalum nitride film 505 and the tungsten film 506 into a tapered shape. This etching treatment can be performed, for example, using a mixed gas of CF$_4$, Cl$_2$, and O$_2$ as a gas for etching with an ICP (inductively coupled plasma) etching apparatus.

Figure 14E:
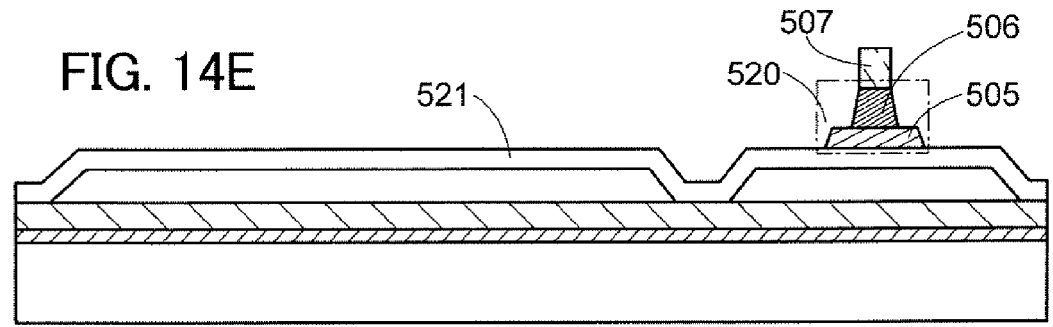
Figure 21:
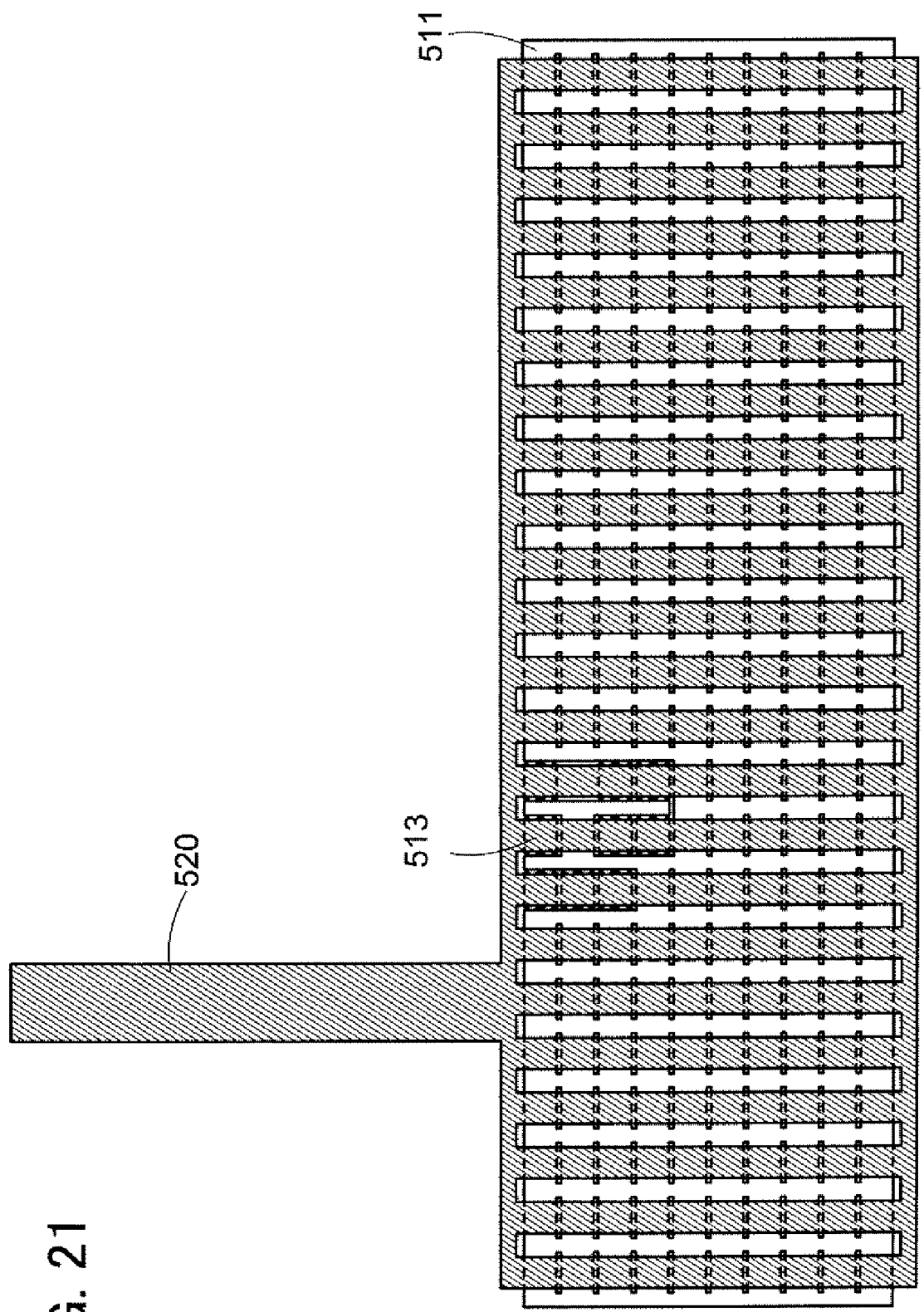
FIG. 21 is a plan view illustrating the planar shape of a first-layer conductive film included in the photo detector of FIGS. 12 and 13. (Embodiment 4)

Furthermore, using the resist mask 507, the upper-layer tungsten film 506 is selectively etched as shown in FIG. 14E. This etching treatment is an anisotropic etching, and can be performed, for example, using a mixed gas of Cl$_2$, SF$_4$, and O$_2$ as a gas for etching with an ICP etching apparatus. By these two etching treatments, the first-layer conductive film 520 is formed. In the conductive film 520, the end portion of the tungsten film 506 is over the tantalum nitride film 505, and the shape of the tungsten film 506 is smaller than that of the tantalum nitride film 505 when seen from the top surface. FIG. 21 is a plan view of the conductive film 520. Note that in FIG. 21, the semiconductor films 511 and 513 are also shown.

Then, the resist mask 507 is removed, and a resist mask 508 is formed to cover a high-resistant region and a p-type impurity region of the semiconductor film 512. Next, a donor element is added into the semiconductor films 511 and 512 to form n-type impurity regions. In this embodiment, phosphorus is added as the donor element. First, in order to form an n-type low-concentration impurity region in the semiconductor film 511, phosphorus is added into the semiconductor films 511 and 512 under the condition in which the dosage is small and the acceleration voltage is high. As a source gas for phosphorus, $PH_3$ can be used. Under this condition, only the stack-layer portion of the tantalum nitride film 505 and the tungsten film 506 in the conductive film 520 functions as a mask, so that phosphorus passes through the portion of only the tantalum nitride film 505 in the conductive film 520 to form low-concentration impurity regions 560 and 561 in the semiconductor film 511. In addition, a low-concentration impurity region 562 is formed in the semiconductor film 512.

Figure 15A:
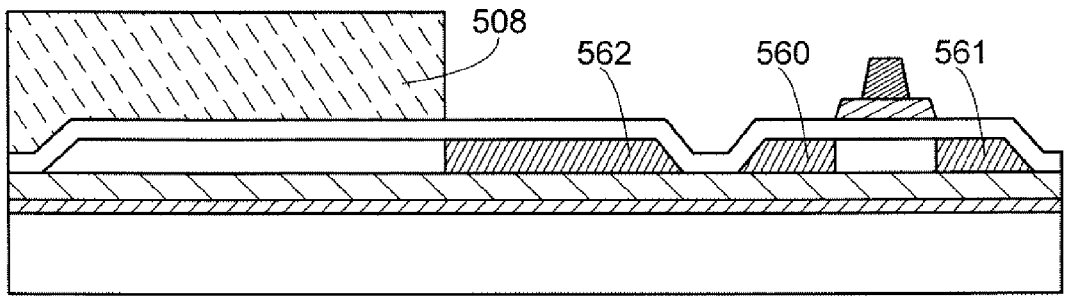
FIGS. 15A to 15D are cross-sectional diagrams illustrating the one mode of the method for manufacturing the transistor and the diodes which follow the step of FIG. 14E. (Embodiment 4)
Figure 15B:
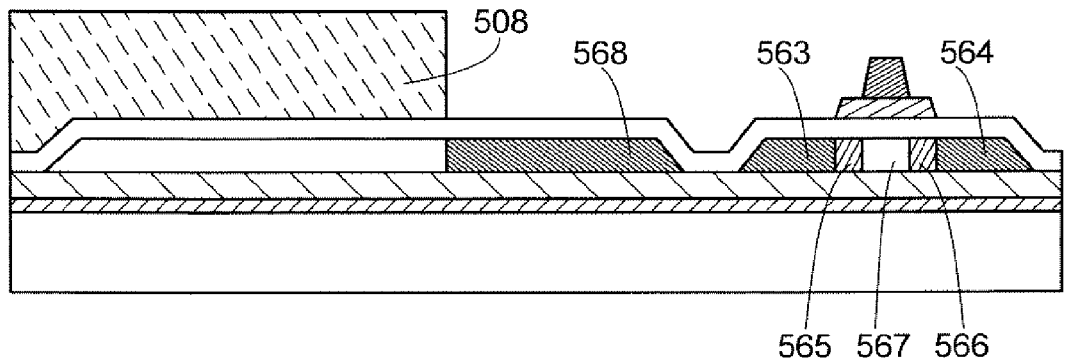

Next, in order to form a source region and a drain region, phosphorus is added under the condition in which the dosage is large and the acceleration voltage is low. Under this condition, the conductive film 520 entirely functions as a mask, so that a drain region 563 and a source region 564 are formed in the semiconductor film 511 in a self-aligned manner as shown in FIG. 15B. In addition, low-concentration impurity regions 565 and 566 and a channel formation region 567 are formed in the semiconductor film 511 in a self-aligned manner. On the other hand, an n-type impurity region 568 is formed in the semiconductor film 512.

Figure 15C:
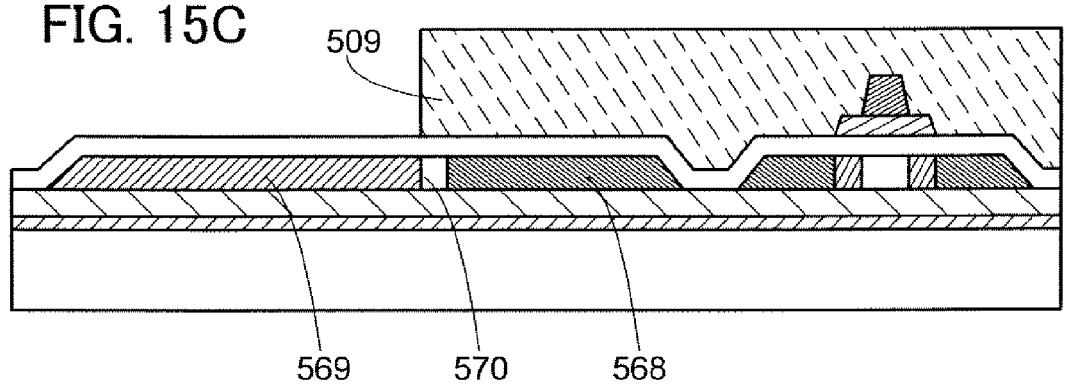

Then, the resist mask 508 is removed, and as shown in FIG. 15C, a resist mask 509 is formed to cover the semiconductor film 511 entirely and a high-resistant region and the n-type impurity region 568 in the semiconductor film 512. Next, an acceptor element is added into the semiconductor film 512 to form a p-type impurity region. In this embodiment, boron is added as the acceptor element. As a source gas for boron, $B_2H_6$ can be used. By adding boron under the condition in which the dosage is large and the acceleration voltage is low, a p-type impurity region 569 is formed in the semiconductor film 512. A region where neither the donor element nor the acceptor element is added through the process of adding impurity elements in FIGS. 15A to 15C becomes a high-resistant region 570.

Figure 15D:
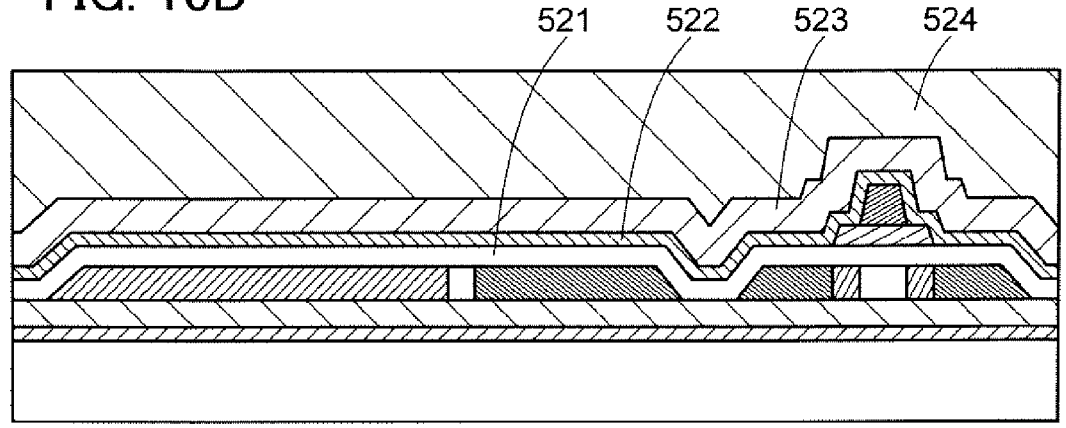

Then, the resist mask 509 is removed, the first layer of an interlayer insulating film is formed over the glass substrate 500 to cover the silicon oxynitride film 521 and the conductive film 520. In this embodiment, the interlayer insulating film has a three-layer structure. As shown in FIG. 15D, the first layer is a 30-nm-thick silicon oxynitride film 522, the second layer is a 165-nm-thick silicon nitride oxide film 523, and the third layer is a 600-nm-thick silicon oxynitride film 524. These films 522 to 524 are formed by a PECVD apparatus.

First, $SiH_4$ and $N_2O$ are used as source gases to deposit the silicon oxynitride film 522. Then, heat treatment is performed to activate phosphorus and boron added into the semiconductor films 511 and 512. After this heat treatment is completed, the silicon nitride oxide film 523 and the silicon oxynitride film 524 are formed by a PECVD apparatus. As a source gas of the silicon nitride oxide film 523, $SiH_4$, $N_2O$, $NH_3$, and $H_2$ are used so as to increase the hydrogen concentration of the silicon nitride oxide film 523. As a source gas of the silicon oxynitride film 524, $SiH_4$ and $N_2O$ are used. After the silicon oxynitride film 524 is formed, heat treatment is performed to diffuse hydrogen contained in the silicon nitride oxide film 523, so that uncoupled bonds of the semiconductor films 511 and 512 are terminated with hydrogen. This heat treatment can be performed at 300 to 550° C.

The process after the above will be described using cross-sectional diagrams of FIGS. 16A to 16C, FIGS. 17A and 17B, FIGS. 18A and 18B, and FIG. 19, and plan views of FIGS. 22A and 22B, FIG. 23, and FIG. 24. Note that the method illustrated using FIGS. 16A to 16C, FIGS. 17A and 17B, FIGS. 18A and 18B, and FIG. 19 is similar to the method illustrated in FIG. 13.

Figure 22A:
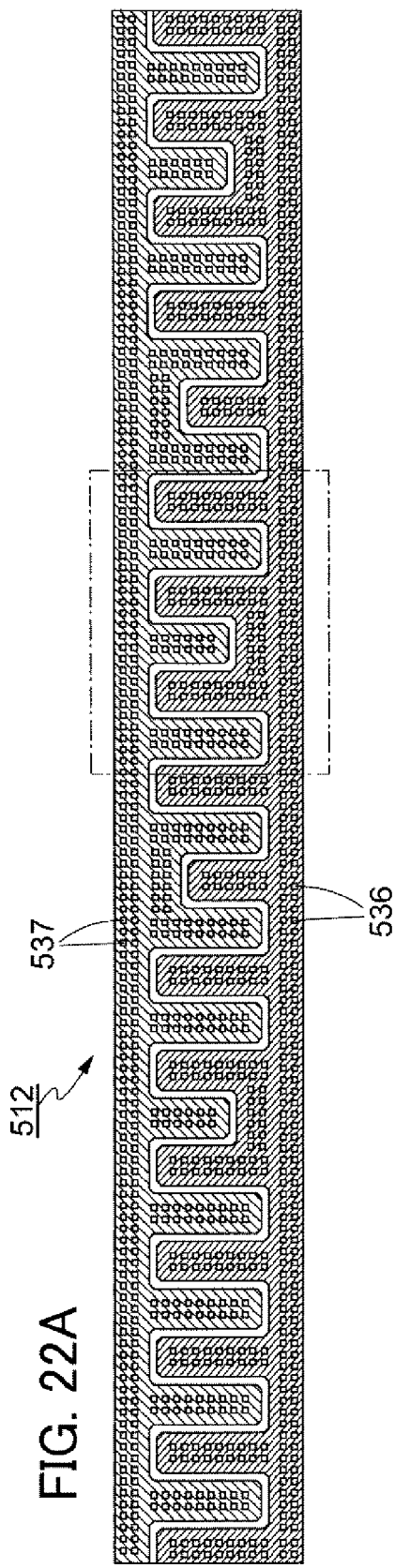
FIG. 22A is a plan view illustrating the layout of an opening which forms a connection portion between the semiconductor film and a second-layer conductive film which are included in the diode included in the photo detector of FIGS. 12 and 13.
Figure 22B:
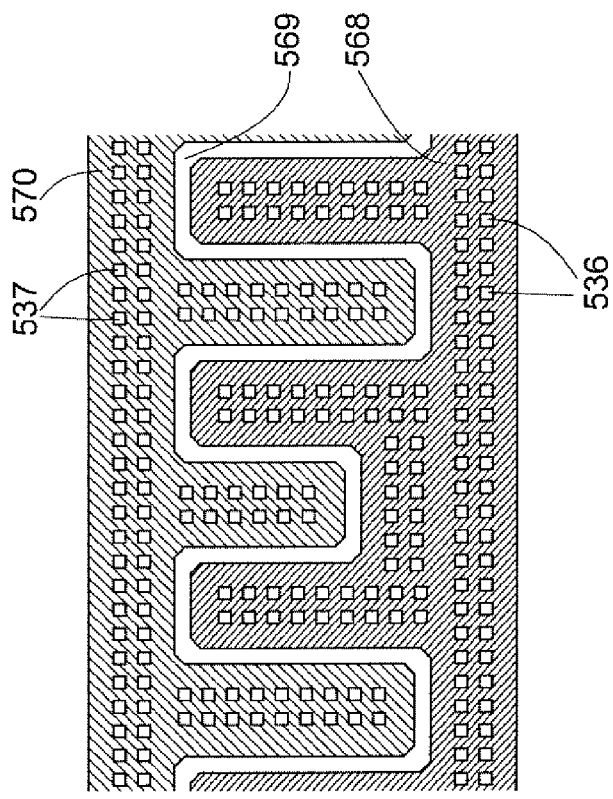
FIG. 22B is a partial expansion view of FIG. 22A. (Embodiment 4)

Using a resist mask, the stack-layer film of the silicon oxynitride film 521, the silicon oxynitride film 522, the silicon nitride oxide film 523, and the silicon oxynitride film 524 is etched so that openings which are contact holes are formed. The openings are formed in a connection portion between the conductive film 531 and the drain region 563 in the semiconductor film 511; a connection portion between the conductive film 532 and the source region 564 in the semiconductor film 511; a connection portion between the conductive film 533 and the conductive film 520; a connection portion between the conductive film 534 and the conductive film 520; a connection portion between the conductive film 531 and the n-type impurity region 568 in the semiconductor film 512; and a connection portion between the conductive film 532 and the p-type impurity region 569 in the semiconductor film 512. FIG. 22A shows the layout of, among the openings formed in the stack-layer film (521 to 524), the openings which forms the connections to the semiconductor film 512. FIG. 22B is a partial enlarged view of FIG. 22A: an enlarged view of a region surrounded by a dashed-dotted line in FIG. 22A.

As shown in FIGS. 22A and 22B, in order to electrically connect the n-type impurity region 568 to the conductive film 531, a plurality of openings 536 is formed all over the n-type impurity region 568. Similarly, in order to electrically connect the p-type impurity region 569 to the conductive film 532, a plurality of openings 537 is formed all over the p-type impurity region 569. The openings 536 and 537 formed in this manner reduces the connection resistance between the n-type impurity region 568 and the conductive film 531 and the connection resistance between the p-type impurity region 569 and the conductive film 532, whereby the diode 405 can function enough as a protection circuit when ESD is generated.

Figure 23:
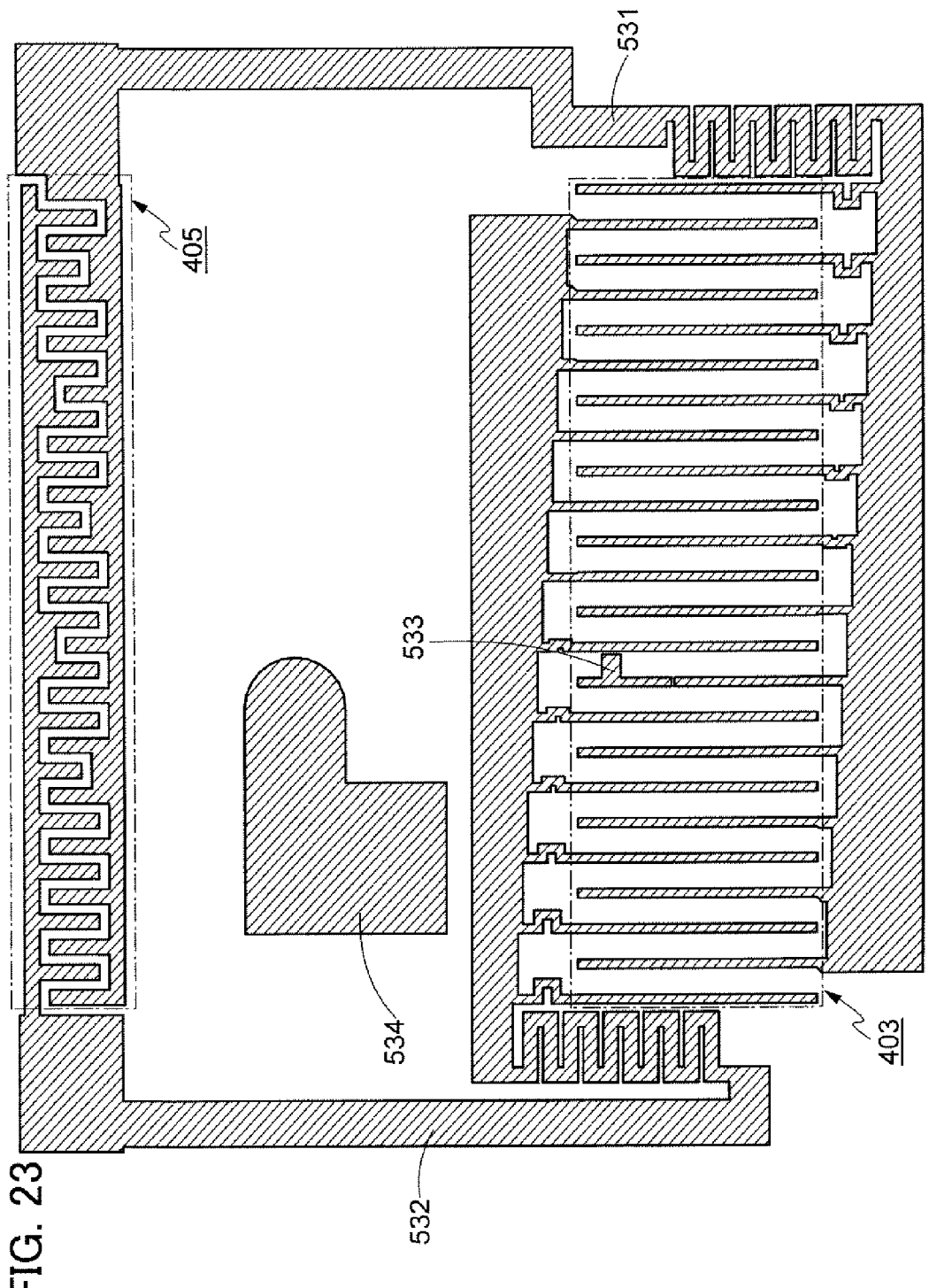
FIG. 23 is a plan view illustrating the layout of the second-layer conductive film included in the photo detector of FIGS. 12 and 13. (Embodiment 4)

Next, over the silicon oxynitride film 524, a conductive film which forms the second-layer conductive films 531 to 534 is formed. In this embodiment, a 400-nm-thick titanium film is formed by a sputtering method. A resist mask is formed over the titanium film, with which the titanium film is etched to form the conductive films 531 to 534 (see FIG. 16A). FIG. 23 is the plan view of the second-layer conductive films 531 to 534.

In this embodiment, the conductive film 211 in Embodiment 1 is applied to the conductive films 531 and 532 (see FIG. 3). The conductive film 531 forms a connection wiring for electrically connecting the amplifier circuit 403 to the power source terminal 401, and the conductive film 532 forms a connection wiring for electrically connecting the amplifier circuit 403 to the power source terminal 402. The conductive films 531 and 532 each have a plurality of connection portions between the power source terminal and the amplifier circuit 403 (the connection portions correspond to the openings formed in the films 521 to 524). In this embodiment, like the conductive film 211, the conductive film 531 is formed such that the resistances between the power source terminal 401 and a plurality of connection portions of the amplifier circuit 403 at the first stage with respect to the power source terminal 401 are equal to each other. Further, like the conductive film 531, the conductive film 532 is formed such that the resistances between the power source terminal 402 and a plurality of electrical connection portions of the amplifier circuit 403 at the first stage with respect to the power source terminal 402 are equal to each other. In this embodiment, although the amplifier circuit 403 has the plurality of electrical connection portions with respect to the power source terminals 401 and 402, the conductive films 531 and 532 that are formed in the shape shown in FIG. 23 can divide the voltage which is to be applied to the amplifier circuit 403 even when an overvoltage is applied to the power source terminal 401 and/or the power source terminal 402, so that the possibility that the amplifier circuit 403 will be broken by ESD can be suppressed.

The second-layer conductive films 531 to 534 and third-layer conductive films 551 and 552 are preferably films made from titanium, a titanium alloy, a titanium compound, molybdenum, a molybdenum alloy, or a molybdenum compound. This is because a film made from such a conductive material has advantages in that, for example, the heat resistance is high, the possibility of generating electrochemical corrosion due to contact with a silicon film is low, and the possibility of generating migration is low.

Figures 16A, 16B, 16C:
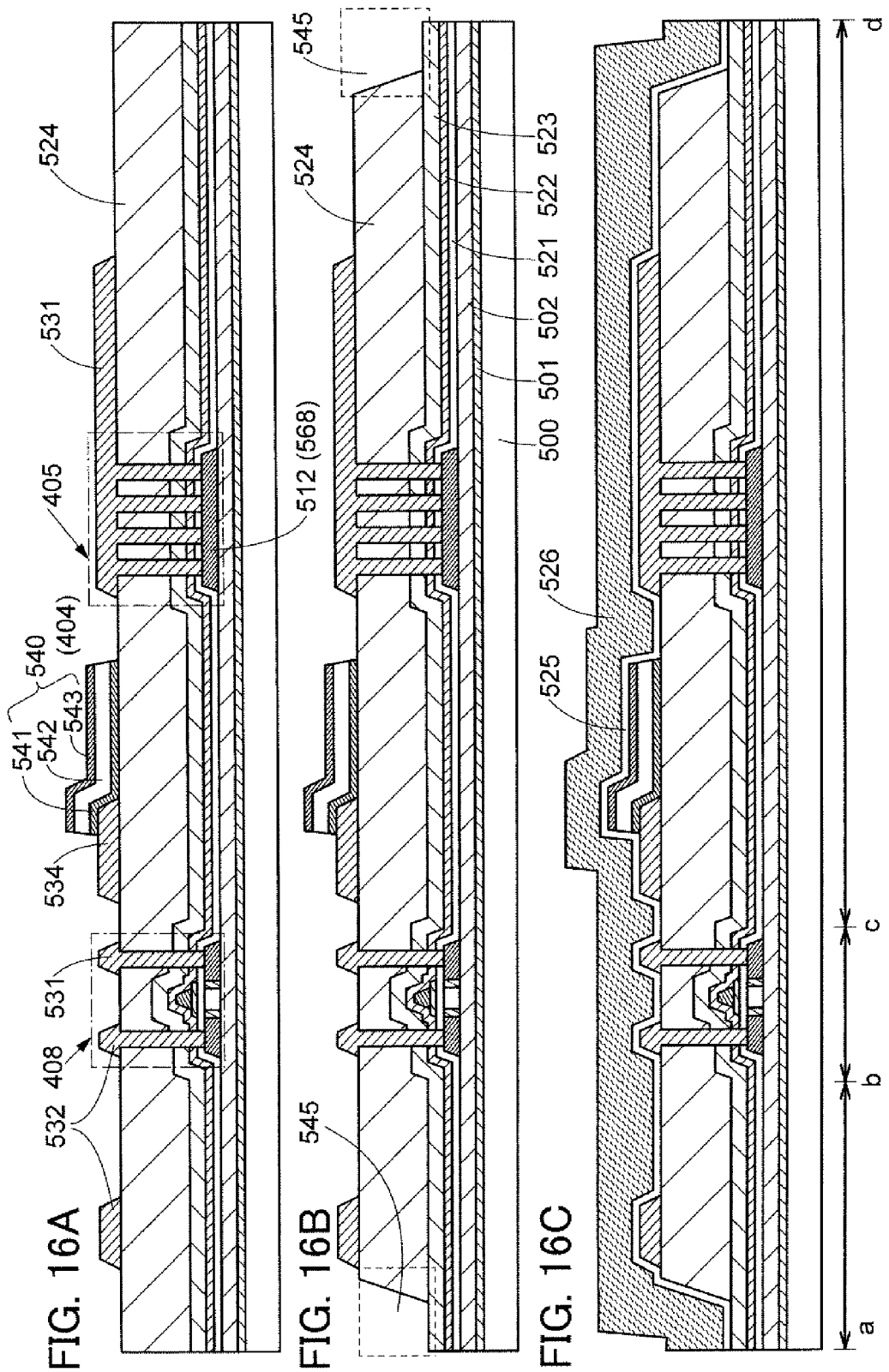
FIGS. 16A to 16C are cross-sectional diagrams which follow the step of FIG. 15D, illustrating the one mode of the method for manufacturing the photo detector of FIGS. 12 and 13. (Embodiment 4)

Next, as shown in FIG. 16A, the photoelectric conversion layer 540 which is included in the photodiode 404 is formed over the silicon oxynitride film 524. In this embodiment, as the photoelectric conversion layer 540, an amorphous silicon film is formed using a PECVD apparatus. Further, in order to provide a PIN junction for the photoelectric conversion layer 540, the photoelectric conversion layer 540 is formed to have a three-layer structure of a layer having a p-type conductivity, a layer having an i-type conductivity, and a layer having an n-type conductivity. The photoelectric conversion layer 540 is not limited to an amorphous silicon film but may be, for example, a microcrystalline silicon film or a single-crystal-silicon film.

First, a 60-nm-thick p-type amorphous silicon film 541, a 400-nm-thick i-type amorphous silicon film 542, and a 80-nm-thick n-type amorphous silicon film 543 are formed successively to cover the conductive films 531 to 534 with a PECVD apparatus. As a source gas for the p-type amorphous silicon film 541, $SiH_4$, $H_2$, and $B_2H_6$ are used to add boron. As a source gas for the i-type amorphous silicon film 542, $SiH_4$ and $H_2$ are used, so that an amorphous silicon film in which impurity elements which serve as donors or acceptors are not added is formed. As a source gas for the n-type amorphous silicon film 543, $SiH_4$, $H_2$, and $PH_3$ are used to add phosphorous. Next, the stack-layer film of the amorphous silicon films 541 to 543 is etched using a resist mask to form the photoelectric conversion layer 540 (see FIGS. 12 and 16A).

In this embodiment, a plurality of photo detectors 400 is manufactured over one glass substrate 500 at the same time. After the plurality of photo detectors 400 is manufactured over one glass substrate 500, the glass substrate 500 is divided in accordance with the size of each photo detector 400 to be divided into the photo detectors 400. In this embodiment, in order to sufficiently passivate the side surface of the photo detector 400 after being divided, the silicon oxynitride film 524 in a periphery 545 (indicated by a dotted line) of the photo detector 400 is removed as shown in FIG. 16B. This step can be performed by etching treatment.

Next, a second-layer interlayer insulating film is formed to cover the silicon nitride oxide film 523, the silicon oxynitride film 524, the conductive films 531 to 534, and the photoelectric conversion layer 540. In this embodiment, as shown in FIG. 16C, a two-layer insulating film of a 100-nm-thick silicon nitride oxide film 525 and a 800-nm-thick silicon oxide film 526 is formed.

The silicon nitride oxide film 525 is formed using $SiH_4$, $N_2O$, $NH_3$, and $H_2$ as source gases with a PECVD apparatus. The silicon nitride oxide film 525 functions as a passivation film. Instead of the silicon nitride oxide film 525, a silicon nitride film may be formed. The silicon nitride film can be formed using $SiH_4$, $NH_3$, and $H_2$ as source gases with a PECVD apparatus. The silicon oxide film 526 is formed using $O_2$ and tetra-ethoxy-silane (abbreviation: TEOS, chemical formula: $Si(OC_2H_5)_4$) as source gases with a PECVD apparatus. Instead of the silicon oxide film 526, a silicon oxynitride film may be formed with a PECVD apparatus.

Next, using a resist mask, the stack-layer film of the silicon nitride oxide film 525 and the silicon oxide film 526 is etched, so that the openings 581 to 585 which functions as contact holes are formed (see FIG. 12).

Next, over the silicon oxide film 526, a conductive film which forms the third-layer conductive films 551 and 552 is formed. In this embodiment, a 200-nm-thick titanium film is formed by a sputtering method. A resist mask is formed over this titanium film, with which the titanium film is etched to form the conductive films 551 and 552 (see FIGS. 12 and 17A).

Next, as shown in FIG. 17B, the insulating films (502, 521 to 526) are removed in a periphery 546 (indicated by a dotted line) of the photo detector 400 so that the silicon nitride oxide film 501 remains. This step can be performed by etching treatment. The insulating films are removed in the periphery of the photo detector 400 with the purpose of sufficiently passivating the side surface of the photo detector 400 after the glass substrate 500 is divided like the step of FIG. 16B in which removing the silicon oxynitride film 524.

Next, as shown in FIG. 18A, a 100-nm-thick silicon nitride oxide film 527 is formed. The silicon nitride oxide film 527 is formed using $SiH_4$, $N_2O$, $NH_3$, and $H_2$ as source gases with a PECVD apparatus. The silicon nitride oxide film 527 functions as a passivation film. With the silicon nitride oxide film 527, the third-layer conductive films 551 and 552 and the exposed surfaces of all of the insulating films (501, 503, 521 to 526) are covered. Accordingly, the integrated circuit portion including the amplifier circuit 403, the photodiode 404, and the diode 405 is passivated with the silicon nitride oxide film 501 which is a barrier layer on the glass substrate 500 side and with the silicon nitride oxide film 527 on the side provided for the power source terminals 401 and 402. This structure can prevent impurities such as moisture or organic substances from entering the integrated circuit portion.

Next, a sealing film 528 is formed as shown in FIG. 18B. With the sealing film 528, the top and side surfaces of the integrated circuit portion are sealed. The thickness of the sealing film 528 is preferably 1 μm or more, and is set to about 1 to 30 μm. For its large thickness, the sealing film 528 is preferably formed of a resin film. In this embodiment, a photosensitive epoxy phenolic resin film is formed by a printing method to form the sealing film 528 having an opening 586 and an opening 587 (shown in FIG. 24) in the connection portion between the integrated circuit portion and the power source terminal 401 and in the connection portion between the integrated circuit portion and the power source terminal 402.

Figure 19:
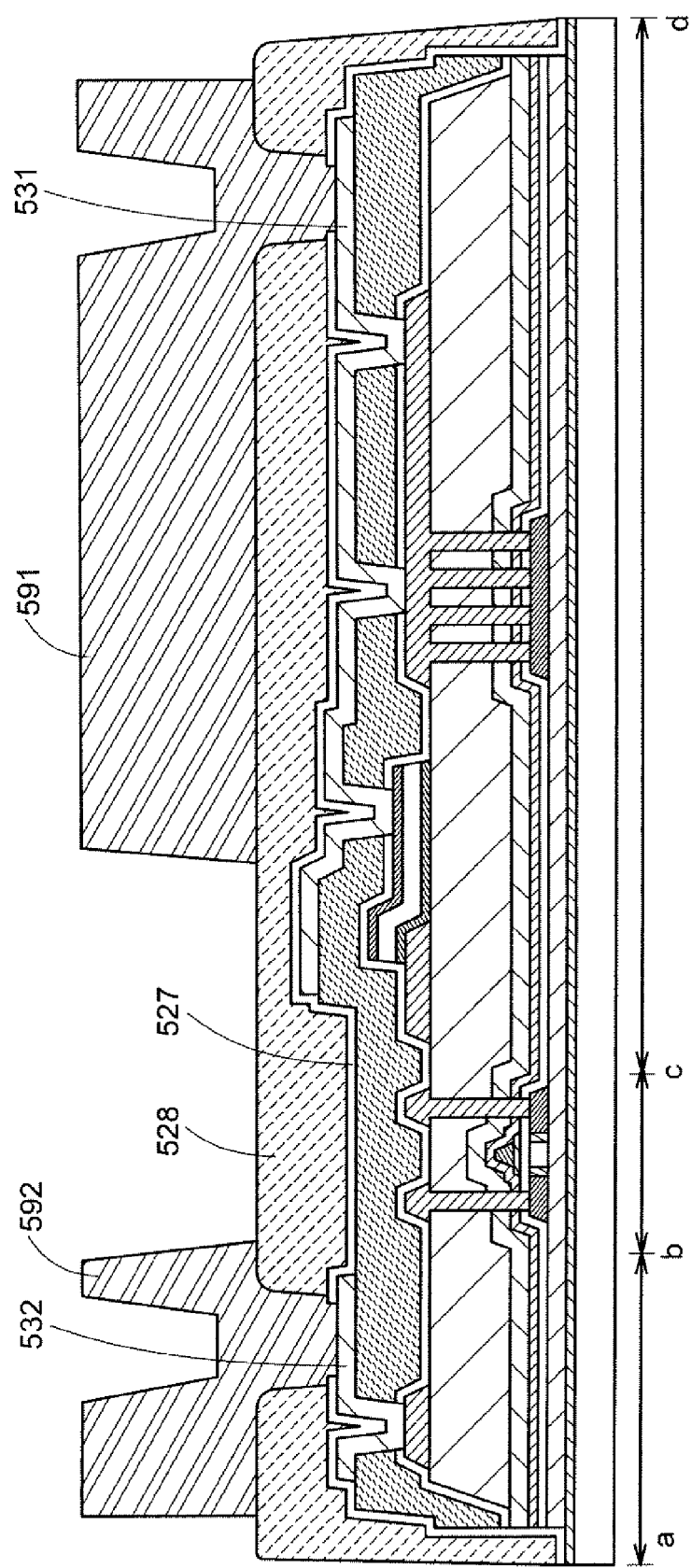
FIG. 19 is a cross-sectional diagram which follows the step of FIG. 18B, illustrating the one mode of the method for manufacturing the photo detector. (Embodiment 4)

Next, using a resist mask, the silicon nitride oxide film 527 is etched so as to be removed in the connection portion between the conductive film 551 and the power source terminal 401 and in the connection portion between the conductive film 552 and the power source terminal 402 (see FIG. 19).

Figure 24:
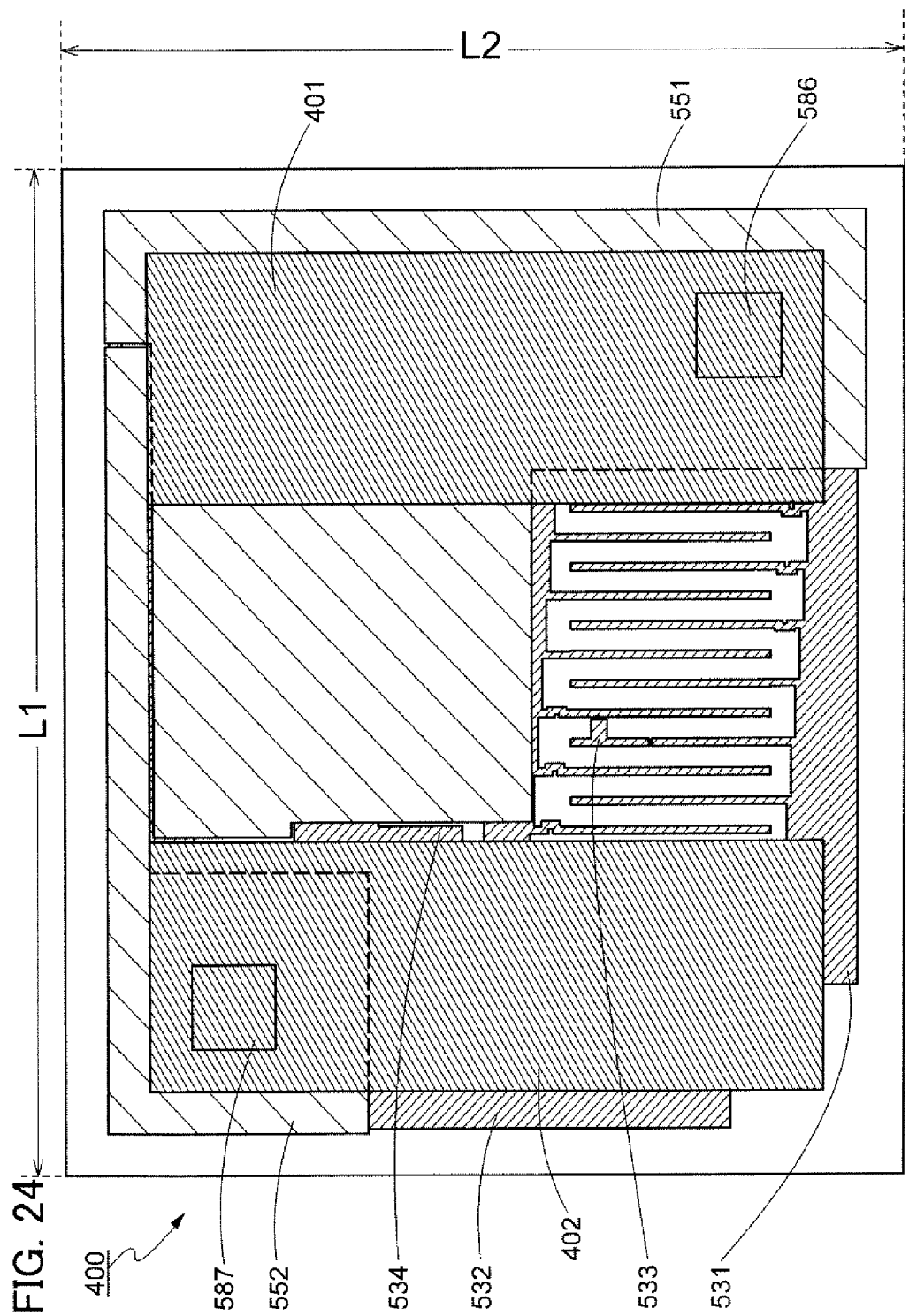
FIG. 24 is a plan view illustrating the layout of a power source terminal included in the photo detector of FIGS. 12 and 13. (Embodiment 4)

Next, the power source terminals 401 and 402 are formed over the sealing film 528. FIG. 24 is a plan view of the power source terminals 401 and 402. In FIG. 24, the third-layer conductive films 551 and 552 and the openings 586 and 587 formed in the sealing film 528 so as to function as the connection portions between the conductive film 551 and the power source terminal 401 and between the conductive film 552 and the power source terminal 402 are also shown.

In this embodiment, each of the power source terminals 401 and 402 is formed using a four-layer conductive film. First, as shown in FIG. 19, first-layer conductive films 591 and 592 are formed by a printing method such as a screen-printing method. In this embodiment, the conductive films 591 and 592 are formed each with a thickness of about 15 μm by a screen-printing method using a conductive paste containing nickel particles.

The conductive paste is a material in which metal particles or a metal powder are/is dispersed into a binder made from a resin. Such a conductive paste is solidified to form a conductive resin film. Therefore, the conductive films 591 and 592, which are each made of a conductive resin film, is poor in the adhesiveness to a solder. Therefore, in order to improve the adhesiveness to a solder, of the power source terminals 401 and 402, predetermined-shaped conductive films are formed over the conductive films 591 and 592 by a sputtering method using a metal mask. In this embodiment, as shown in FIG. 13, a three-layer conductive film is formed over each of the conductive films 591 and 592. The first layers of the conductive films are 150-nm-thick titanium films 593 and 594; the second layers of the conductive films are 750-nm-thick nickel films 595 and 596; and the third layers of the conductive films are 50-nm-thick Au films 597 and 598. Through the above, the power source terminals 401 and 402 each having the four-layer structure are completed.

Next, the glass substrate 500 is cut in the periphery 546 (indicated by the dotted line in FIG. 17B) of the photo detector 400, so that the photo detectors 400 are separated from each other. The glass substrate 500 can be cut by a dicing method, a laser-cutting method, or the like. Before the glass substrate 500 is cut, the glass substrate 500 can be thinned by polishing or grinding the back surface of the glass substrate 500; this step is preferably performed before the conductive films (593 to 598) are formed by a sputtering method. By thinning the glass substrate 500, the consumption of a cutting tool for cutting the glass substrate 500 can be suppressed. In addition, thinning of the glass substrate 500 enables the photo detector to be thin. For example, the glass substrate 500 can be thinned from about 0.5 mm to about 0.25 mm. In the case where the glass substrate 500 is thinned, it is preferable that the back and side surfaces of the glass substrate 500 are covered with a resin film so as to protect the glass substrate 500.

Figure 25:
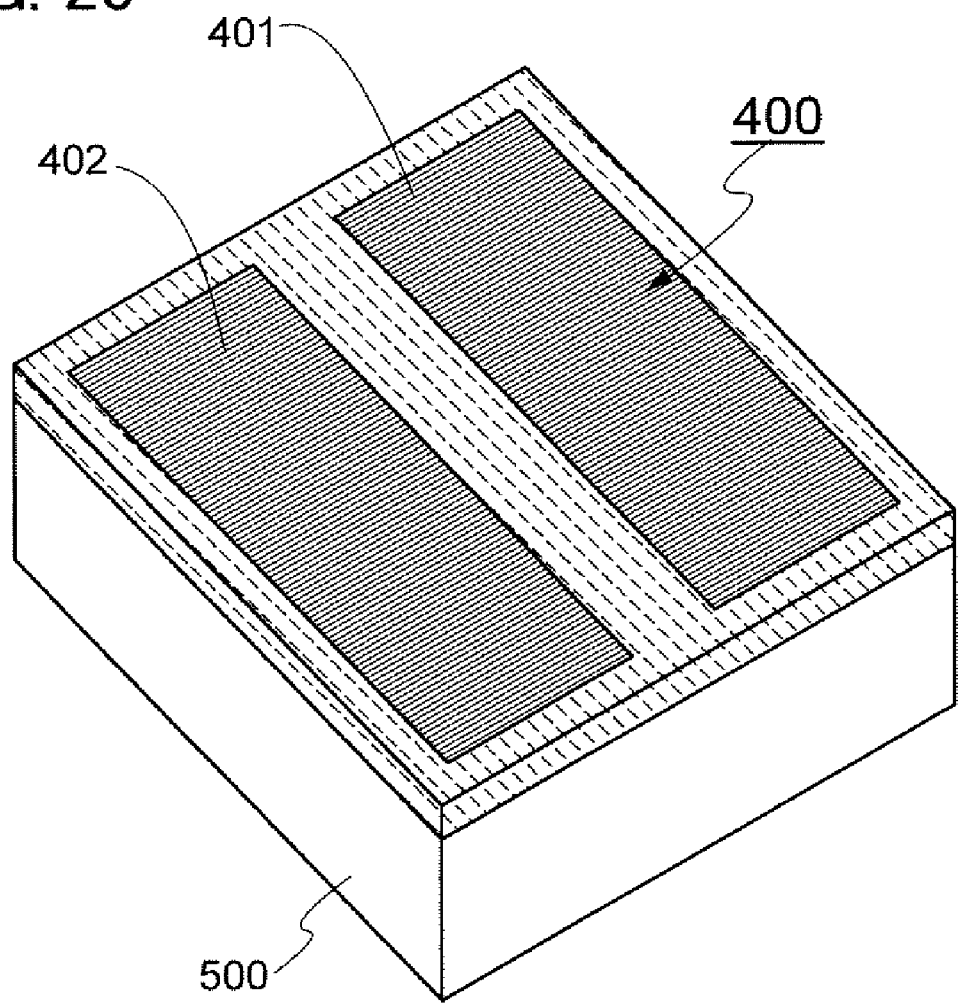
FIG. 25 is a perspective view illustrating an external appearance of the photo detector of FIGS. 12 and 13. (Embodiment 4)

FIG. 25 is an external-apparatus view of the photo detector 400 of this embodiment. In this embodiment the size of each photo detector 400 can be set to about L1×L2=1.0 mm×1.2 mm (see FIG. 24). As described above, this embodiment can be applied to small semiconductor devices with sizes of about 1 mm×1 mm.

Since the photo detector 400 of this embodiment is connected to an external circuit by the power source terminals 401 and 402 as shown in FIG. 25, a high voltage is applied to the integrated circuit portion from the power source terminals 401 and 402 when ESD is generated. As shown in the circuit diagram of FIG. 11, high power source potential VDD is input into the drain of each transistor 408 in the amplifier circuit 403; therefore, breakdown by a high voltage may occur with respect to, particularly, the transistors 408 at the first stage with respect to the power source terminal 401. In this embodiment, since the conductive film 531 is provided so as to make the wiring resistance between the power source terminal 401 and each of the transistors 408 at the first stage to be the same, a voltage which is to be applied to the transistors 408 at the first stage because of an overvoltage application due to ESD is divided, so that the possibility that the transistors 408 at the first stage will be broken can be reduced.

This embodiment can be combined with any other embodiment as appropriate. For example, as the diode 405, the diode 301 or the diode 303 in Embodiment 2 may be used. As the protection circuit, the discharge circuit 309 in Embodiment 3 may be used instead of the diode 405.

Embodiment 5

Although a glass substrate used in manufacturing a semiconductor device is used as the substrate of the semiconductor device as it is in Embodiment 4, the circuit can be separated from the glass substrate after the semiconductor elements, terminals, and the like are manufactured to be fixed onto another substrate. In this embodiment, an example of the manufacturing method of such a case will be described.

First, as shown in FIG. 26A, a 100-nm-thick silicon oxynitride film 701 is formed by a PECVD method over a glass substrate 500, and a 30-nm-thick tungsten film 702 is formed by a sputtering method over the silicon oxynitride film 701. The tungsten film 702 functions as a separation layer; it is formed in order to cause separation easily between a base insulating film (311, 312) of the integrated circuit and the glass substrate 500 by force applied. The separation layer can be formed of, as well as the tungsten film, a metal film made from molybdenum, titanium, tantalum, niobium, nickel, cobalt, zirconium, zinc, ruthenium, rhodium, palladium, osmium, iridium, or the like. Further, the separation layer can be formed of an alloy film containing such a metal element as a main component. The thickness of the separation film may be greater than or equal to 20 nm and less than or equal to 100 nm.

The silicon oxynitride film 701 is formed in order to improve the adhesiveness between the separation layer and the glass substrate 500; a silicon oxide film, a silicon nitride oxide film, a silicon nitride film, a metal oxide film, or the like may be formed by a sputtering method or a PECVD method, alternatively.

Next, in order to cause separation between the base insulating film and the tungsten film 702 earlier than in the other portion, the surface of the tungsten film 702 is oxidized. The oxidization of the tungsten film 702 is performed by the following method: thermal oxidation treatment; surface treatment by oxygen or $N_2O$ plasma; surface treatment by a strong oxidant solution such as ozone water; a method in which an oxide film is formed by a sputtering method over the tungsten film 702; or the like. The method in which an oxide film with a thickness of 200 nm is formed by a sputtering method is used in this embodiment. Instead of the oxidation of the surface of the tungsten film 702, the separation between the base insulating film and the tungsten film 702 earlier than in the other portion can also be caused by nitriding the surface of the tungsten film 702 by plasma treatment or heat treatment. In the case where a film other than the tungsten film is formed as the separation layer, oxidation treatment or nitridation treatment may be performed like the tungsten film 702.

Next, over the silicon oxide film 703, a silicon nitride oxide film 501 and a silicon oxynitride film 502 which function as the base insulating film, and an amorphous silicon film 503 are formed successively over a silicon oxide film 703, like FIG. 14A (see FIG. 26B).

The process after the above is performed in a similar manner to the manufacturing method in Embodiment 4, so that an integrated circuit and power source terminals 401 and 402 are completed. A portion denoted by reference numeral 710 in FIG. 26C includes an amplifier circuit 403 formed over the silicon oxynitride film 502, a cathode of a photodiode 404, a diode 405, and the power source terminals 401 and 402; this portion is referred to as an integrated circuit portion 710 hereinafter.

Next, as shown in FIG. 26C, a support substrate 711 is fixed over the integrated circuit portion 710. As the support substrate 711, a glass substrate, a quartz substrate, a metal substrate, a ceramic substrate, a plastic substrate, or the like can be used. The support substrate 711 is removed after the integrated circuit portion 710 is fixed onto a substrate other than the glass substrate 500. Therefore, the support substrate 711 is fixed so as to easily separate from the integrated circuit portion 710. In this embodiment, the support substrate 711 is fixed onto the integrated circuit portion 710 with the use of a two-sided adhesive sheet 713. As the two-sided adhesive sheet 713, a sheet with both of the sides covered with an adhesive capable of being separated is used. The adhesive capable of being separated is an adhesive whose adhesiveness is decreased by heat, light, or the like. The two-sided adhesive sheet 713 using the heat adhesive capable of being separated is used in this embodiment. Further, in this embodiment, in order to fix the support substrate 711 easily, a water-soluble-resin layer 712 is formed over the integrated circuit portion 710 to planarize the top surface of the integrated circuit portion 710.

Next, as shown in FIG. 27A, separation is caused between the tungsten film 702 and the silicon oxide film 703 to separate the integrated circuit portion 710 from the glass substrate 500 as shown in FIG. 27A. In this embodiment, physical force is applied to separate the integrated circuit portion 710 and the glass substrate 500 from each other. As the means for applying force, a member with a shape toe such as a wedge, a human hand, the wind pressure of a gas sprayed through a nozzle, or the like can be given. The integrated circuit portion 710 can be separated from the glass substrate 500 with such a means Next, a flexible substrate 716 is attached to the silicon oxide film 703, which is exposed by separation from the glass substrate 500, with an adhesive 715 (see FIG. 27B). As the adhesive 715, any of a variety of different kinds of curable adhesives, such as a reactive-curable adhesive, a heat-curable adhesive, a light-curable adhesive such as a UV-curable adhesive, an anaerobic-curable adhesive, or the like can be used. In this embodiment, an epoxy resin is used as the adhesive 715. Further, as the flexible substrate 716, a resin film made from polyimide, polyethylene naphthalate, polyethylene terephthalate, or the like can be used.

Figure 28:
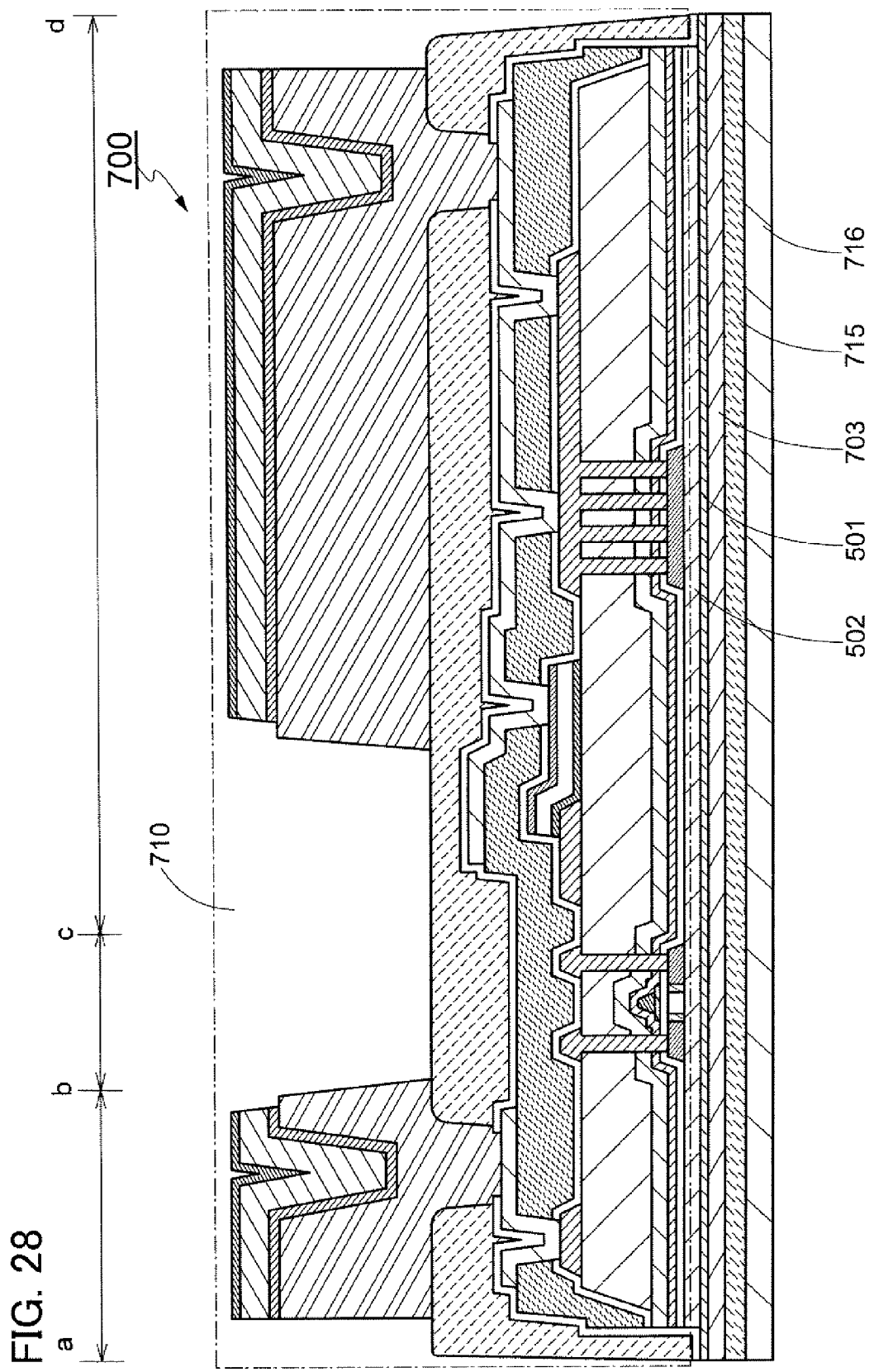
FIG. 28 is a cross-sectional diagram which follows the step of FIG. 27B, illustrating the one mode of the method for manufacturing the photo detector. (Embodiment 5)

Next, the support substrate 711 is separated from the integrated circuit portion 710. By heating, the adhesiveness of the two-sided adhesive sheet 713 is decreased, so that the support substrate 711 in addition to the two-sided adhesive sheet 713 is separated from the integrated circuit portion 710. Next, the integrated circuit portion 710 is washed by pure water, so that the water-soluble-resin layer 712 is dissolved and separated from the integrated circuit portion 710. Next, like Embodiment 6, the flexible substrate 716 is cut so that the integrated circuit portion 710 is divided for each photo detector, thereby completing a photo detector 700. The flexible substrate 716 such as a film, which is used after the glass substrate 500 used in manufacturing the integrated circuit portion 710, enables a photo detector to be light in weight and thin. Through the above process, the integrated circuit portion 710 is fixed to the flexible substrate 716 as shown in FIG. 28. The cross-sectional structure of the photo detector 700 in FIG. 28 is illustrated in a similar manner to the manner in FIG. 13.

This embodiment can be combined with any other embodiment as appropriate. This embodiment is not limited to the photo detector but also can be applied to methods for manufacturing various semiconductor devices. That is, according to this embodiment, a variety of flexible semiconductor devices can be manufactured.

Embodiment 6

An integrated circuit is manufactured using a crystalline semiconductor film formed by crystallizing an amorphous semiconductor film in Embodiment 4. Alternatively, an integrated circuit is also manufactured using a single crystal semiconductor film formed over a glass substrate. In this embodiment, the method for manufacturing a single crystal semiconductor film over a glass substrate will be described.

As shown in FIG. 29A, a glass substrate 800 is prepared. The glass substrate 800 is a support substrate which supports a single crystal semiconductor layer divided from a single crystal semiconductor substrate. It is preferable to use, as the glass substrate 800, a glass substrate having a coefficient of thermal expansion greater than or equal to $25 \times 10^{-7}/°$ C. and less than or equal to $50 \times 10^{-7}/°$ C. (preferably, greater than or equal to $30 \times 10^{-7}/°$ C. and less than or equal to $40 \times 10^{-7}/°$ C.) and a strain point higher than or equal to 580° C. and lower than or equal to 680° C. (preferably, higher than or equal to 600° C. and lower than or equal to 680° C.). Furthermore, in order to suppress contamination of a semiconductor device, a non-alkali glass substrate is preferably used as the glass substrate. As examples of the non-alkali glass substrate, there are an aluminosilicate glass substrate, an aluminoborosilicate glass substrate, a barium borosilicate glass substrate, and the like.

Instead of the glass substrate 800, an insulating substrate made from an insulator, such as a ceramic substrate, a quartz substrate, or a sapphire substrate; a conductive substrate made from a conductive substance such as metal or stainless steel; a semiconductor substrate made from a semiconductor such as silicon or gallium arsenide; or the like can be used.

As shown in FIG. 29B, a single crystal semiconductor substrate 801 is prepared. A semiconductor layer separated from the single crystal semiconductor substrate 801 is attached to the glass substrate 800, so that an SOI substrate is manufactured. As the single crystal semiconductor substrate 801, for example, a single crystal semiconductor substrate formed from a Group 14 element of the periodic table, such as silicon, germanium, silicon germanium, or silicon carbide can be used. In this embodiment, the glass substrate 800 is larger in size than the single crystal semiconductor substrate 801.

As shown in FIG. 29C, an insulating film 802 is formed over the single crystal semiconductor substrate 801. The insulating film 802 can have either a single-layer structure or a stack-layer structure. The thickness of the insulating film 802 can be set to be greater than or equal to 5 nm and less than or equal to 400 nm. As a film included in the insulating film 802, a film made from an insulator containing silicon or germanium as its component, such as silicon oxide, silicon nitride, silicon oxynitride, silicon nitride oxide, germanium oxide, germanium nitride, germanium oxynitride, or germanium nitride oxide can be used. Alternatively, an insulating film made from metal oxide such as aluminum oxide, tantalum oxide, or hafnium oxide: an insulating film made from metal nitride such as aluminum nitride; an insulating film made from metal oxynitride such as aluminum oxynitride; or an insulating film made from metal nitride oxide such as aluminum nitride oxide can be used. The insulating film included in the insulating film 802 can be formed by a CVD method, a sputtering method, or a method in which the single crystal semiconductor substrate 801 is, for example, oxidized or nitrided.

Further, it is preferable that at least one layer that is capable of preventing impurities from diffusing from the glass substrate 800 into the single crystal semiconductor film is provided in the insulating film 802. As such a film, a silicon nitride film, a silicon nitride oxide film, an aluminum nitride film, an aluminum nitride oxide film, or the like can be given. By provision of such a film, the insulating film 802 can function as a barrier layer.

For example, in the case of forming the insulating film 802 as a barrier layer with a single-layer structure, a silicon nitride film, a silicon nitride oxide film, an aluminum nitride film, or an aluminum nitride oxide film with a thickness greater than or equal to 5 nm and less than or equal to 200 nm can be formed as the insulating film 802.

In the case of forming the insulating film 802 as a barrier layer with a two-layer structure, the upper layer is an insulating film with a high barrier property. As such an insulating film, a silicon nitride film, a silicon nitride oxide film, an aluminum nitride film, or an aluminum nitride oxide film with a thickness greater than or equal to 5 nm and less than or equal to 200 nm can be formed. These films have a high blocking effect for preventing impurity diffusion, but their internal stress is also high. Therefore, it is preferable that a film that is capable of alleviating stress of the upper layer of the insulating film is selected as the lower layer of the insulating film which is in contact with the single crystal semiconductor substrate 801. As such an insulating film, there are a silicon oxide film, a silicon oxynitride film, a thermal oxide film formed by thermal oxidation of the single crystal semiconductor substrate 801, and the like. The thickness of such an insulating film can be set to be greater than or equal to 5 nm and less than or equal to 300 nm.

In this embodiment, the insulating film 802 has a two-layer structure including an insulating film 802a and an insulating film 802b. A 100-nm-thick silicon oxynitride film is formed as the insulating film 802a by a PECVD method using $SiH_4$ and $N_2O$ as source gases, and a 50-nm-thick silicon nitride oxide film is formed as the insulating film 802b by a PECVD method using $SiH_4$, $N_2O$, and $NH_3$ as source gases.

Next, as shown in FIG. 29D, the single crystal semiconductor substrate 801 is irradiated with an ion beam 805 including ions accelerated by an electric field, through the insulating film 802, thereby forming a fragile layer 803 at a predetermined depth from the surface of the single crystal semiconductor substrate 801. This ion irradiation step is a step in which the single crystal semiconductor substrate 801 is irradiated with the ion beam 805 made of an accelerated ion species, to add an element included in the ion species into the single crystal semiconductor substrate 801. By irradiating the single crystal semiconductor substrates 801 with the ion beam 805, a layer in which the crystal structure is fragile is formed at a predetermined depth in the single crystal semiconductor substrate 801 by impact of the accelerated ion species. This layer is the fragile layer 803. The depth at which the fragile layer 803 is formed can be adjusted by the acceleration energy of the ion beam 805 and the angle at which the ion beam 805 enters. The acceleration energy can be adjusted by an acceleration voltage, dosage, or the like. The fragile layer 803 can be formed at the same depth or substantially the same depth as the average depth at which the ions enter. That is, the thickness of the semiconductor layer which is to be separated from the single crystal semiconductor substrate 801 is determined depending on the depth at which the ions enter. The depth where the fragile layer 803 is formed is greater than or equal to 50 nm and less than or equal to 500 nm, and preferably greater than or equal to 50 nm and less than or equal to 200 nm.

In order to irradiate the single crystal semiconductor substrate 801 with the ion beam 805, an ion doping method in which mass separation is not performed can be employed as well as an ion implantation method in which mass separation is performed.

When hydrogen ($H_2$) is used as a source gas, $H^+$, $H_2^+$, and $H_3^+$ can be produced by exciting the hydrogen gas. The proportion of ion species produced from the source gas can be changed by adjusting a plasma excitation method, pressure in an atmosphere for generating plasma, the amount of supplying the source gas, and the like. In the case of forming the fragile layer 803 by an ion doping method, it is preferable that $H_3^+$ occupy 70% or more of the total amount of $H^+$, $H_2^+$, and $H_3^+$ in the ion beam 805, and it is more preferable that $H_3^+$ occupy 80% or more. This is because, although the acceleration voltage of ions needs to be low in order to form the fragile layer 803 at a shallow region, higher proportion of $H_3^+$ ions in plasma generated by excitation of a hydrogen gas enables atomic hydrogen to be efficiently added to the single crystal semiconductor substrate 801.

In the case of performing ion irradiation by an ion doping method with the use of the hydrogen gas, the acceleration voltage can be set to be greater than or equal to 10 kV and less than or equal to 200 kV, and the dosage is set to be greater than or equal to $1\times10^{16}$ ions/cm$^2$ and less than or equal to $6\times10^{16}$ ions/cm$^2$. By irradiation with the hydrogen ions under this condition, the fragile layer 803 can be formed in a region at a depth greater than or equal to 50 nm and less than or equal to 500 nm in the single crystal semiconductor substrate 801, through depending on the ion species included in the ion beam 805 and the proportion thereof.

For example, in the case where the single crystal semiconductor substrate 801 is a single-crystal-silicon substrate, the insulating film 802a is a 50-nm-thick silicon oxynitride film, and the insulating film 802b is a 50-nm-thick silicon nitride oxide film, a semiconductor layer with a thickness of about 120 nm can be separated from the single crystal semiconductor substrate 801 in the following condition: the source gas is hydrogen, the acceleration voltage is 40 kV, and the dosage is $2\times10^{16}$ ions/cm$^2$. Alternatively, when the irradiation with the hydrogen ions is performed under the aforementioned condition except that the insulating film 802a is a 100 nm-thick silicon oxynitride film, a semiconductor layer with a thickness of about 70 nm can be separated from the single crystal semiconductor substrate 801.

As the source gas of the ion irradiation step, as well as hydrogen, helium (He) or a halogen gas such as a chlorine gas ($Cl_2$ gas) or a fluorine gas ($F_2$ gas) may be used.

After the formation of the fragile layer 803, an insulating film 804 is formed over the insulating film 802 as shown in FIG. 29E. In the step of forming the insulating film 804, the single crystal semiconductor substrate 801 is heated at a temperature at which an element or a molecule that is added to the fragile layer 803 does not precipitate, preferably at 350° C. or lower. That is, this heat treatment is performed at a temperature at which degassing of the fragile layer 803 does not occur. Note that the insulating film 804 can be formed before the ion irradiation step; in this case, the process temperature at the time of forming the insulating film 804 can be set to be 350° C. or higher.

The insulating film 804 is a film for forming a smooth hydrophilic bonding surface on the single crystal semiconductor substrate 801. The thickness of the insulating film 804 is preferably greater than or equal to 5 nm and less than or equal to 500 nm, more preferably greater than or equal to 10 nm and less than or equal to 200 nm. As the insulating film 804, a silicon oxide film or a silicon oxynitride film can be formed. In this embodiment, a 50-nm-thick silicon oxide film is formed by a PECVD method using TEOS and $O_2$ as source gases.

Either one of the insulating films 802 and 804 is not necessarily formed. Further, an insulating film having a single-layer structure or a stack-layer structure may be formed over the glass substrate 800. This insulating film can be formed like the insulating film 802; in the case of a stack-layer structure, an insulating film which functions as a barrier layer is preferably formed so as to be in contact with the glass substrate 800. Further, in the case where the insulating film is formed over the glass substrate 800, the insulating film 802 and the insulating film 804 are not necessarily formed.

FIG. 29F is a cross-sectional view illustrating a bonding step, which shows the state where the glass substrate 800 and the single crystal semiconductor substrate 801 are attached to each other. For the bonding step, first, ultrasonic cleaning is performed on the glass substrate 800 and the single crystal semiconductor substrate 801 provided with the insulating films 804 and 802. The ultrasonic cleaning is preferably megahertz ultrasonic cleaning (megasonic cleaning). After the megahertz ultrasonic cleaning, one or both of the glass substrate 800 and the single crystal semiconductor substrate 801 can be cleaned with ozone water. By cleaning with ozone water, organic substances can be removed and the surface can be made more hydrophilic.

After the cleaning step, the glass substrate 800 and the single crystal semiconductor substrate 801 are attached to each other with the insulating film 804 interposed therebetween. The surface of the glass substrate 800 and the surface of the insulating film 804 are firmly attached to each other, which leads to formation of a chemical bond in an interface between the glass substrate 800 and the insulating film 804, so that the glass substrate 800 and the insulating film 804 are bonded to each other. The bonding step can be performed at normal temperature without involving heat treatment, and therefore, a low-heat-resistant substrate such as the glass substrate 800 can be used as a substrate to which the single crystal semiconductor substrate 801 is to be attached.

After firmly attaching the glass substrate 800 to the single crystal semiconductor substrate 801, it is preferable to perform heat treatment in order to increase the bonding strength in the interface between the glass substrate 800 and the insulating film 804. This process temperature is a temperature at which a crack is not generated in the fragile layer 803, for example, higher than or equal to 70° C. and lower than or equal to 300° C.

Next, heat treatment at 400° C. or higher is performed to divide the single crystal semiconductor substrate 801 at the fragile layer 803, so that a single crystal semiconductor film 806 is separated from the single crystal semiconductor substrate 801. FIG. 29G illustrates a separation step of separating the single crystal semiconductor film 806 from the single crystal semiconductor substrate 801. As shown in FIG. 29G, the single crystal semiconductor film 806 is provided over the glass substrate 800 by the separation step. An element denoted by reference numeral 801A is the single crystal semiconductor substrate 801 after the single crystal semiconductor film 806 is separated.

Through the heat treatment at 400° C. or higher, hydrogen binding formed in the bonding interface between the glass substrate 800 and the insulating film 804 turns into covalent binding; therefore, the bonding strength increases. Further, as the temperature rises, the elements added in the ion irradiation step are separated out into microvoids formed in the fragile layer 803, whereby internal pressure increases. In accordance with the rise in the pressure, volume change occurs in the microvoids in the fragile layer 803 to cause a crack in the fragile layer 803, so that the single crystal semiconductor substrate 801 is divided along the fragile layer 803. Since the insulating film 804 is bonded to the glass substrate 800, the single crystal semiconductor film 806 separated from the single crystal semiconductor substrate 801 is fixed over the glass substrate 800. The temperature at the heat treatment for separating the single crystal semiconductor film 806 from the single crystal semiconductor substrate 801 is set so as not to exceed the strain point of the glass substrate 800, and can be set to be higher than or equal to 400° C. and lower than or equal to 700° C.

The separation step shown in FIG. 29G is completed, whereby an SOI substrate 810 in which the single crystal semiconductor film 806 is attached to the glass substrate 800 is manufactured. The SOI substrate 810 has a multilayer structure in which the insulating film 802, the insulating film 804, and the single crystal semiconductor film 806 are stacked in order over the glass substrate 800; the insulating film 802 and the insulating film 804 are bonded to each other. In the case where the insulating film 802 is not formed, the insulating film 804 and the single crystal semiconductor film 806 are bonded to each other in the SOI substrate 810.

The heat treatment for separating the single crystal semiconductor film 806 from the single crystal semiconductor substrate 801 can be performed successively with the same apparatus as that used in the heat treatment for increasing the bonding strength. Alternatively, the two heat treatments can be performed with different apparatuses. For example, the two heat treatments can be performed with the same apparatus as follows: first, heat treatment at 200° C. for 2 hours is performed; and next, the heat temperature is increased to 600° C., and heat treatment at 600° C. for 2 hours is performed. Then, the temperature is decreased to be equal to or less than 400° C. and about room temperature, and the single crystal semiconductor substrate 801A and the SOI substrate 810 are taken out of the furnace.

In the case where these two heat treatments are performed with different apparatuses, for example, heat treatment at 200° C. for 2 hours is performed with a furnace, and then, the glass substrate 800 and the single crystal semiconductor substrate 801, which are attached to each other, are carried out from the furnace. Then, heat treatment at a temperature higher than or equal to 600° C. and lower than or equal to 700° C. for a period longer than or equal to 1 minute and shorter than or equal to 30 minutes is performed with a lamp annealing apparatus to divide the single crystal semiconductor substrate 801 at the fragile layer 803.

As for the single crystal semiconductor film 806 in the SOI substrate 810, crystal defects are formed by the formation and separation steps of the fragile layer 803, or the like, and the smoothness of the surface of the single crystal semiconductor film 806 is damaged. Therefore, in order for reduction of the crystal defects and recovering of the smoothness, it is preferable to irradiate the single crystal semiconductor film 806 with a laser light so that the single crystal semiconductor film

806 melts and is recrystallized. Alternatively, in order to remove the damage of the surface of the single crystal semiconductor film 806 to flatten the surface, it is preferable to polish the surface of the single crystal semiconductor film 806 by a chemical mechanical polishing (CMP) apparatus or the like.

With the use of the SOI substrate 810 of this embodiment, a various kinds of semiconductor devices as described in Embodiment 4 can be manufactured.

Embodiment 7

The photo detector obtained according to Embodiment 4, provided for an electronic device can controls the operation of the electronic device based on a detection signal of the photo detector. For example, the photo detector is incorporated in an electronic device provided with a display panel, so that the brightness of the display panel can be controlled based on a detection signal of the photo detector. In this embodiment, examples of such an electronic device will be described using FIGS. 30A to 30F.

Figure 30A:
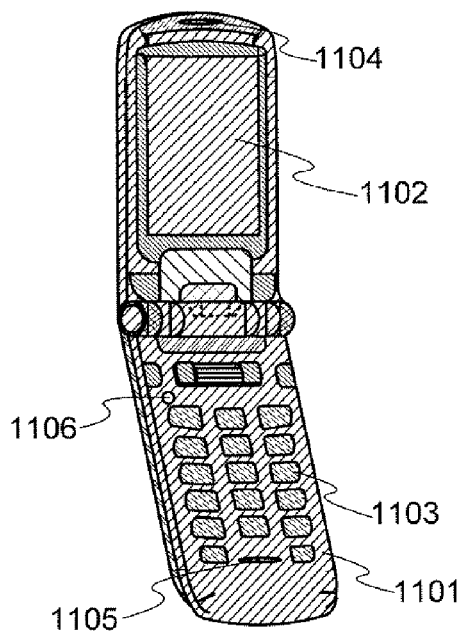
FIGS. 30A and 30B are perspective views each illustrating an external appearance of a mobile phone including a photo detector.
Figure 30B:
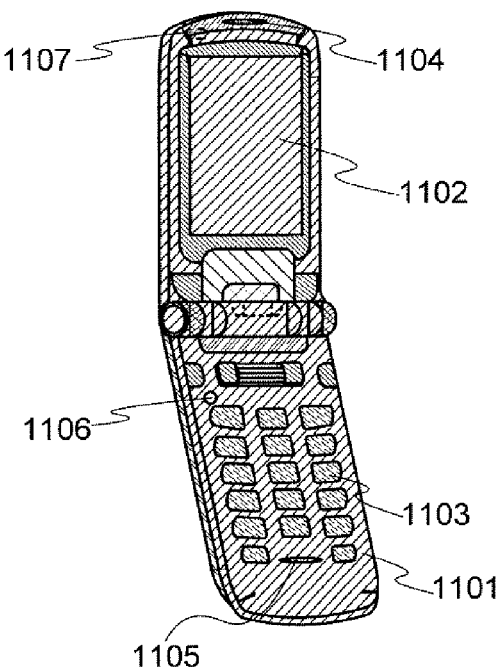

FIGS. 30A and 30B are external-appearance views of mobile phones. The mobile phones shown in FIGS. 30A and 30B each include a main body 1101, a display panel 1102, an operation key 1103, an audio output portion 1104, and an audio input portion 1105. The main body 1101 is further provided with a photo detector 1106. The mobile phones shown in FIGS. 30A and 30B each have a function of controlling the brightness of the display panel 1102 based on an electrical signal detected from the photo detector 106. In the mobile phone shown in FIG. 30B, a photo detector 1107 for detecting the brightness of a backlight of the display panel 1102 is further incorporated in the main body 1101.

Figure 30C:
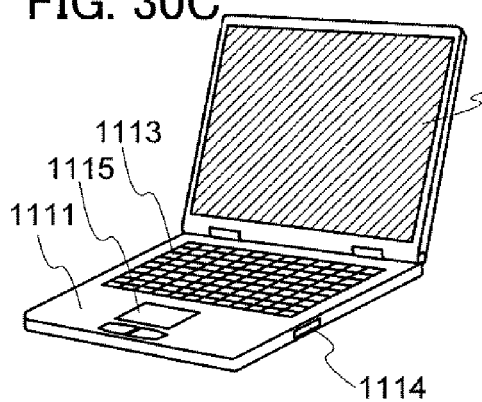
FIG. 30C is a perspective view illustrating an external appearance of a computer including a photo detector.

FIG. 30C is an external-appearance view of a computer. The computer includes a main body 1111, a display panel 1112, a keyboard 1113, an external connection port 1114, a pointing device 1115, and the like. Further, a light detector not shown for detecting the brightness of a backlight of the display panel 1112 is incorporated in the main body 1111.

Figure 30D:
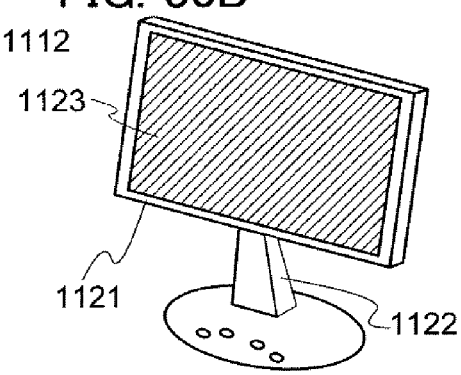
FIGS. 30E and 30F are perspective views each illustrating an external appearance of a digital camera including a photo detector. (Embodiment 7)

FIG. 30D is an external-appearance view of a display device. The display device corresponds to a TV set, a monitor of a computer, or the like. The display device includes a housing 1121, a supporting base 1122, a display panel 1123, and the like. A photo detector (not shown) for detecting the brightness of a backlight of the display panel 1123 is incorporated in the housing 1121.

Figure 30E:
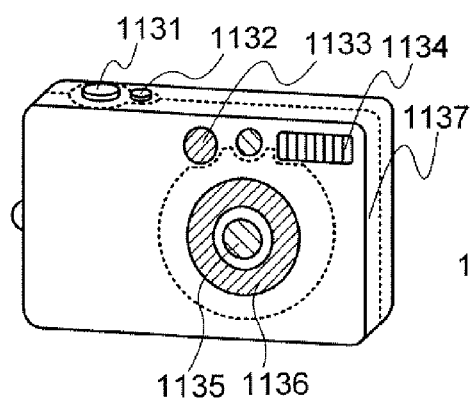
Figure 30F:
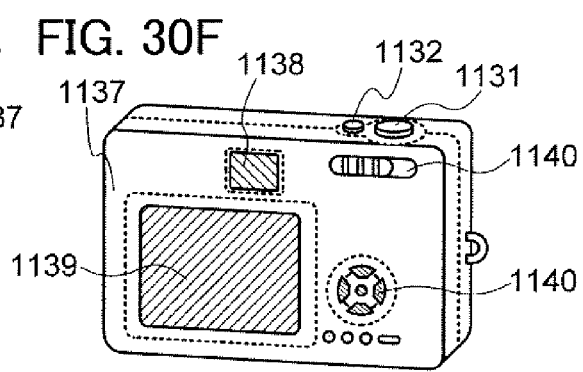

FIG. 30E is an external-appearance view of a digital camera seen from the front surface, and FIG. 30F is an external-appearance view of the digital camera seen from the rear surface. The digital camera includes a release button 1131, a main switch 1132, a finder window 1133, a flashlight 1134, a lens 1135, a camera cone 1136, a housing 1137, a finder eyepiece window 1138, a display panel 1139, an operation button 1140, and the like. The photo detector is incorporated into the digital camera, so that the brightness of the environment of the shooting can be detected. Thus, base on an electrical signal detected by the photo detector, the exposure control, the shutter-speed control, and the like can be performed.

Example 1

Description in this example will be made on that the wiring resistances being set to be equal to each other in a plurality of current paths from one power source terminal to one circuit contribute to the protection of the circuit against ESD. In this example, this will be exampled using circuit simulation and experiment of an overvoltage test (also called an electrostatic breakdown test, a static electricity test, or the like). A semiconductor device used at an electrostatic breakdown test is the photo detector of Embodiment 4.

Figure 31:
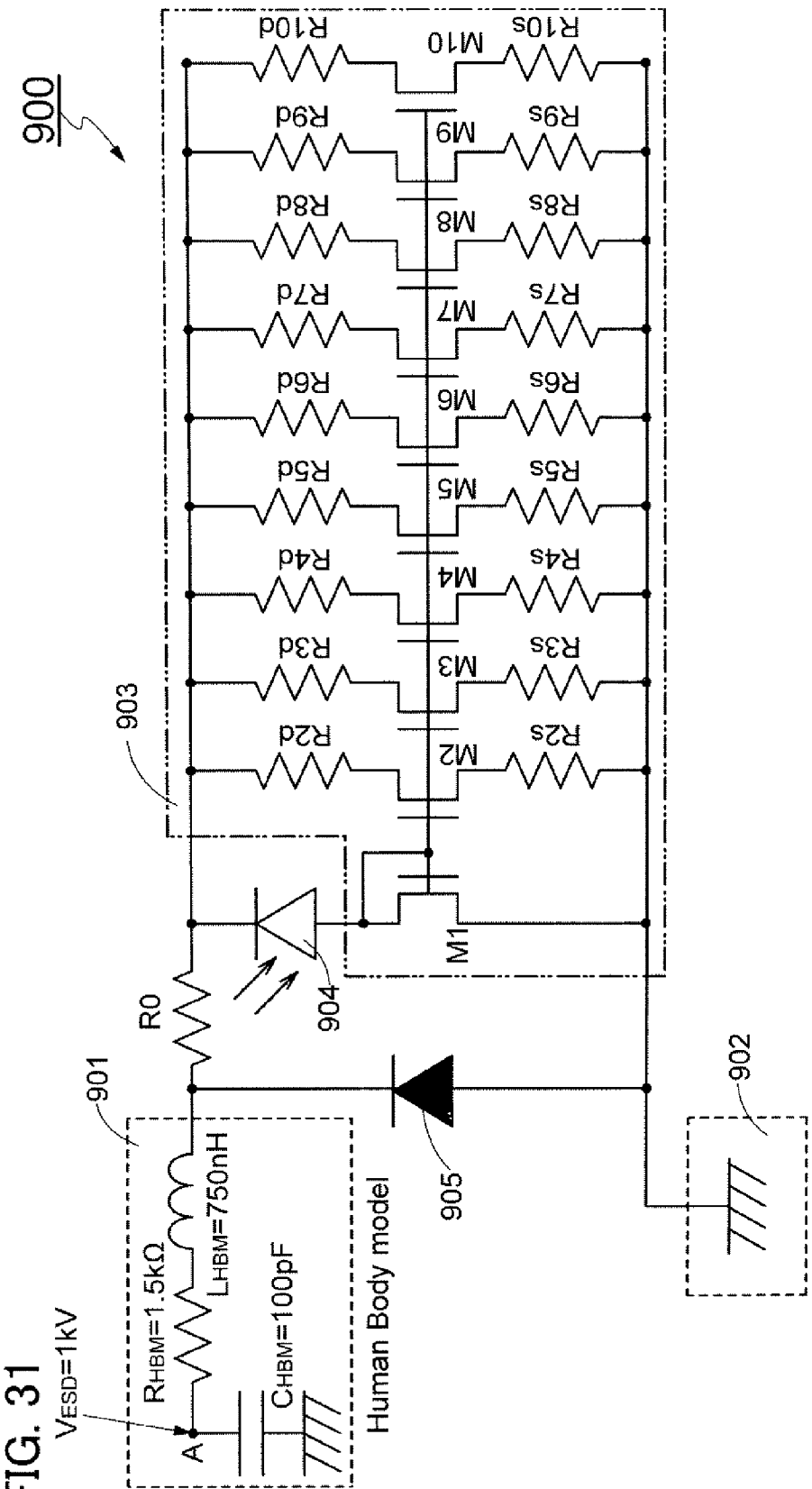
FIG. 31 is a circuit diagram of a photo detector on which circuit simulation for an overvoltage test is performed. (Example 1)

FIG. 31 is a circuit diagram of a photo detector 900 set at a simulation. The photo detector 900 includes the same elements as the elements of the photo detector 400 in FIG. 11. As shown in FIG. 31, the photo detector 900 includes a power source terminal 901 to which a high power source potential VDD is supplied, a power source terminal 902 to which a low power source potential VSS is supplied, an amplifier circuit 903, a photodiode 904, and a diode 905 included in a protection circuit. The amplifier circuit 903 is a current mirror circuit like the photo detector 400, and includes nine transistors M2 to M10 for amplifying an output current of the photodiode 904. A transistor M1 corresponds to the transistor 407 in FIG. 11 and the transistors M2 to M1 correspond to the transistors 408 in FIG. 11.

Circuit simulation of an overvoltage test was performed on the photo detector 900 in which wiring resistances (R2s to R10s) were equal to each other and wiring resistances (R2d to R10d) were equal to each other (hereinafter, the photo detector 900 is referred to as a device 900A) and the photo detector 900 in which wiring resistances (R2s to R10s) were different from each other and wiring resistances (R2d to R10d) were different from each other (hereinafter, the photo detector 900 is referred to as a device 900x). In this example, the device 900A is a semiconductor device in which the first connection wiring 110 and the second connection wiring 120 in Embodiment 1 are applied, and the device 900x is a semiconductor device of a comparative example.

As the mode of the overvoltage test, Human Body Model was employed. As shown in FIG. 31, the capacitance $C_{HBM}$ was set at 100 pF, the resistance $R_{HBM}$ was set at 1.5 kΩ, and the inductance $L_{HBM}$ was set at 750 nH. Voltage $V_{ESD}$ of 1 kV was applied to a node A of the power source terminal 901. The potential of the power source terminal 902 was set at ground potential.

Values of the wiring resistance (R2d to R10d, R2s to R10s) of the device 900A ad the device 900x were set as shown in Table 1 and Table 2. Further, both in the device 900A and the device 900x, a wiring resistance RO was set at 150Ω, and n-channel transistors having the same electrical characteristics were used as the transistors M1 to M10.

| device 900A | |
|---|---|
| Resistor | Resistance Value [Ω] |
| R2d | 100 |
| R3d | 100 |
| R4d | 100 |
| R5d | 100 |
| R6d | 100 |
| R7d | 100 |
| R8d | 100 |
| R9d | 100 |
| R10d | 100 |
| R2s | 100 |
| R3s | 100 |
| R4s | 100 |
| R5s | 100 |
| R6s | 100 |
| R7s | 100 |
| R8s | 100 |
| R9s | 100 |
| R10s | 100 |

| device 900x | |
|---|---|
| Resistor | Resistance Value [Ω] |
| R2d | 40 |
| R3d | 55 |
| R4d | 70 |
| R5d | 85 |
| R6d | 100 |
| R7d | 115 |
| R8d | 130 |
| R9d | 145 |
| R10d | 160 |
| R2s | 40 |
| R3s | 55 |
| R4s | 70 |
| R5s | 85 |
| R6s | 100 |
| R7s | 115 |
| R8s | 130 |
| R9s | 145 |
| R10s | 160 |

Under the above conditions, circuit simulation for verifying the operations of the devices 900A and 900x was performed. Specifically, the source-drain currents (hereinafter referred to as a current ID) of the transistors M2 to M10 included in the amplifier circuit 903 for 300 nanoseconds after 1 kV was applied to the power source terminal 901 were calculated. SmartSpice was used as a circuit simulator.

Figure 32A:
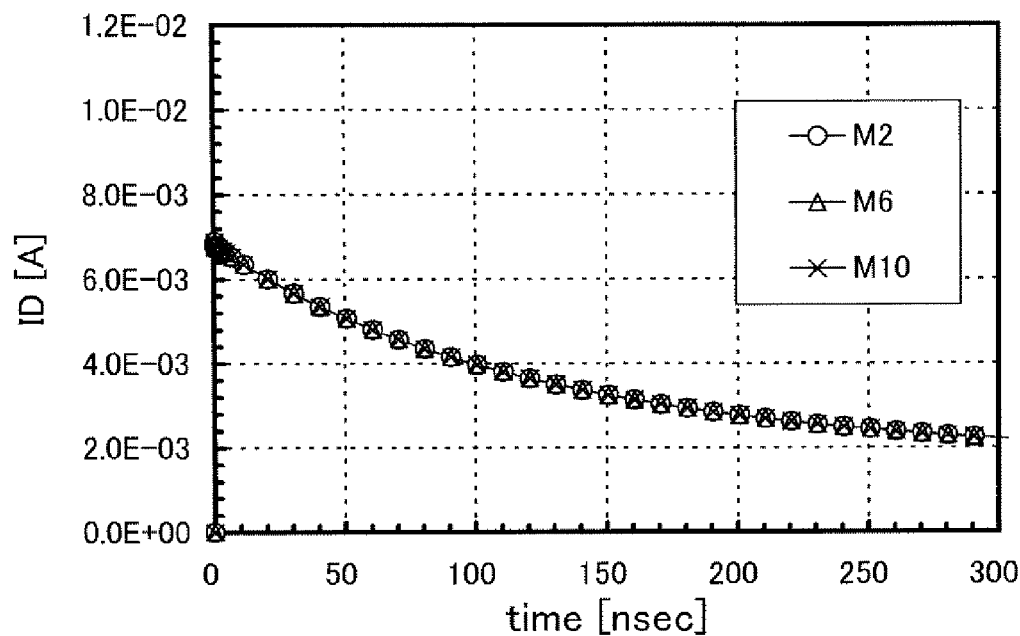
FIGS. 32A and 32B are graphs each showing the source-drain current of a transistor included in an amplifier circuit after the overvoltage application, calculated by the circuit simulation.
Figure 32B:
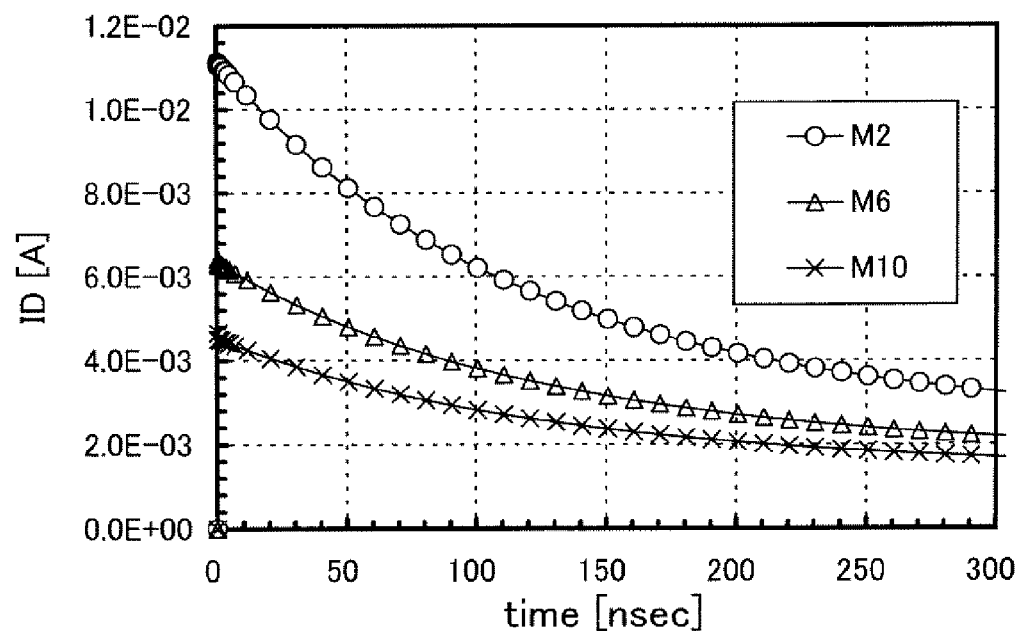

A circuit simulation result of the device 900A was shown in FIG. 32A and a circuit simulation result of the device 900x was shown in FIG. 32B. FIG. 32A and FIG. 32B are graphs each showing changes of the currents ID of three transistors (M2, M6, M10) in accordance with time passing from the application of the voltage $V_{ESD}$. The time of 0 nanosecond is the time when the voltage $V_{ESD}$ of 1 kV was applied to the power source terminal 901.

As shown in FIG. 32A, in the device 900A, the source-drain currents ID of the three transistors (M2, M6, M10) are almost equal to each other. Further, although not shown in FIG. 32A, the graphs of the currents ID of the other transistors (M3 to M5, M7 to M9) are almost the same as these graphs of the transistors (M2, M6, M10). That is, the result of the circuit simulation of the device 900A indicates that the currents ID which flows between source and drain of the transistors (M2 to M10) just after $V_{ESD}$ is applied to the power source terminal 901 are almost equal to each other. In other words, this result of the circuit simulation indicates that in the case where a plurality of current paths exist between one power source terminal and one circuit, current flow into only one semiconductor element in a concentrated manner can be prevented by setting the wiring resistances of the plurality of current paths to be equal to each other, when an overvoltage is applied to the power source terminal.

On the other hand, in the device 900x of the comparative example, as shown in FIG. 32B, the currents ID of the three transistors (M2, M6, M10) after the application of the voltage $V_{ESD}$ are different from each other. In the device 900x, the resistances satisfy R2d<R6d<R10d and R2s<R6s<R10s, and in accordance with these inequality expressions, the currents ID satisfy the transistor M2>the transistor M6>the transistor M10. Further, the currents ID of the other transistors (M3 to M5, M7 to M9) became smaller as the wiring resistances became higher, like the transistor (M2, M6, M10), though not shown in FIG. 32B. That is, the circuit simulation result indicates that in the case where a plurality of current paths exist between one power source terminal and one circuit and the wiring resistances of the plurality of current paths are different from each other, stress by an overvoltage is concentrated on a current path with a low wiring resistance, so that a semiconductor element which is connected to the current path with a low wiring resistance tends to be broken.

Further, using the circuit simulator, in addition to the currents ID, the gate-source voltages (hereinafter the gate-source voltage is referred to as a "voltage VGS") and the drain-source voltages (hereinafter the drain-source voltage is referred to as a "voltage VDS") of the transistors (M2 to M10) just after the voltage $V_{ESD}$ is applied to the power source terminal 901 were also calculated. In the device 900A, the voltages VGS and the voltages VDS of the transistors (M2 to M10) were almost equal to each other. On the other hand, in the device 900x, the voltages VGS and the voltages VDS were different between the transistors (M2 to M10), and like the currents ID, among these values, the voltage VGS and the voltage VDS of the transistor M2 were the highest and the voltage VGS and the voltage VDS of the transistor M10 were the lowest.

As described above, according to the circuit simulation of the overvoltage test of the device 900A and the device 900x, it was shown that in the case where a plurality of current paths exist between one power source terminal and one circuit it is effective to set the wiring resistances of the current paths to be equal to each other in order to prevent breakdown due to overvoltage.

Furthermore, photo detectors corresponding to the devices 900A and 900x were manufactured and overvoltage test was performed on the photo detectors. In this example, the former photo detector is called a "device 910A" and the latter photo detector is called a "device 910x".

Figure 33:
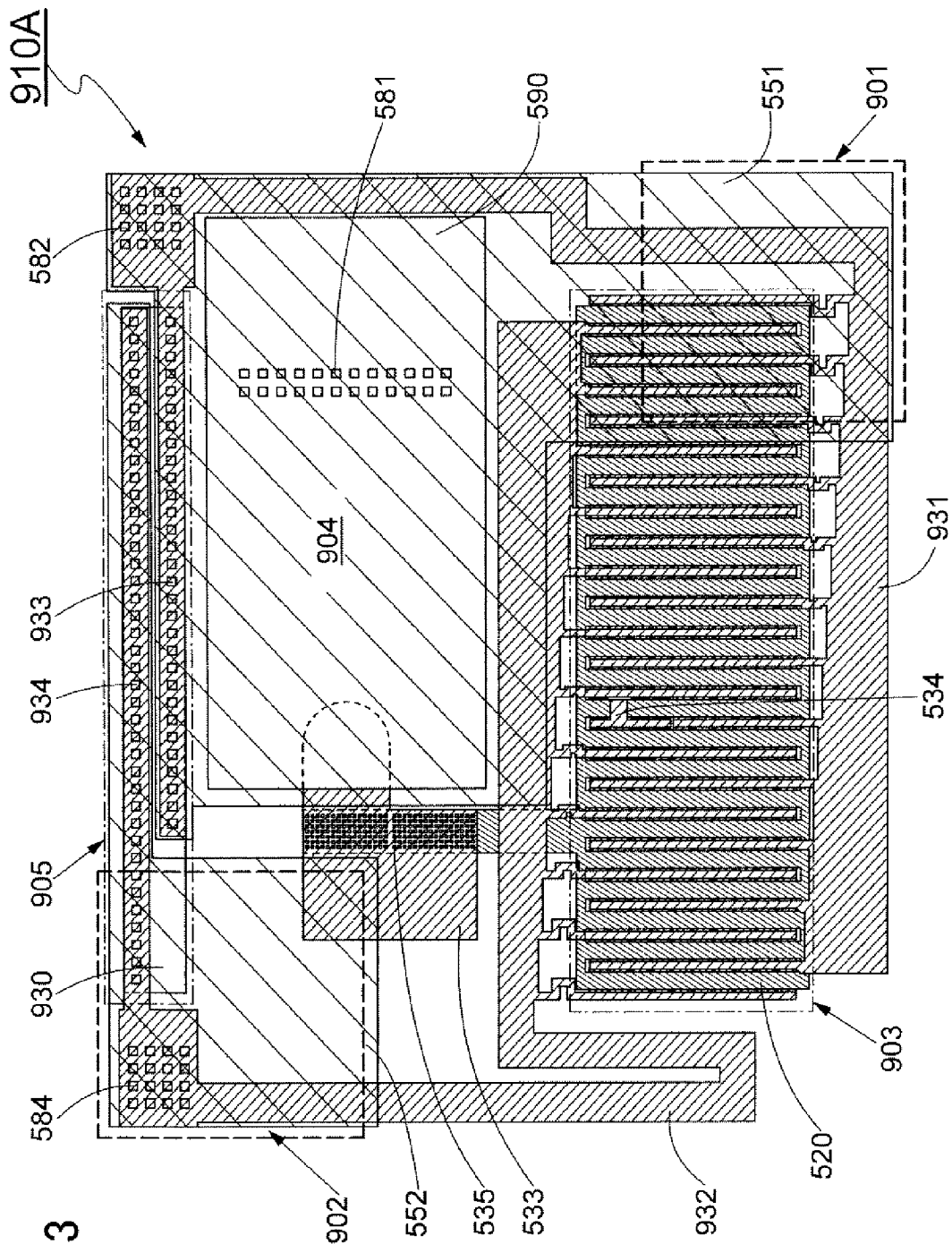
FIG. 33 is a plan view illustrating the structure of a photo detector according to one mode of the present invention, on which test with an overvoltage tester is performed. (Example 1)
Figure 34:
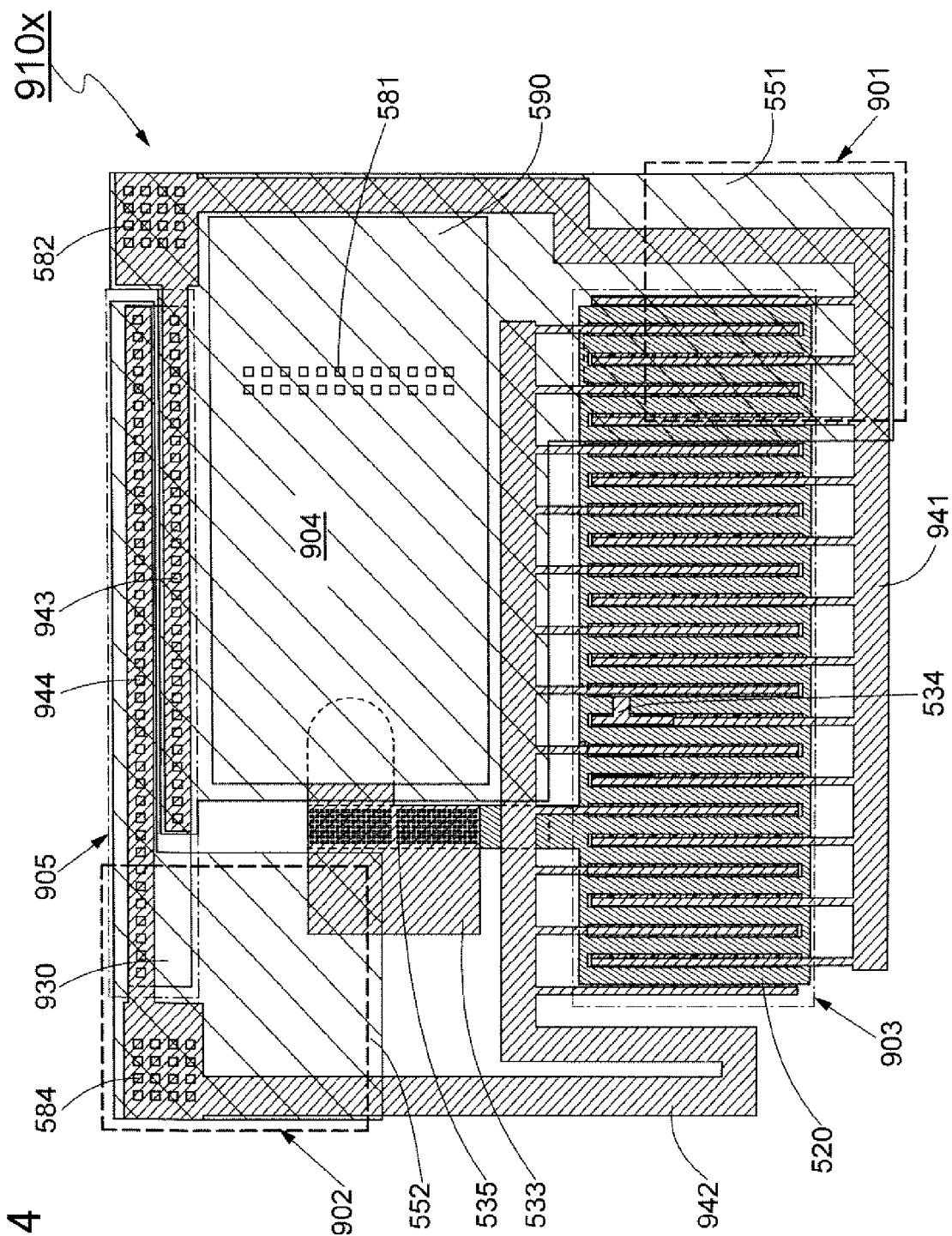
FIG. 34 is a plan view illustrating the structure of a photo detector according to a comparison example, on which test with an overvoltage tester is performed. (Example 1)

The devices 910A and 910x each have similar structures to the plan structure and stack-layer structure (see FIGS. 12 and 13) of the photo detector 400, and were manufactured by the manufacturing method in Embodiment 4. FIG. 33 is a plan view of the device 910A and FIG. 34 is a plan view of the device 910x. For easy understanding of the structure of the devices 910A and 910x, some of the constituent elements shown in FIGS. 33 and 34 are denoted by the same reference numerals as reference numerals in FIG. 12.

As shown in FIG. 33, the device 910A is different from the photo detector 400 in that a diode having a similar structure to the structure of the diode 301 in FIG. 5 is applied as a diode 905. Conductive films 931 and 932 which are second layers in the device 910A correspond to the conductive films 531 and 532 which are second layers in the photo detector (see FIG. 23). Like the conductive film 531, the conductive film 931 is formed such that the wiring resistances of a plurality of current paths between a power source terminal 901 and an amplifier circuit 903 are set to be equal to each other. Like the conductive film 532, the conductive film 932 is formed such that the wiring resistances of a plurality of current paths between a power source terminal 902 and the amplifier circuit 903 are set to be equal to each other.

In FIG. 33, a semiconductor film 930 is a semiconductor film included in the diode 905, openings 933 are formed in an insulating film between the conductive film 931 which is the second layer and a conductive film 551 which is a third layer so as to electrically connect them, and openings 934 are formed in an insulating film between the conductive film 932 which is the second layer and a conductive film 552 which is a third layer so as to electrically connect them.

Next, the structure of the device 910x will be described. The device 910x is a semiconductor device which is a comparative example. As shown in FIG. 34, the device 910x is different form the device 910A in the structures of conductive films 941 and 942 which are second layers. In the device 910x, the conductive film 941 is formed such that the wiring resistances of a plurality of current paths between a power source terminal 901 and an amplifier circuit 903 are set to be different from each other, and the conductive film 942 is formed such that the wiring resistances of a plurality of current paths between a power source terminal 902 and the amplifier circuit 903 are set to be different from each other. Openings 943 are formed in an insulating film between the conductive film 941 which is the second layer and a conductive film 551 which is a third layer so as to electrically connect them, and openings 944 are formed in an insulating film between the conductive film 942 which is the second layer and a conductive film 552 which is a third layer so as to electrically connect them. In the overvoltage test of the devices 910A and 910x, semiconductor ESD test equipment (ESS-606A) produced by Noise laboratory Co., Ltd was used. As the mode of the overvoltage test, Human Body Model was employed. Both in the devices 910A and 910x, a fourth conductive film is not formed in each of the power source terminals 901 and 902. Therefore, the voltage $V_{ESD}$ was applied between the conductive films 551 and 552 by the above-described test equipment. The overvoltage test in this example was performed as follows: first, a voltage $V_{ESD}$ of +0.5 kV was applied between the conductive films 551 and 552 once, and then, a voltage $V_{ED}$ of −0.5 kV was applied thereon once; then, whether the photo detector was broken or not was judged; in the case where the photo detector was not broken, the levels of voltages $V_{ESD}$ to be applied were increased by 0.5 kV, and the positive and negative voltages $V_{ESD}$ were applied to the photo detector again by the test equipment; and the steps so far were repeated until the photo detector was broken.

In this overvoltage test, the positive voltage $V_{ESD}$ was an unbiased voltage with respect to the diode 905 included in a protection circuit, and the negative voltage $V_{ESD}$ was an inversely-biased voltage with respect to the same.

Whether the photo detector was breakdown or not was judged based on whether the photo detector kept the prior-to-test performance or not. Specifically, when the output current value of the photo detector after the voltages $V_{ESD}$ were applied was changed by ±20% or more compared to the prior-to-test initial value, the photo detector was judged that it was broken. The output current of the photo detector was measured under fluorescent light.

Figure 35:
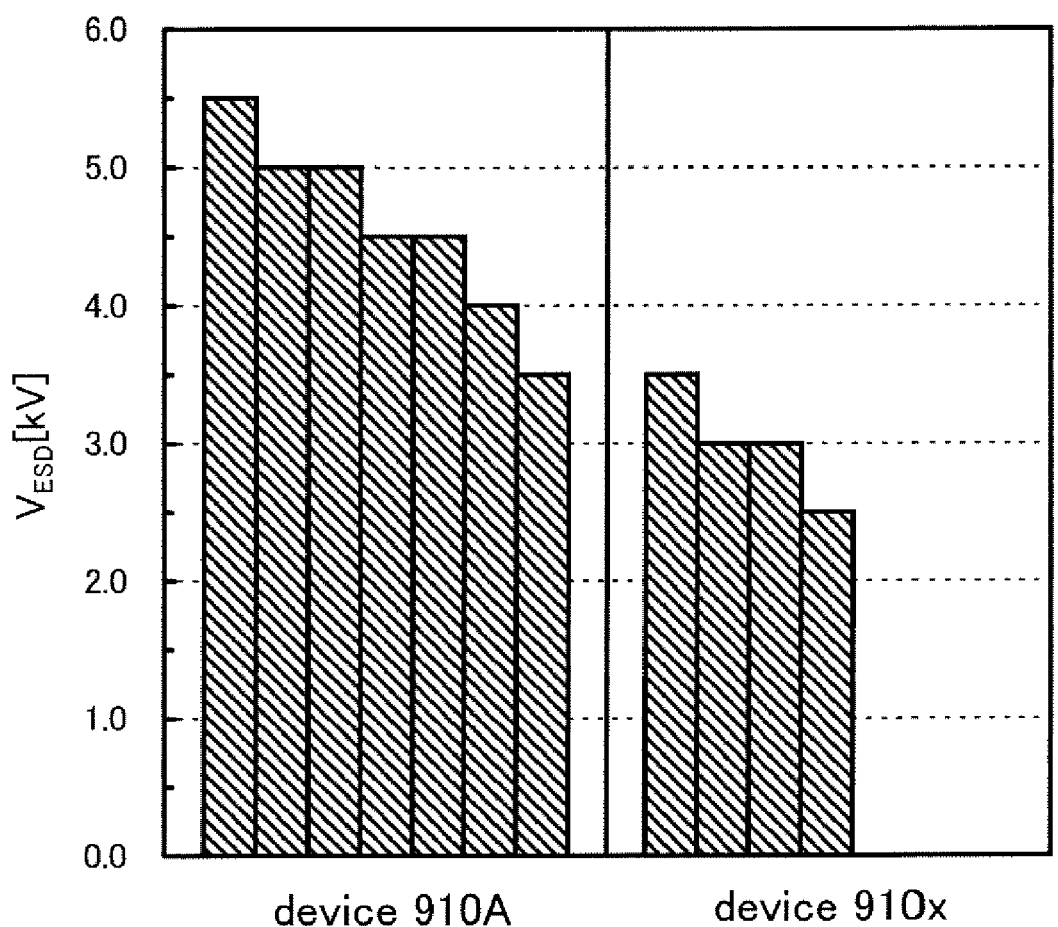
FIG. 35 is a graph showing results of overvoltage application on a photo detector according to one mode of the present invention and a photo detector according to the comparison example. (Example 1)

In FIG. 35, overvoltage test results of seven devices 910A and four devices 910x are shown. Longitudinal axis in FIG. 35 indicates the maximum of the voltage $V_{ESD}$ by which the photo detector was not broken. For example, the first bar graph of the device 910A shows that the device 910A was not broken by the tests in which the revels of the voltages $V_{ESD}$ are 5.5 kV or less (that is, the voltages $V_{ESD}$ are in the range of −5.5 kV to +5.5 kV), and was broken by the test in which voltages $V_{ESD}$ of +6.0 kV and −6.0 kV are applied.

FIG. 35 indicates that in a semiconductor device in which a plurality of current paths exist between one power source terminal and one circuit, the wiring resistances of the plurality of current paths which are set to be equal to each other can improve the resistance ESD of the semiconductor device. That is, according to the overvoltage test of the devices 910A and 910x, it was confirmed that it was effective to set the wiring resistances of the plurality of current paths existing between one power source terminal and one circuit to be equal to each other in order to prevent breakdown due to an overvoltage of the semiconductor device. Note that, although the device 910A which was subjected to this test was designed such that the wiring resistances of the plurality of current paths between the power source terminal 901 and the amplifier circuit 903 are equal to each other and the wiring resistances of the plurality of current paths between the power source terminal 902 and the amplifier circuit 903 are equal to each other, actual these wiring resistances were not identical to each other but had deviation from the designed value, which was generated in the manufacturing process.

This application is based on Japanese Patent Application serial no. 2008158256 filed with Japan Patent Office on Jun. 17, 2008, the entire contents of which are hereby incorporated by reference.

What is claimed is:

1. A semiconductor device comprising:
 a terminal;
 a circuit including a plurality of semiconductor elements;
 connection portions at which first stages of the plurality of semiconductor elements of the circuit are electrically connected to the terminal; and
 a connection wiring electrically connected between each of the connection portions and the terminal, each connection portion being connected to the connection wiring through one of parallel wirings, each parallel wiring being in contact with a different connection region of the connection wiring,
 wherein a width of the connection wiring increases with distance from the terminal, and
 wherein lengths of the parallel wirings decrease with increased distances between corresponding connection regions and the terminal.

2. The semiconductor device according to claim 1, further comprising a protection circuit electrically connected to the terminal.

3. The semiconductor device according to claim 1, wherein a size of the semiconductor device is equal to or less than 10 mm☐10 mm in a planar arrangement.

4. The semiconductor device according to claim 1, wherein resistances between the terminal and each of the connection portions are within a range of ±20% of a medium value of the resistances.

5. A semiconductor device comprising:
 a first terminal and a second terminal;
 a circuit including a plurality of semiconductor elements;
 a protection circuit electrically connected between the first terminal and the second terminal;
 first connection portions at which first stages of the plurality of semiconductor elements of the circuit with respect to the first terminal are electrically connected to the first terminal;
 second connection portions at which first stages of the plurality of semiconductor elements of the circuit with respect to the second terminal are electrically connected to the second terminal;
 a first connection wiring electrically connected between the first connection portions and the first terminal; and
 a second connection wiring electrically connected between the second connection portions and the second terminal,
 wherein first resistances between the first terminal and each of the first connection portions are the same, and
 wherein second resistances between the second terminal and each of the second connection portions are the same.

6. The semiconductor device according to claim 5,
 wherein the protection circuit includes a diode interposed between the first terminal and the second terminal, and
 wherein the diode is formed over an insulating film and includes a semiconductor film in which an n-type impurity region and a p-type impurity region which are adjacent to each other in a parallel direction over the insulating film are formed.

7. The semiconductor device according to claim 5, wherein the circuit comprises:
a photodiode which is interposed between the first terminal and the second terminal; and
an amplifier circuit including the first connection portions and the second connection portions, to amplify an output current of the photodiode.

8. The semiconductor device according to claim 5,
wherein the protection circuit comprises a diode which is interposed between the first terminal and the second terminal,
wherein the diode is formed over an insulating film and includes a semiconductor film in which an n-type impurity region and a p-type impurity region which are adjacent to each other in a parallel direction over the insulating film are formed,
wherein the circuit comprises:
a photodiode which is interposed between the first terminal and the second terminal; and
an amplifier circuit including the first connection portions, the second connection portions, and transistors, to amplify an output current of the photodiode, and
wherein the transistors are each formed over the insulating film and each include a semiconductor film in which a channel formation region, a source region, and a drain region are formed.

9. The semiconductor device according to claim 5,
wherein the first resistances between the first terminal and each of the first connection portions are within a range of ±20% of a medium value of the first resistances, and
wherein the second resistances between the second terminal and each of the second connection portions are within a range of ±20% of a medium value of the second resistances.

10. A semiconductor device comprising:
a terminal;
a circuit which is electrically connected to the terminal;
a plurality of semiconductor elements disposed at a first stage with respect to the terminal in the circuit, the semiconductor elements each comprising a semiconductor region;
a connection wiring which electrically connects the terminal to each of the semiconductor elements; and
a conductive film which is included in the connection wiring is formed such that resistances between the terminal and a source region or a drain region of each of the semiconductor elements are the same,
wherein the conductive film comprises a connection wiring portion and parallel wiring portions,
wherein the semiconductor region of each of the semiconductor elements is connected to the connection wiring portion through one of the parallel wiring portions, each parallel wiring portion being in contact with a different connection region of the connection wiring portion,
wherein a width of the connection wiring increases with distance from the terminal, and
wherein lengths of the parallel wiring portions decrease with increased distances between corresponding connection regions and the terminal.

11. The semiconductor device according to claim 10, wherein the resistances between the terminal and each of the source region or the drain region of the semiconductor elements are within a range of ±20% of a medium value of the resistances.

12. A semiconductor device comprising:
a first terminal and a second terminal;
a circuit which includes a plurality of semiconductor elements, the circuit being electrically connected to the first terminal and the second terminal;
a first connection wiring which electrically connects the circuit to the first terminal;
a second connection wiring which electrically connects the circuit to the second terminal;
first connection portions at which semiconductor elements of first stages of the circuit with respect to the first terminal are electrically connected to the first connection wiring;
second connection portions at which semiconductor elements of first stages of the circuit with respect to the second terminal are electrically connected to the second connection wiring;
a first conductive film included in the first connection wiring and provided in contact with the first connection portions such that first resistances between the first terminal and each of the first connection portions are the same; and
a second conductive film included in the second connection wiring and provided in contact with the second connection portions such that second resistances between the second terminal and each of the second connection portions are the same.

13. The semiconductor device according to claim 12, further comprising a diode which includes a semiconductor film which is in contact with the first conductive film and the second conductive film,
wherein the diode is configured to protect the circuit against an overvoltage by short-circuiting the first terminal and the second terminal.

14. The semiconductor device according to claim 12, wherein a size of the semiconductor device is equal to or less than 10 mm☐10 mm in a planar arrangement.

15. The semiconductor device according to claim 12,
wherein the first resistances between the first terminal and each of the first connection portions are within a range of ±20% of a medium value of the first resistances, and
wherein the second resistances between the second terminal and each of the second connection portions are within a range of ±20% of a medium value of the second resistances.

16. An electronic device comprising a photo detector comprising the semiconductor device according to claim 1.

17. An electronic device comprising a photo detector comprising the semiconductor device according to claim 5.

18. An electronic device comprising a photo detector comprising the semiconductor device according to claim 10.

19. An electronic device comprising a photo detector comprising the semiconductor device according to claim 12.

20. The semiconductor device according to claim 5,
further comprising parallel wirings each electrically connected to one of the first connection portions and to a different one of connection regions of the first connection wiring,
wherein a first width of the first connection wiring increases with distance from the first terminal, wherein lengths of the first parallel wirings decrease with increased distances between corresponding first connection regions and the first terminal.

21. The semiconductor device according to claim 12, further comprising parallel wirings each electrically connected to one of the first connection portions and to a different one of connection regions of the first connection wiring, wherein a first width of the first connection wiring increases with distance from the first terminal, wherein lengths of the first parallel wirings decrease with increased distances between corresponding first connection regions and the first terminal.

\* \* \* \* \*

UNITED STATES PATENT AND TRADEMARK OFFICE
CERTIFICATE OF CORRECTION

PATENT NO. : 8,363,365 B2  
APPLICATION NO. : 12/478123  
DATED : January 29, 2013  
INVENTOR(S) : Osamu Fukuoka et al.

It is certified that error appears in the above-identified patent and that said Letters Patent is hereby corrected as shown below:

In the Specification:

Column 3, line 21, "FIG. 1" should read "FIG. 11"

Column 3, line 29, "diodes" should read "diode,"

Column 6, line 1, "terminal 1011" should read "terminal 101"

Column 18, line 24, "TO ppm" should read "10 ppm"

Column 20, line 21, "Znse" should read "ZnSe"

Column 37, line 26, "voltage $V_{ED}$" should read "voltage $V_{ESD}$"

Signed and Sealed this  
Ninth Day of July, 2013

Teresa Stanek Rea  
*Acting Director of the United States Patent and Trademark Office*